(12) United States Patent
Yamamoto

(10) Patent No.: US 10,896,656 B2
(45) Date of Patent: Jan. 19, 2021

(54) ACTIVE MATRIX SUBSTRATE AND DISPLAY DEVICE INCLUDING DEMULTIPLEXER CIRCUIT WITH REDUCED DRIVE POWER

(71) Applicant: Sharp Kabushiki Kaisha, Sakai (JP)

(72) Inventor: Kaoru Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/365,801

(22) Filed: Mar. 27, 2019

(65) Prior Publication Data

US 2019/0304396 A1 Oct. 3, 2019

(30) Foreign Application Priority Data

Mar. 28, 2018 (JP) .................................. 2018-061373

(51) Int. Cl.
*G09G 3/36* (2006.01)
*H01L 27/12* (2006.01)

(52) U.S. Cl.
CPC ......... *G09G 3/3696* (2013.01); *H01L 27/124* (2013.01); *H01L 27/1225* (2013.01); *G09G 2300/0426* (2013.01); *G09G 2310/0297* (2013.01); *G09G 2310/08* (2013.01)

(58) Field of Classification Search
CPC .................................................. G09G 3/3696
See application file for complete search history.

(56) References Cited

U.S. PATENT DOCUMENTS

| 2005/0219192 A1* | 10/2005 | Fujikawa ............. G09G 3/3688 345/98 |
| 2006/0071884 A1* | 4/2006 | Kim .................... G09G 3/3233 345/76 |
| 2007/0091050 A1 | 4/2007 | Katayama et al. |
| 2011/0080173 A1* | 4/2011 | Kim ....................... G09G 3/006 324/403 |
| 2011/0254816 A1 | 10/2011 | Umezaki |

(Continued)

FOREIGN PATENT DOCUMENTS

| JP | 2007-114496 A | 5/2007 |
| JP | 2008-096915 A | 4/2008 |

(Continued)

*Primary Examiner* — William Boddie
*Assistant Examiner* — Andrew B Schnirel
(74) *Attorney, Agent, or Firm* — Keating & Bennett, LLP

(57) ABSTRACT

An active matrix substrate includes a demultiplexer circuit arranged in a peripheral region. Each unit circuit in the demultiplexer circuit includes n switching TFTs. The demultiplexer circuit includes a boost circuit capable of boosting a voltage applied to a gate electrode of the switching TFT. The boost circuit includes a set unit configured to perform a set action, a boost unit configured to perform a boost action, and a reset unit configured to perform a reset action. The set unit includes a setting TFT including a drain electrode connected to the drive signal line and a source electrode connected to a node connected to the gate electrode of the switching TFT. When the set unit performs the set action, a first signal voltage is supplied from the drive signal line to the drain electrode of the setting TFT, and a second signal voltage higher than the first signal voltage is supplied to the gate electrode of the setting TFT.

22 Claims, 39 Drawing Sheets

(56) References Cited

U.S. PATENT DOCUMENTS

| | | | |
|---|---|---|---|
| 2012/0138922 A1 | 6/2012 | Yamazaki et al. | |
| 2013/0038518 A1 | 2/2013 | Tagawa et al. | |
| 2013/0257698 A1* | 10/2013 | Toya | H01L 27/3248 345/77 |
| 2013/0320334 A1 | 12/2013 | Yamazaki et al. | |
| 2014/0286076 A1 | 9/2014 | Aoki et al. | |
| 2016/0042692 A1* | 2/2016 | Ota | G09G 3/3233 345/215 |
| 2016/0293093 A1* | 10/2016 | Seo | G09G 3/20 |
| 2016/0329025 A1 | 11/2016 | Park et al. | |
| 2016/0372068 A1 | 12/2016 | Yamamoto et al. | |
| 2018/0068615 A1 | 3/2018 | Imai | |
| 2019/0305071 A1* | 10/2019 | Yamamoto | G09G 3/3696 |

FOREIGN PATENT DOCUMENTS

| | | |
|---|---|---|
| JP | 2010-102266 A | 5/2010 |
| JP | 2011-237787 A | 11/2011 |
| JP | 2012-134475 A | 7/2012 |
| JP | 2014-007399 A | 1/2014 |
| JP | 2014-209727 A | 11/2014 |
| WO | 2011/118079 A1 | 9/2011 |
| WO | 2014/208123 A1 | 12/2014 |
| WO | 2016/163299 A1 | 10/2016 |

\* cited by examiner

COMPARATIVE EXAMPLE 3

FIRST EMBODIMENT

ACTIVE MATRIX SUBSTRATE AND DISPLAY DEVICE INCLUDING DEMULTIPLEXER CIRCUIT WITH REDUCED DRIVE POWER

CROSS-REFERENCE TO RELATED APPLICATIONS

This application claims the benefit of priority to Japanese Patent Application Number 2018-061373 filed on Mar. 28, 2018. The entire contents of the above-identified applications are hereby incorporated by reference.

BACKGROUND

Technical Field

The disclosure relates to an active matrix substrate, and, in particular, relates to an active matrix substrate with a demultiplexer circuit. The disclosure also relates to a display device including such an active matrix substrate.

An active matrix substrate used for a liquid crystal display device or the like includes a display region including a plurality of pixels and a region (non-display region or frame region) other than the display region. In the display region, a switching element such as a Thin Film Transistor (hereinafter, referred to as a TFT) or the like is provided for each pixel. As examples of such a switching element, a TFT with an amorphous silicon film as an active layer (hereinafter, referred to as an amorphous silicon TFT") and a TFT with a polycrystalline silicon film as an active layer (hereinafter referred to as a "polycrystalline silicon TFT") are widely used in the related art.

The use of an oxide semiconductor as a material of the active layer of the TFT, instead of amorphous silicon or polycrystalline silicon has been proposed. Such TFTs are called "oxide semiconductor TFT". The oxide semiconductor has a mobility higher than a mobility of amorphous silicon. Therefore, the oxide semiconductor TFT can operate at a higher speed than the amorphous silicon TFT.

In the non-display region of the active matrix substrate, a peripheral circuit such as a drive circuit may be formed monolithically (integrally). Forming the drive circuit monolithically achieves narrowing of the non-display region (frame narrowing) and cost reduction by simplifying a mounting process. For example, in the non-display region, a gate driver circuit is monolithically formed, and a source driver circuit may be mounted by a Chip on Glass (COG) method.

Monolithically forming a demultiplexer (DEMUX) circuit such as a Source Shared Driving (SSD) circuit in addition to a gate driver (e.g., WO No. 2011/118079 and JP 2010-102266 A) in a device with a strong demand for frame narrowing such as a smartphone has been proposed. The SSD circuit is a circuit to distribute a video signal from one video signal line connected to each terminal of a source driver to a plurality of source wiring lines. By mounting the SSD circuit, a region (terminal section/wiring line formation region) where a terminal section and a wiring line in the non-display region are arranged can be further narrowed. In addition, the number of the outputs from the source driver is decreased and a circuit scale can be reduced, which can reduce the cost of a driver IC.

Peripheral circuits such as a drive circuit and an SSD circuit include the TFTs. Herein, a TFT arranged as a switching element in each pixel in the display region is called a "pixel TFT", and a TFT constituting a peripheral circuit called a "circuit TFT". A TFT used as a switching element in a DEMUX circuit (SSD circuit) among the circuit TFTs is called a "DEMUX circuit TFT".

SUMMARY

In an active matrix substrate using an oxide semiconductor TFT as a pixel TFT, it is preferable that a DEMUX circuit TFT is also an oxide semiconductor TFT using the same oxide semiconductor film as that in a pixel TFT from the viewpoint of a manufacturing process.

However, it is difficult to form a DEMUX circuit by using an oxide semiconductor TFT, and a polycrystalline silicon TFT has been used as a DEMUX circuit TFT in the related art. The reason for this is as below.

An oxide semiconductor has mobility about one order less than polycrystalline silicon, and therefore, an oxide semiconductor TFT has a current driving force smaller than a polycrystalline silicon TFT. For this reason, in a case where a DEMUX circuit TFT is formed using an oxide semiconductor, a size of the TFT is required to be larger (a channel width is required to be larger) or a drive voltage is required to be higher compared with the case of using polycrystalline silicon. If the size of the TFT is increased, a gate capacity load is increased and the drive power for the DEMUX circuit is increased. On the other hand, even if the drive voltage for the TFT is increased, the drive power for the DEMUX circuit is increased.

Even in the case where a polycrystalline silicon TFT is used as a DEMUX circuit TFT, similar problems may occur in a case where only a PMOS process is adopted (in other words, a case that the polycrystalline silicon TFT includes only a PMOS transistor).

The disclosure has been made in view of the above-described problems and has an object to reduce a drive power for an active matrix substrate provided with a demultiplexer circuit.

An active matrix substrate according to an embodiment of the disclosure is an active matrix substrate including a display region including a plurality of pixel regions and a peripheral region located around the display region, the active matrix substrate including: a substrate; a plurality of gate bus lines and a plurality of source bus lines provided on the substrate; a source driver arranged in the peripheral region and including a plurality of output terminals; a plurality of signal output lines connected respectively to the plurality of output terminals of the source driver; and a demultiplexer circuit including a plurality of unit circuits supported by the substrate, the demultiplexer circuit being arranged in the peripheral region, wherein each of the plurality of unit circuits in the demultiplexer circuit distributes a display signal from one signal output line of the plurality of signal output lines to n source bus lines (n is an integer equal to or more than 2) of the plurality of source bus lines, each of the plurality of unit circuits includes n branch wiring lines connected to the one signal output line, and n switching TFTs connected to the n branch wiring lines, respectively, the n switching TFTs individually performing on/off control of electrical connections between the n branch wiring lines and the n source bus lines, the demultiplexer circuit further including a plurality of boost circuits capable of boosting voltages applied to gate electrodes of the n switching TFTs, each of the plurality of boost circuit includes a set unit configured to perform a set action to precharge a node connected to the gate electrode, a boost unit configured to perform a boost action to boost a potential of the node precharged by the set unit, and a reset unit configured to perform a reset action to reset the potential of the node, the demultiplexer circuit includes a drive signal line connected to the set unit, the set unit includes a setting TFT including a gate electrode, a source electrode, and a drain electrode, the drain electrode being connected to the drive signal line and the source electrode being connected to the node, and when the set unit performs the set action, the drain electrode of the setting TFT is configured to be supplied with a first signal voltage V1 from the drive signal line, and the gate electrode of the setting TFT is configured to be supplied with a second signal voltage V2 higher than the first signal voltage V1.

In an embodiment, assuming that a threshold voltage for the setting TFT is Vth, the first signal voltage V1 and the second signal voltage V2 satisfy a relationship V2−Vth>V1.

In an embodiment, the set unit is a set/reset unit configured to further function as the reset unit to perform the set action and the reset action at timings different from each other, and the setting TFT is a setting/resetting TFT used not only in performing the set operation but also in performing the reset action.

In an embodiment, the set/reset unit includes only the setting/resetting TFT as a TFT, the demultiplexer circuit includes a further drive signal line connected to the boost unit, and the boost unit includes a boost capacitance element including a first capacitance electrode connected to the further drive signal line and a second capacitance electrode connected to the node.

In an embodiment, the n switching TFTs included in each of the plurality of unit circuits are two switching TFTs, the two switching TFTs are a first switching TFT and a second switching TFT turned to an on state at timings different from each other within one horizontal scan period, and the plurality of boost circuits include a first boost circuit connected the first switching TFT and a second boost circuit connected to the second switching TFT.

In an embodiment, the node boosted by the second boost circuit is connected to the gate electrode of the setting TFT in the first boost circuit, and the node boosted by the first boost circuit is connected to the gate electrode of the setting TFT in the second boost circuit.

In an embodiment, the n switching TFTs included in each of the plurality of unit circuits are two switching TFTs, the two switching TFTs are a first switching TFT and a second switching TFT turned to an on state at timings different from each other within one horizontal scan period, the plurality of boost circuits include a first boost circuit connected the first switching TFT and a second boost circuit connected to the second switching TFT, the node boosted by the second boost circuit is connected to the gate electrode of the setting/ resetting TFT in the first boost circuit, the node boosted by the first boost circuit is connected to the gate electrode of the setting/resetting TFT in the second boost circuit, each of the first boost circuit and the second boost circuit includes a further set/reset unit, the further set/reset unit includes a further setting/resetting TFT including a gate electrode, a source electrode, and a drain electrode, the drain electrode being connected to the drive signal line and the source electrode being connected to the node, the gate electrode of the further setting/resetting TFT in the first boost circuit is connected to the drive signal line for the second boost circuit, and the gate electrode of the further setting/resetting TFT in the second boost circuit is connected to the drive signal line for the first boost circuit.

In an embodiment, the first boost circuit is connected to the first switching TFT in one unit circuit of the plurality of unit circuits, and the second boost circuit is connected to the second switching TFT in the one unit circuit.

In an embodiment, the first boost circuit is connected in common to the first switching TFTs in two unit circuits of the plurality of unit circuits, and the second boost circuit is connected in common to the second switching TFTs in the two unit circuits.

In an embodiment, the first boost circuit is connected in common to the first switching TFT in each of three or more unit circuits of the plurality of unit circuits, and the second boost circuit is connected in common to the second switching TFT in each of the three or more unit circuits.

In an embodiment, the n switching TFTs included in each of the plurality of unit circuits are three switching TFTs, the three switching TFTs are a first switching TFT, a second switching TFT, and a third switching TFT turned to an on state at timings different from each other within one horizontal scan period, and the plurality of boost circuits include a first boost circuit connected the first switching TFT, a second boost circuit connected to the second switching TFT, and a third boost circuit connected to the third switching TFT.

In an embodiment, the first boost circuit is connected the first switching TFT in one unit circuit of the plurality of unit circuits, the second boost circuit is connected to the second switching TFT in the one unit circuit, and the third boost circuit is connected to the third switching TFT in the one unit circuit.

In an embodiment, the first boost circuit is connected in common to the first switching TFT in each of two unit circuits of the plurality of unit circuits, the second boost circuit is connected in common to the second switching TFT in each of the two unit circuits, and the third boost circuit is connected in common to the third switching TFT in each of the two unit circuits.

In an embodiment, the first boost circuit is connected in common to the first switching TFT in each of three or more circuits of the plurality of unit circuits, the second boost circuit is connected in common to the second switching TFT in each of the three or more unit circuits, and the third boost circuit is connected in common to the third switching TFT in each of the three or more unit circuits.

In an embodiment, the demultiplexer circuit further includes a plurality of clear circuits, each clear circuit being connected to each of the plurality of boost circuits and initializing a corresponding boost circuit at a prescribed timing.

In an embodiment, each of the set unit and the reset unit includes a plurality of TFTs connected in series with each other.

In an embodiment, the plurality of boost circuits include two or more boost circuits driven at the same timing, and the demultiplexer circuit includes a first drive signal line group and a second drive signal line group, the first drive signal line group supplying a drive signal group to drive some boost circuits of the two or more boost circuits, the second drive signal line group supplying a drive signal group to drive other some boost circuits, the second drive signal line group being different from the first drive signal line group.

In an embodiment, each of the n switching TFTs includes an oxide semiconductor layer as an active layer.

In an embodiment, the oxide semiconductor layer includes an In—Ga—Zn—O-based semiconductor.

In an embodiment, the In—Ga—Zn—O-based semiconductor includes a crystalline portion.

In an embodiment, each of the n switching TFTs is a PMOS transistor including a polycrystalline silicon semiconductor layer as an active layer.

A display device according to an embodiment of the disclosure includes the active matrix substrate having any of the configurations described above.

According to the embodiments of the disclosure, the driving power for the active matrix substrate provided with the demultiplexer circuit can be reduced.

BRIEF DESCRIPTION OF DRAWINGS

The disclosure will be described with reference to the accompanying drawings, wherein like numbers reference like elements.

DESCRIPTION OF EMBODIMENTS

Hereinafter, embodiments of the disclosure are described with reference to the drawings. The disclosure is not limited to the embodiments described below.

First Embodiment

Schematic Configuration of Active Matrix Substrate

Figure 1:
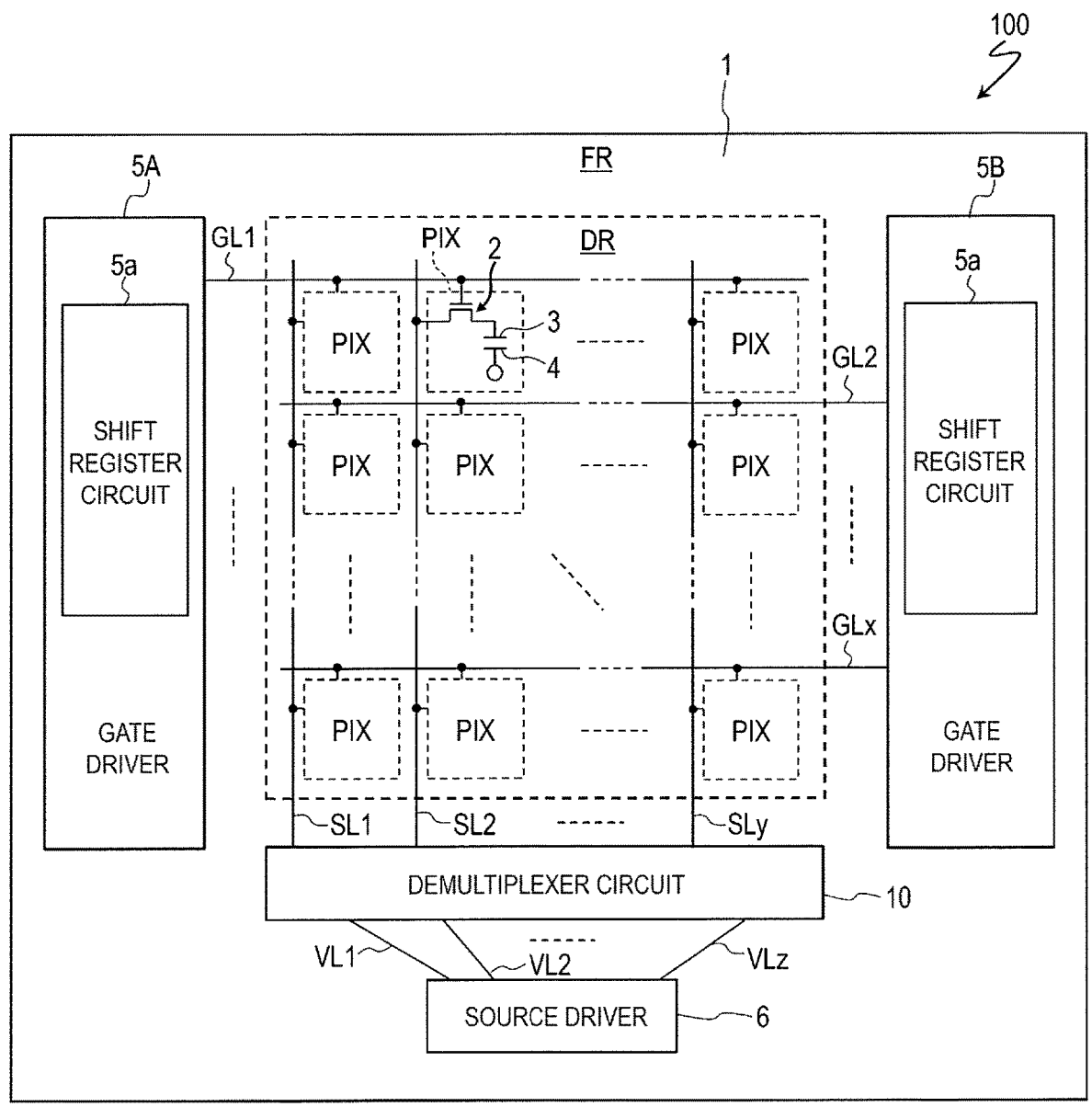
FIG. 1 is a schematic diagram illustrating an example of a planar structure of an active matrix substrate 100 according to a first embodiment.

First, with reference to FIG. 1, a description is given of a schematic configuration of an active matrix substrate 100 according to the embodiment of the disclosure. FIG. 1 is a schematic diagram illustrating an example of a planar structure of the active matrix substrate 100. The active matrix substrate 100 includes a display region DR and a peripheral region FR as illustrated in FIG. 1.

The display region DR includes a plurality of pixel regions PIX. Each pixel region PIX is a region corresponding to a pixel of the display device. Hereinafter, the pixel region PIX may be simply called as a "pixel". The plurality of pixel regions PIX are arranged in a matrix including a plurality of rows and a plurality of columns. The display region DR is defined by the plurality of pixel regions PIX arranged in a matrix.

The peripheral region FR is located around the display region DR. The peripheral region FR is a region which does not contribute to displaying, and may be called a "non-display region" or a "frame region".

Constituent elements of the active matrix substrate 100 are supported by a substrate 1. The substrate 1 is a glass substrate, for example.

A plurality of gate bus lines (scanning lines) GL and a plurality of source bus lines (signal lines) SL are provided on the substrate 1. The plurality of gate bus lines GL extend along a row direction. The plurality of source bus lines SL extend along a column direction. In FIG. 1, the gate bus lines GL in a first row, a second row, . . . , and a x-th row are described as "GL1", "GL2", . . . , and "GLx", and the source bus lines SL in a first column, a second column, . . . , and a y-th column are described as "SL1", "SL2", . . . , and "SLy".

Typically, a region surrounded by two adjacent gate bus lines GL and two adjacent source bus lines SL forms the pixel region PIX. Each pixel region PIX includes a thin film transistor 2 and a pixel electrode 3.

The thin film transistor 2 is also called a "pixel TFT". A gate electrode and a source electrode of the thin film transistor 2 are connected to a corresponding gate bus line GL and a corresponding source bus line SL, respectively. A drain electrode of the thin film transistor 2 is connected to the pixel electrode 3. In a case where the active matrix substrate 100 is used for a liquid crystal display device of a transverse electrical field mode such as a Fringe Field Switching (FFS) mode, an electrode (common electrode) 4 common to the plurality of pixel regions PIX is provided on the active matrix substrate 100. In a case where the active matrix substrate 100 is applied to a liquid crystal display device of a vertical electric field mode, the common electrode 4 is provided on a counter substrate arranged to face the active matrix substrate 100 via a liquid crystal layer.

Gate drivers (scanning line drive circuits) 5A and 5B for driving the gate bus lines GL, a source driver (signal line drive circuit) 6 for driving the source bus lines SL, and a demultiplexer (DEMUX) circuit 10 are arranged in the peripheral region FR. The DEMUX circuit 10 functions as an SSD circuit to time-divisionally drive the source bus lines SL. In the present embodiment, the gate drivers 5A and 5B, and the DEMUX circuit 10 are formed integrally (monolithically) on the substrate 1, and the source driver 6 is mounted (for example, COG-mounted) on the substrate 1.

In the illustrated example, the gate driver 5A for driving the gate bus lines GL in the odd-numbered rows are arranged on a left side of the display region DR, and the gate driver 5B for driving the gate bus lines GL in the even-numbered rows are arranged on a right side of the display region DR. The gate bus lines GL in the odd-numbered rows are respectively connected to a plurality of output terminals (not illustrated) of the gate driver 5A. The gate bus lines GL in the even-numbered rows are also respectively connected to a plurality of output terminals (not illustrated) of the gate driver 5B. Each of the gate drivers 5A and 5B include a shift register circuit 5a.

The source driver 6 is arranged on a lower side of the display region DR, and the DEMUX circuit 10 is arranged between the source driver 6 and the display region DR. The source driver 6 includes a plurality of output terminals (not illustrated). A plurality of signal output lines (video signal lines) VL are provided in a region positioned between the source driver 6 and the DEMUX circuit 10. Each of a plurality of signal output lines VL is connected to each of the plurality of output terminals of the source driver 6. In FIG. 1, first, second, . . . , and z-th signal output lines VL are described as "VL1", "VL2", . . . , and "VLz".

The DEMUX circuit 10 distributes a display signal supplied from one signal output line VL into two or more source bus lines SL. Hereinafter, the DEMUX circuit 10 in the present embodiment is described in more detail, and prior to the description, DEMUX circuits in Comparison Examples 1, 2 and 3 are described.

DEMUX Circuit in Comparison Example 1

Figure 2:
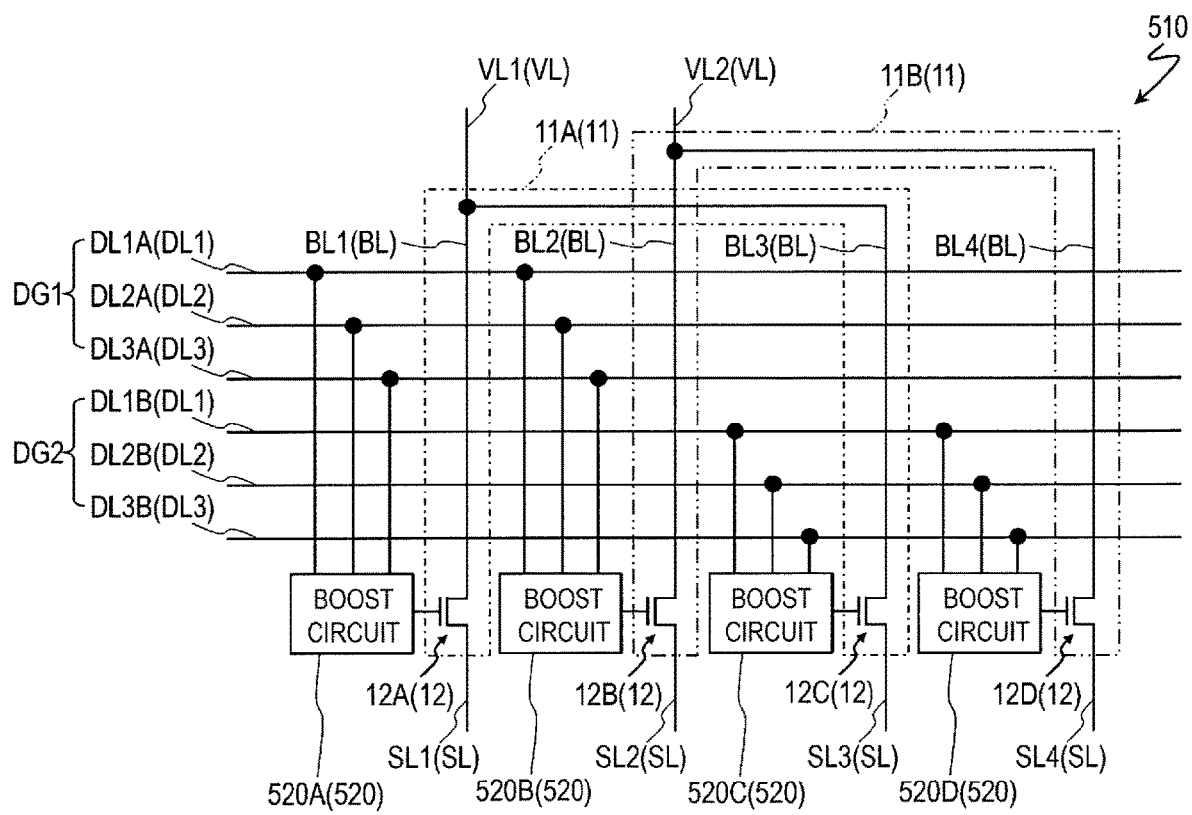
FIG. 2 is a diagram illustrating a DEMUX circuit 510 according to Comparison Example 1.

With reference to FIG. 2, a description is given of a DEMUX circuit 510 according to Comparison Example 1.

As illustrated in FIG. 2, the DEMUX circuit 510 includes a plurality of unit circuits 11. Each of a plurality of unit circuits 11 distributes a display signal from one signal output line VL into two source bus lines SL. A unit circuit 11A (hereinafter, also referred to as a first unit circuit) that is one of two unit circuits 11 illustrated in FIG. 2 distributes a display signal from a signal output line VL1 into source bus lines SL1 and SL3, and a unit circuit 11B (hereinafter, also referred to as a second unit circuit) that is the other distributes a display signal from a signal output line VL2 into source bus lines SL2 and SL4.

Each unit circuit 11 includes two branch wiring lines BL and two switching TFTs 12.

The two branch wiring lines BL of each unit circuit 11 are connected to one signal output line VL. The two switching TFTs 12 in each unit circuit 11 are connected to the two branch wiring lines BL, respectively. The two switching TFTs 12 individually (independently) performs on/off control of electrical connection between two branch wiring lines BL and two source bus lines SL.

Each of the two switching TFTs 12 is an oxide semiconductor TFT. A switching TFT 12A that is one of the two switching TFTs 12A and 12C in the first unit circuit 11A performs on/off control of the electrical connection between a branch wiring line BL1 and a source bus line SL1, and a switching TFT 12C that is the other performs on/off control of the electrical connection between a branch wiring line BL3 and a source bus line SL3. A source electrode and a drain electrode of the former switching TFT 12A are connected to the branch wiring line BL1 and the source bus line SL1, respectively, and a source electrode and a drain electrode of the latter switching TFT 12C are connected to the branch wiring line BL3 and the source bus line SL3, respectively.

A switching TFT 12B that is one of the two switching TFTs 12B and 12D in the second unit circuit 11B performs on/off control of the electrical connection between a branch wiring line BL2 and a source bus line SL2, and a switching TFT 12D that is the other performs on/off control of the electrical connection between a branch wiring line BL4 and a source bus line SL4. A source electrode and a drain electrode of the former switching TFT 12B are connected to the branch wiring line BL2 and the source bus line SL2, respectively, and a source electrode and a drain electrode of the latter switching TFT 12D are connected to the branch wiring line BL4 and the source bus line SL4, respectively.

The DEMUX circuit 510 further includes a plurality of boost circuits 520 each of which can boost a voltage applied to the gate electrode of each of two switching TFTs 12 in each unit circuit 11 as illustrated in FIG. 2. In the example illustrated in FIG. 2, one boost circuit 520 is connected to each switching TFT 12. Specifically, gate electrodes of switching TFTs 12A, 12B, 12C, and 12D are connected to output sides of boost circuits 520A, 520B, 520C, and 520D, respectively.

In the example illustrated in FIG. 2, each boost circuit 520 is driven by a drive signal group supplied from a first drive signal line DL1, a second drive signal line DL2, and a third drive signal line DL3. Hereinafter, a drive signal supplied by the first drive signal lines DL1 may be referred to as a "first drive signal", a drive signal supplied by the second drive signal line DL2 may be referred to as a "second drive signal", and a drive signal supplied by the third drive signal line DL3 is may be referred to as a "third drive signal". As described later in detail, the boost circuit 520 boosts the voltage such that a drive amplitude of a gate potential of the switching TFT 12 increases corresponding to amplitudes of the first drive signal, the second drive signal, and the third drive signal.

In the example illustrated in FIG. 2, two systems of drive signal line groups DG1 and DG2 are provided. The boost circuits 520A and 520B are driven by a first drive signal line DL1A, a second drive signal line DL2A, and a third drive signal line DL3A in the drive signal line group DG1 that is one of the drive signal line groups DG1 and DG2. The boost circuits 520C and 520D are driven by a first drive signal line DL1B, a second drive signal line DL2B, and a third drive signal line DL3B in the drive signal line group DG2 that is the other of the drive signal line groups DG1 and DG2.

As described above, the DEMUX circuit 510 includes the boost circuit 520 which can boost the voltage applied to the gate electrode of the switching TFT 12, and thus an effective drive voltage of the DEMUX circuit 510 can be increased. Therefore, the DEMUX circuit 510 can be driven by a drive signal of a relatively small amplitude, and thus power consumption due to charging and discharging of the drive signal can be reduced.

Figure 3:
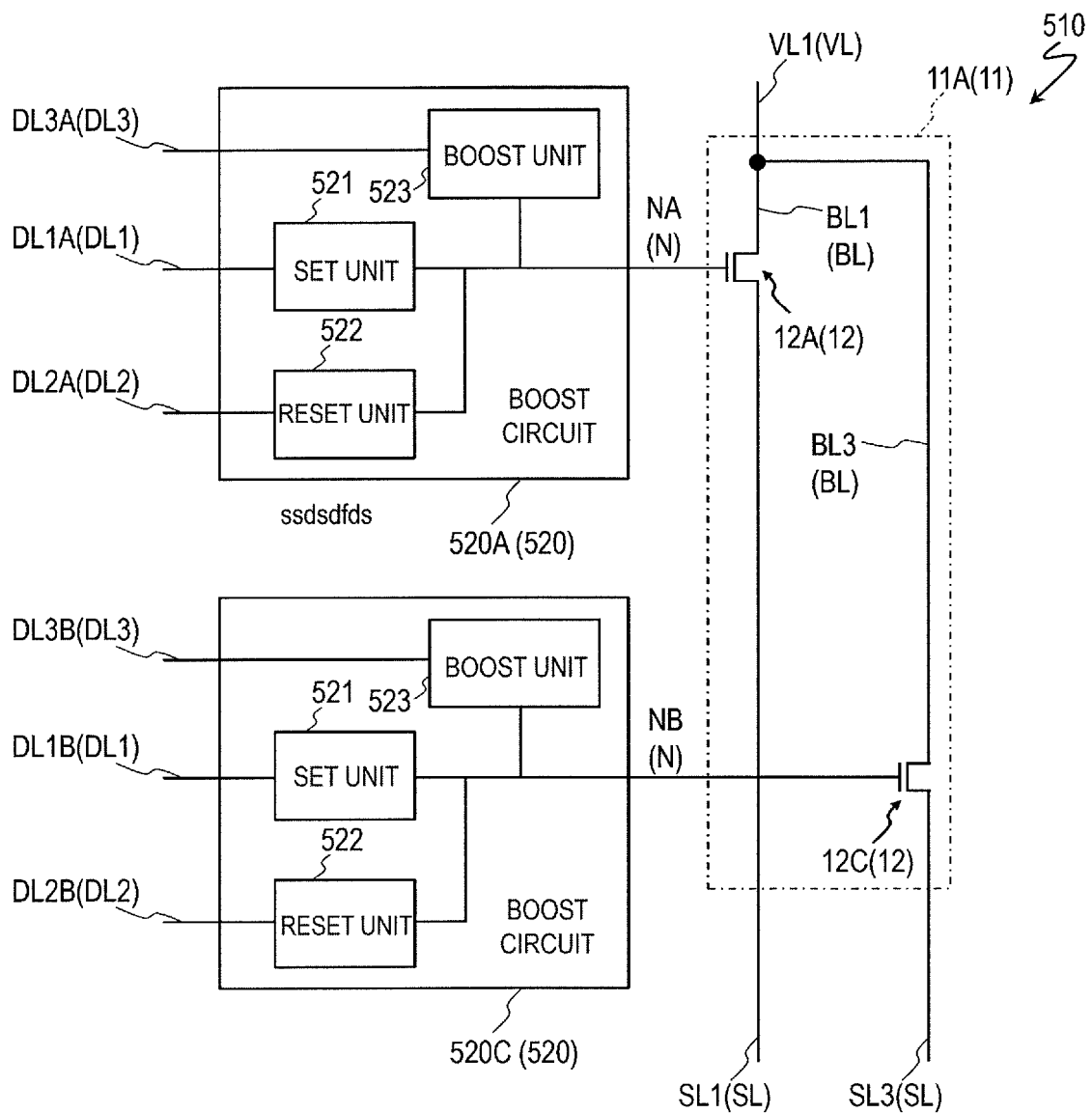
FIG. 3 is a diagram illustrating a boost circuit 520 included in the DEMUX circuit 510.

With reference to FIG. 3, a specific configuration of each boost circuit 520 is described.

As illustrated in FIG. 3, the boost circuit 520 includes a set unit 521, a reset unit 522, and a boost unit 523. The set unit 521, the reset unit 522, and the boost unit 523 are connected to a node N connected to the gate electrode of the switching TFT 12. The set unit 521 is connected to the first drive signal line DL1, the reset unit 522 is connected to the second drive signal line DL2, and the boost unit 523 is connected to the third drive signal line DL3.

The set unit 521 is supplied with the first drive signal (set signal) from the first drive signal line DL1 to precharge the node N. The boost unit 523 is supplied with the third drive signal (boost signal) from the third drive signal line DL3 to boost the potential of the node N precharged by the set unit 521. The reset unit 522 is supplied with the second drive signal (reset signal) from the second drive signal line DL2 to reset the potential of the node N.

Figure 4:
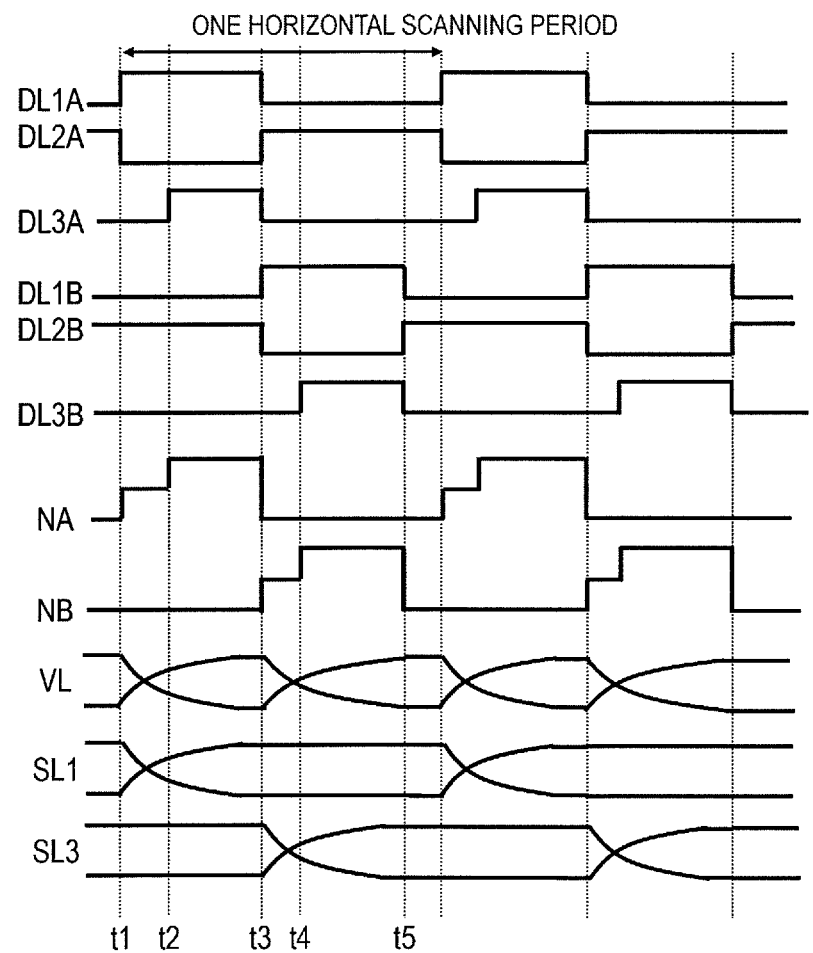
FIG. 4 is a timing chart for describing actions of the DEMUX circuit 510.

Here, actions of the boost circuit 520 (DEMUX circuit 510) are described also with reference to FIG. 4. FIG. 4 is a timing chart for describing the actions of the DEMUX circuit 510. FIG. 4 illustrates potentials of the first drive signal lines DL1A and DL1B, the second drive signal lines DL2A and DL2B, the third drive signal lines DL3A and DL3B, the nodes NA and NB, the signal output line VL, and the source bus lines SL1 and SL3.

First, at a time point t1, the potential of the first drive signal line DL1A becomes a high, the potential of the second drive signal line DL2A becomes a low level, and the first drive signal as a set signal is input to the set unit 521 in the boost circuit 520A. This allows the node NA connected to the gate electrode of the switching TFT 12A to be precharged. At this timing, the potential of the signal output line DL (i.e., the display signal) is changed to a write voltage level, and the charge of the selected source bus line SL1 is started.

Next, at a time point t2, the potential of the third drive signal line DL3A becomes the high level, and the third drive signal as a boost signal is input to the boost unit 523 in the boost circuit 520A. This allows the potential of the node NA to be boosted. The potential of the node NA being boosted allows the source bus line SL1 to be sufficiently charged through the switching TFT 12A.

Subsequently, at a time point t3, the potential of the first drive signal line DL1A becomes the low level, the potential of the second drive signal line DL2A becomes the high level, the potential of the third drive signal line DL3A becomes the low level, and the second drive signal as a reset signal is input to the reset unit 522 in the boost circuit 520A. This allows the potential of the node NA to be reset. At this time, the switching TFT 12A turns to an off state, and the potential of the source bus line SL1 is determined.

Moreover, at the time point t3, the potential of the first drive signal line DL1B becomes the high level, the potential of the second drive signal line DL2B becomes the low level, and the first drive signal as a set signal is input to the set unit 521 in the boost circuit 520C. This allows the node NB connected to the gate electrode of the switching TFT 12B to be precharged. At this timing, the potential of the signal output line VL (i.e., the display signal) is changed to the write voltage level, and the charge of the selected source bus line SL3 is started.

Next, at a time point t4, the potential of the third drive signal line DL3B becomes the high level, and the third drive signal as a boost signal is input to the boost unit 523 in the boost circuit 520C. This allows the potential of the node NB to be boosted. The potential of the node NB being boosted allows the source bus line SL3 to be sufficiently charged through the switching TFT 12B.

After that, at a time point t5, the potential of the first drive signal line DL1B becomes the low level, the potential of the second drive signal line DL2B becomes the high level, the potential of the third drive signal line DL3B becomes the low level, and the second drive signal as a reset signal is input to the reset unit 522 in the boost circuit 520C. This allows the potential of the node NB to be reset. At this time, the switching TFT 12B turns to the off state, and the potential of the source bus line SL3 is determined.

When the writing into the source bus lines SL1 and SL3 is completed (the potential is determined), the gate signal supplied from the gate bus line GL becomes the off-level, and the writing of the display voltage into the pixel PIX is completed.

Figure 5:
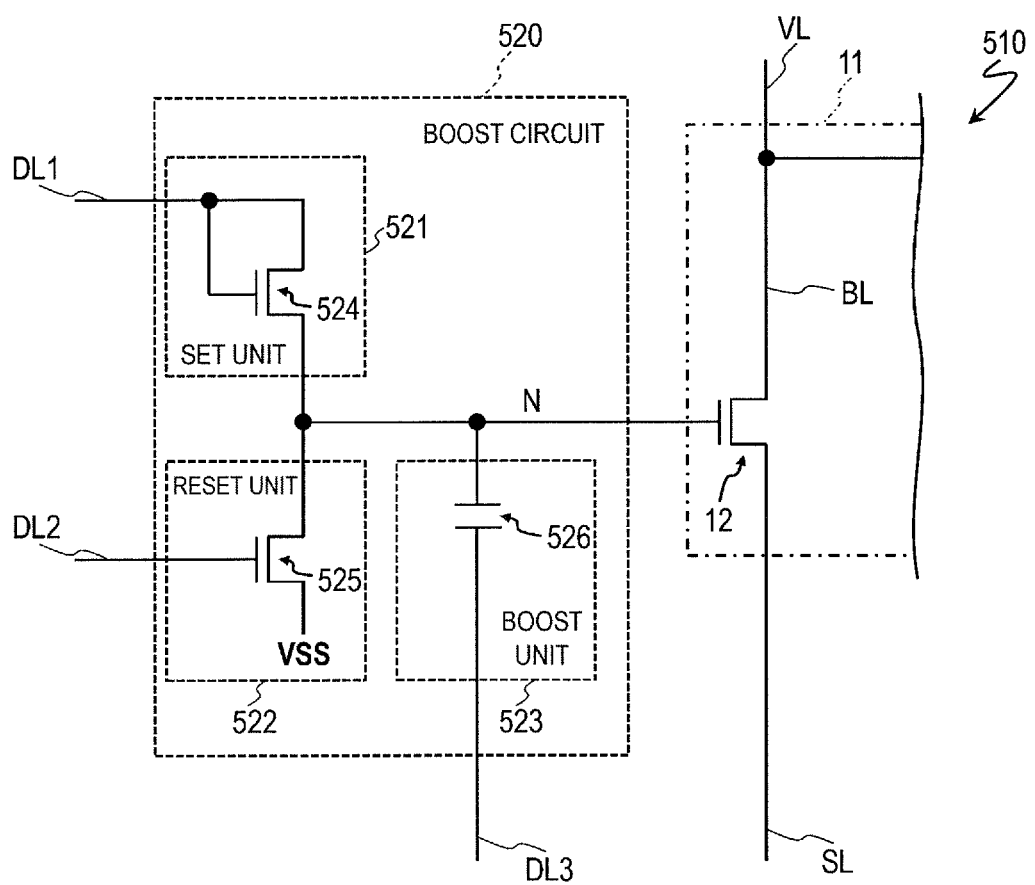
FIG. 5 is a diagram illustrating a specific configuration of a set unit 521, a reset unit 522, and a boost unit 523 included in the boost circuit 520.

With reference to FIG. 5, a more specific configuration of the boost circuit 520 is described. FIG. 5 is a diagram illustrating an example of a specific configuration of the set unit 521, the reset unit 522, and the boost unit 523 included in the boost circuit 520.

As illustrated in FIG. 5, the set unit 521 includes a TFT (hereinafter, referred to as a "setting TFT") 524. The setting TFT 524 is diode-connected, and a gate electrode and drain electrode of the setting TFT 524 are connected to the first drive signal line DL1. A source electrode of the setting TFT 524 is connected to the node N.

The reset unit 522 includes a TFT (hereinafter referred to as a resetting TFT) 525. A gate electrode of the resetting TFT 525 is connected to the second drive signal line DL2. The resetting TFT 525 is configured to be able to pull down the potential of the node N. Specifically, a source electrode of the resetting TFT 525 is given with a constant potential (negative power supply potential VSS), and a drain electrode of the resetting TFT 525 is connected to the node N.

The boost unit 523 includes a capacitance element (hereinafter, referred to as a "boost capacitance element") 526. The boost capacitance element 526 includes an electrode (a first capacitance electrode) connected to the third drive signal line DL3 and an electrode (a second capacitance electrode) connected to the node N.

Figure 6:
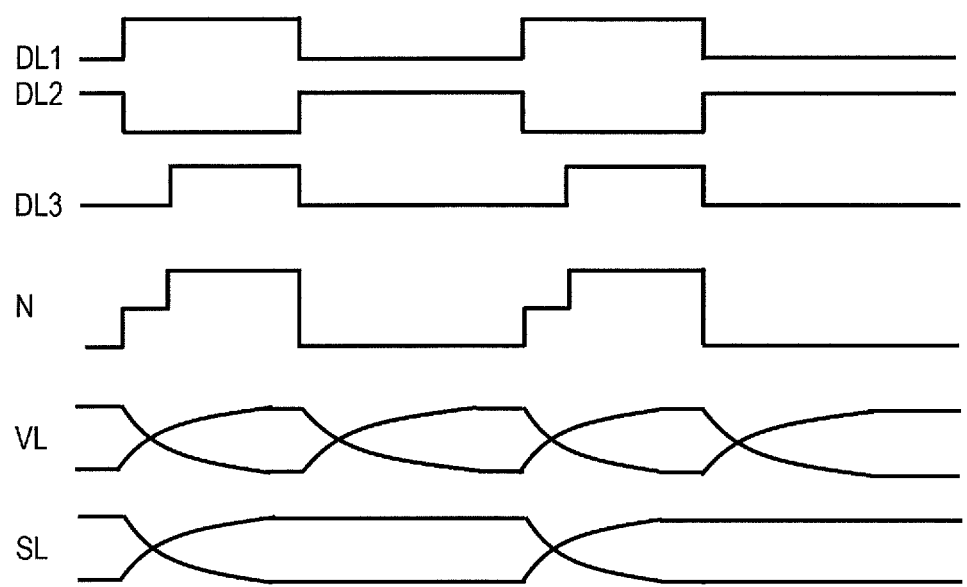
FIG. 6 is a timing chart for describing actions of the boost circuit 520.

With reference to FIG. 6, actions of the boost circuit 520 is described. FIG. 6 is a timing chart for describing the actions of the boost circuit 520. FIG. 6 illustrates potentials of the first drive signal line DL1, the second drive signal line DL2, the third drive signal line DL3, the node N, the signal output line VL, and the source bus line SL. In the following descriptions, the high level and the low level of the potentials of the first drive signal lines DL1, second drive signal line DL2, and third drive signal line DL3 are expressed as "VDH" and "VDL", respectively. For example, VDH is 10 V, and VDL is −10 V.

First, when the potential of the first drive signal line DL1 (a set signal) changes from the low level to the high level, the setting TFT 524 turns to an on state and the node N is precharged. At this time, since the setting TFT 524 is diode-connected, assuming that a threshold voltage for the setting TFT 524 is Vth, the node N is precharge to the potential (VDH−Vth).

Next, when the potential of the third drive signal line DL3 (a boost signal) changes from the low level to the high level, the potential of the node N is boosted. A degree of the boost varies depending on a ratio of a total Cn1 of a load capacitance of the node N (a total load capacitance) to a capacitance value Cbst of the boost capacitance element 526. Specifically, the potential of a boosted differential is obtained by multiplying an amplitude of the drive signal (=VDH−VDL) by (Cbst/Cn1). Therefore, for example, in a case where the total load capacity Cn1 of the node N is 0.2 pF and the capacitance value Cbst of the boost capacitance element 526 is 0.1 pF, the potential of the node N is boosted from (VDH−Vth) to {(VDH−Vth)+(VDH−VDL)·(0.1/0.2)}. In a case where VDH=10 V, VDL=−10 V, and Vth=2 V, the node N is boosted to 18 V.

DEMUX Circuit in Comparison Example 2

Figure 7:
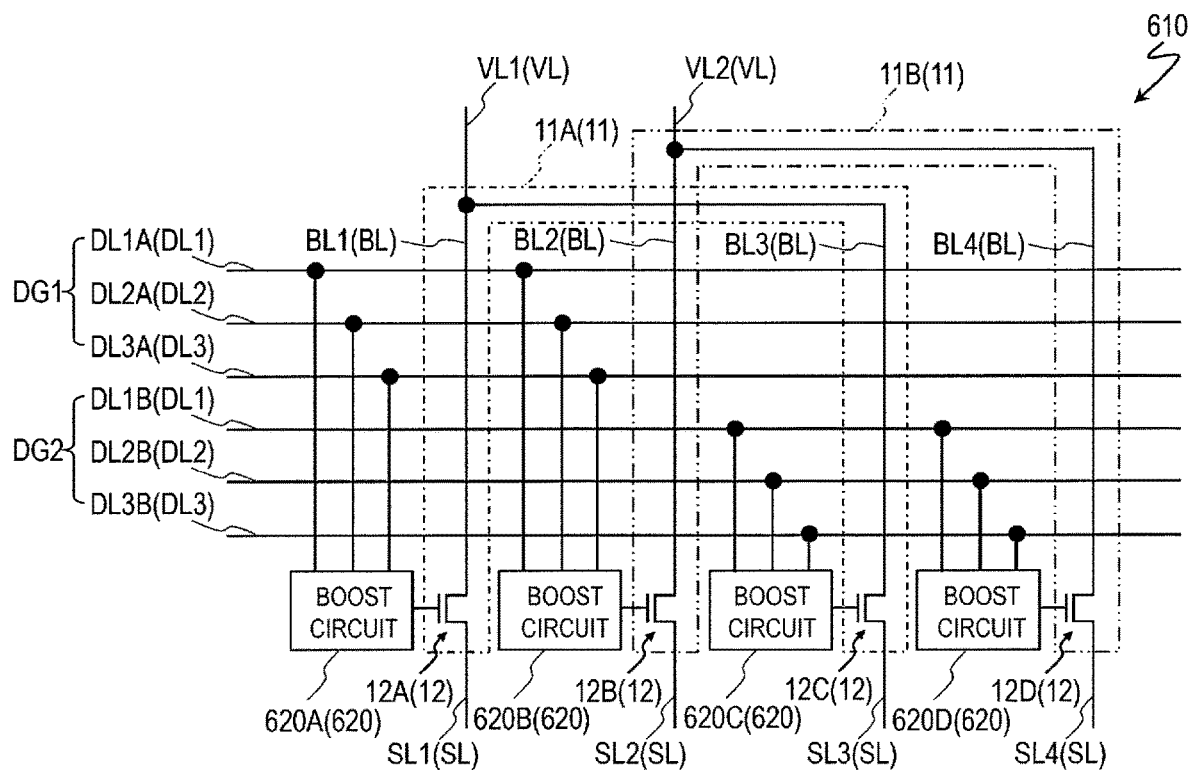
FIG. 7 is a diagram illustrating of a DEMUX circuit 610 according to Comparison Example 2.

With reference to FIG. 7, a description is given of a DEMUX circuit 610 according to Comparison Example 2.

As illustrated in FIG. 7, the DEMUX circuit 610 includes a plurality of unit circuits 11. Each of a plurality of unit circuits 11 distributes a display signal from one signal output line VL into two source bus lines SL. A unit circuit 11A (the first unit circuit) that is one of two unit circuits 11 illustrated in FIG. 7 distributes a display signal from a signal output line VL1 into source bus lines SL1 and SL3, and a unit circuit 11B (the second unit circuit) that is the other distributes a display signal from a signal output line VL2 into source bus lines SL2 and SL4.

Each unit circuit 11 includes two branch wiring lines BL and two switching TFTs 12.

The two branch wiring lines BL of each unit circuit 11 are connected to one signal output line VL. The two switching TFTs 12 in each unit circuit 11 are connected to the two branch wiring lines BL, respectively. The two switching TFTs 12 individually (independently) performs on/off control of electrical connection between two branch wiring lines BL and two source bus lines SL. Each of the two switching TFTs 12 is an oxide semiconductor TFT.

A switching TFT 12A that is one of the two switching TFTs 12A and 12C in the first unit circuit 11A performs on/off control of the electrical connection between a branch wiring line BL1 and a source bus line SL1, and a switching TFT 12C that is the other performs on/off control of the electrical connection between a branch wiring line BL3 and a source bus line SL3. A source electrode and a drain electrode of the former switching TFT 12A are connected to the branch wiring line BL1 and the source bus line SL1, respectively, and a source electrode and a drain electrode of the latter switching TFT 12C are connected to the branch wiring line BL3 and the source bus line SL3, respectively.

A switching TFT 12B that is one of the two switching TFTs 12B and 12D in the second unit circuit 11B performs on/off control of the electrical connection between a branch wiring line BL2 and a source bus line SL2, and a switching TFT 12D that is the other performs on/off control of the electrical connection between a branch wiring line BL4 and a source bus line SL4. A source electrode and a drain electrode of the former switching TFT 12B are connected to the branch wiring line BL2 and the source bus line SL2, respectively, and a source electrode and a drain electrode of the latter switching TFT 12D are connected to the branch wiring line BL4 and the source bus line SL4, respectively.

The DEMUX circuit 610 further includes a plurality of boost circuits 620 each of which can boost a voltage applied to the gate electrode of each of two switching TFTs 12 in each unit circuit 11 as illustrated in FIG. 7. In the example illustrated in FIG. 7, one boost circuit 620 is connected to each switching TFT 12. Specifically, the gate electrodes of the switching TFTs 12A, 12B, 12C, and 12D are connected to output sides of the boost circuits 620A, 620B, 620C, and 620D, respectively.

In the example illustrated in FIG. 7, each boost circuit 620 is driven by a first drive signal, a second drive signal, and a third drive signal supplied from a first drive signal line DL1, a second drive signal line DL2, and a third drive signal line DL3, respectively. The boost circuit 620 boosts the voltage such that a drive amplitude of a gate potential of the switching TFT 12 increases corresponding to amplitudes of the first drive signal, the second drive signal, and the third drive signal.

In the example illustrated in FIG. 7, two systems of drive signal line groups DG1 and DG2 are provided. The boost circuits 620A and 620B are driven by a first drive signal line DL1A, a second drive signal line DL2A, and a third drive signal line DL3A in the drive signal line group DG1 that is one of the drive signal line groups DG1 and DG2. The boost circuits 620C and 620D are driven by a first drive signal line DL1B, a second drive signal line DL2B, and a third drive signal line DL3B in the drive signal line group DG2 that is the other of the drive signal line groups DG1 and DG2.

As described above, the DEMUX circuit 610 includes the boost circuit 620 which can boost the voltage applied to the gate electrode of the switching TFT 12, and thus an effective drive voltage of the DEMUX circuit 610 can be increased. Therefore, the DEMUX circuit 610 can be driven by a drive signal of a relatively small amplitude, and thus power consumption due to charging and discharging of the drive signal can be reduced.

Figure 8:
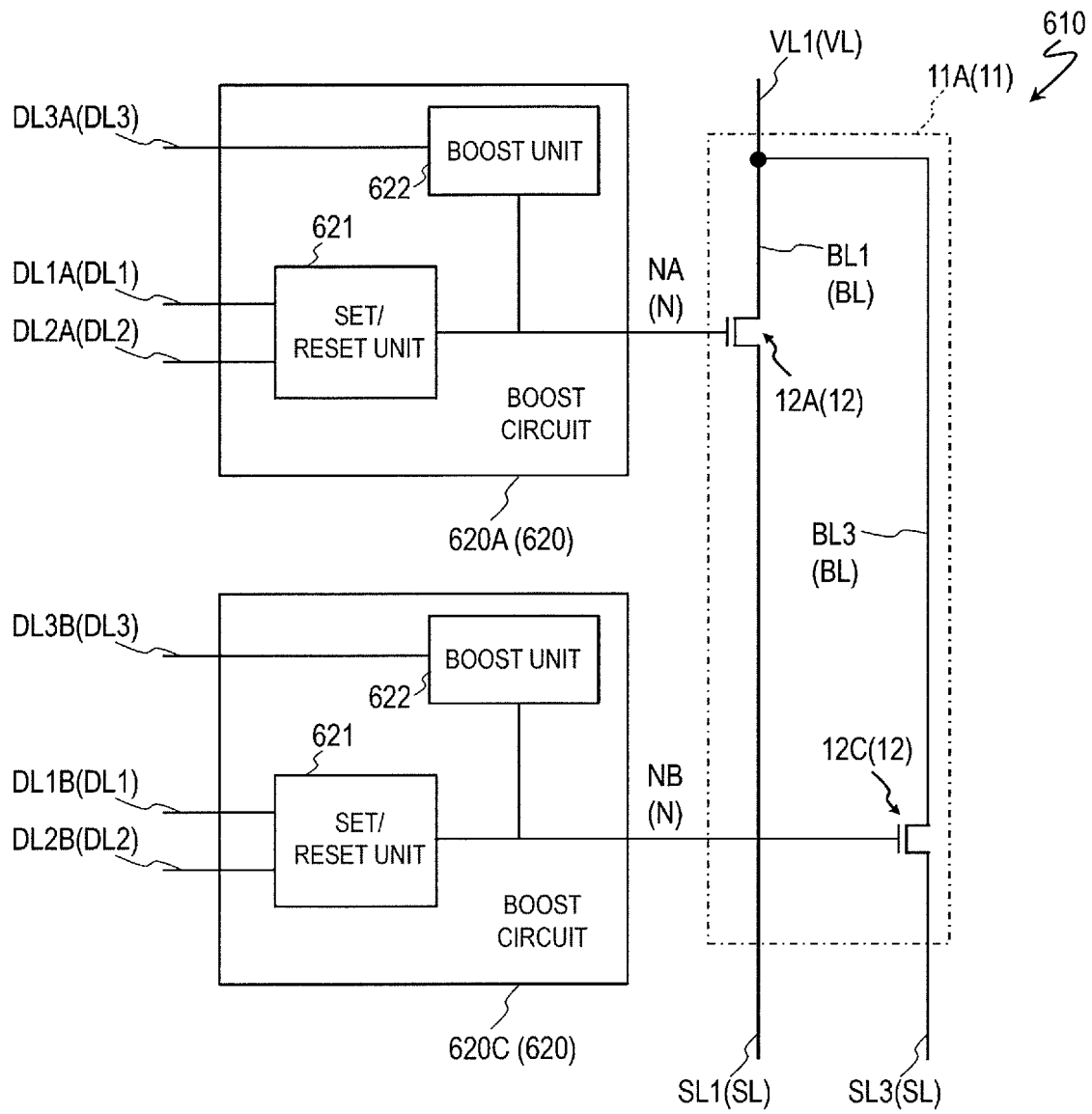
FIG. 8 is a diagram illustrating a boost circuit 620 included in the DEMUX circuit 610.

With reference to FIG. 8, a specific configuration of each boost circuit 620 is described.

As illustrated in FIG. 8, the boost circuit 620 includes a set/reset unit 621 and a boost unit 622. The set/reset unit 621 and the boost unit 622 are connected to a node N connected to the gate electrode of the switching TFT 12. The set/reset unit 621 is connected to the first drive signal line DL1 and the second drive signal line DL2, and the boost unit 622 is connected to the third drive signal line DL3.

The set/reset unit 621 is supplied with the first drive signal (set signal) from the first drive signal line DL1 to perform an action to precharge the node N (hereinafter, referred to as a "set action"). The first drive signal is a signal whose level is changed at least at the start of the set action. The set/reset unit 621 is supplied with the second drive signal (reset signal) from the second drive signal line DL2 to perform an action to reset the potential of the node N (hereinafter, referred to as a "reset action"). The second drive signal is a signal whose level is not changed at the start of the set action and is different from the level of the first drive signal in the reset action. The set action and reset action by the set/reset unit 621 are performed at timings different from each other.

The boost unit 622 is supplied with the third drive signal (boost signal) from the third drive signal line DL3 to boost the potential of the node N precharged due to the set action by the set/reset unit 621. The third drive signal is a signal whose level is changed at least at the start of the boost action.

Figure 9:
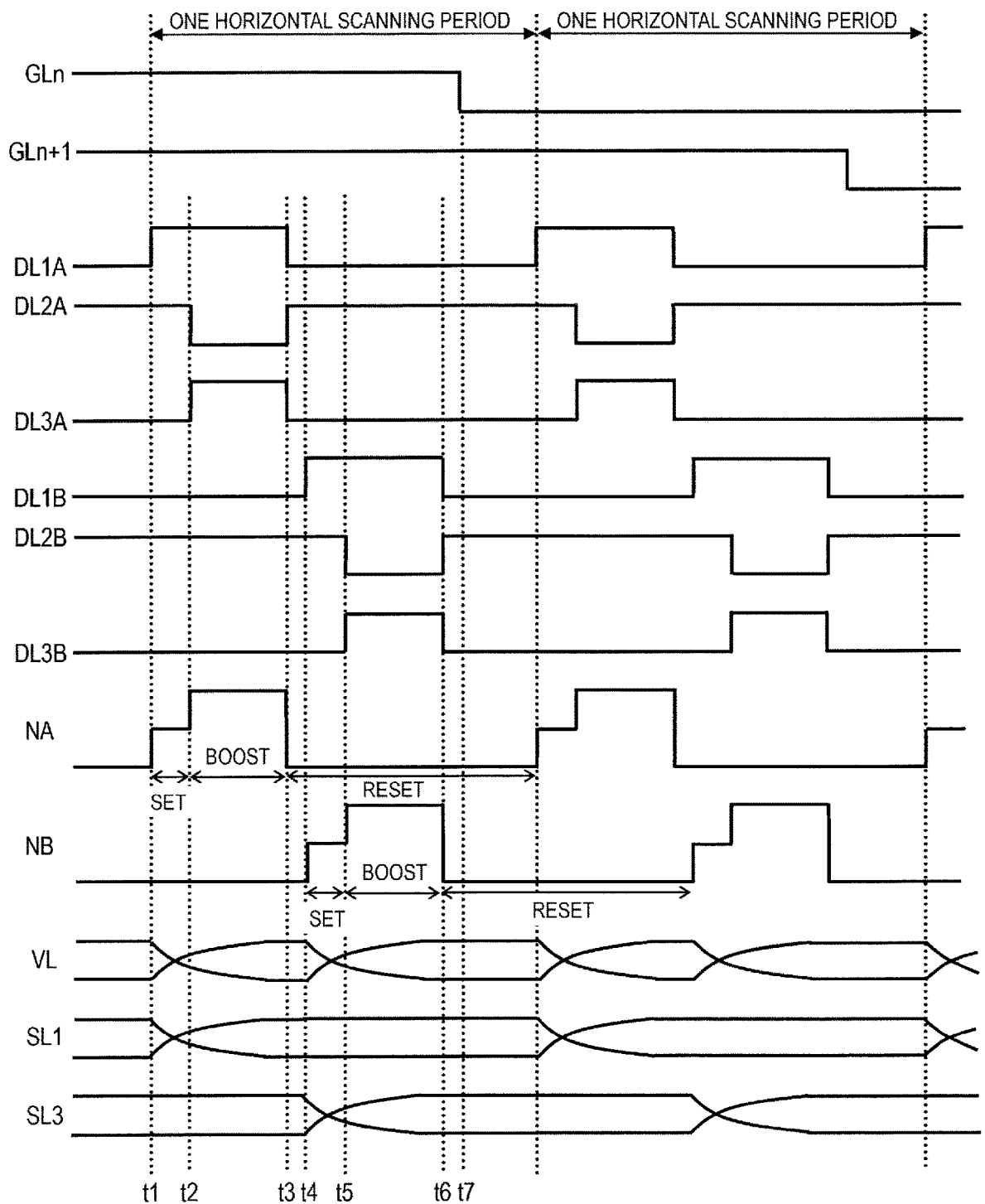
FIG. 9 is a timing chart for describing actions of the DEMUX circuit 610.

Here, actions of the boost circuit 620 (DEMUX circuit 610) are described also with reference to FIG. 9. FIG. 9 is a timing chart for describing actions of the DEMUX circuit 610. FIG. 9 illustrates potentials of the first drive signal lines DL1A and DL1B, the second drive signal lines DL2A and DL2B, the third drive signal lines DL3A and DL3B, the nodes NA and NB, the signal output line VL, and the source bus lines SL1 and SL3. FIG. 9 also illustrates potentials of gate bus lines GLn and GLn+1.

First, at a time point t1, the potential of the first drive signal line DL1A becomes the high level. At this time, the potential of the second drive signal line DL2A remains at the high level from a previous horizontal scan period, and the first drive signal as a set signal is input to the set/reset unit 621 in the boost circuit 620A. This allows the node NA connected to the gate electrode of the switching TFT 12A to be precharged (set action). At this timing, the potential of the signal output line VL (i.e., the display signal) is changed to the write voltage level, and the charge of the selected source bus line SL1 is started.

Next, at a time point t2, the potential of the second drive signal DL2A becomes the low level and the potential of the third drive signal line DL3A becomes the high level, and the third drive signal as a boost signal is input to the boost unit 622 in the boost circuit 620A. This allows the potential of the node NA to be boosted (boost action). The potential of the node NA being boosted allows the source bus line SL1 to be sufficiently charged through the switching TFT 12A.

Subsequently, at a time point t3, the potential of the first drive signal line DL1A becomes the low level, the potential of the second drive signal line DL2A becomes the high level, the potential of the third drive signal line DL3A becomes the low level, and the second signal as a reset signal is input to the set/reset unit 621 in the boost circuit 620A. This allows the potential of the node NA to be reset (reset action), and the writing into the source bus line SL1 is completed.

Next, at a time point t4, the potential of the first drive signal line DL1B becomes the high level. At this time, the potential of the second drive signal line DL2B remains at the high level from the previous horizontal scan period, and the first drive signal as a set signal is input to the set/reset unit 621 in the boost circuit 620C. This allows the node NB connected to the gate electrode of the switching TFT 12C to be precharged (set action). At this timing, the potential of the signal output line VL (i.e., the display signal) is changed to the write voltage level, and the charge of the selected source bus line SL3 is started.

Subsequently, at a time point t5, the potential of the second drive signal DL2B becomes the low level and the potential of the third drive signal line DL3B becomes the high level, and the third drive signal as a boost signal is input to the boost unit 622 in the boost circuit 620C. This allows the potential of the node NB to be boosted (boost action). The potential of the node NB being boosted allows the source bus line SL3 to be sufficiently charged through the switching TFT 12C.

Next, at a time point t6, the potential of the first drive signal line DL1B becomes the low level, the potential of the second drive signal line DL2B becomes the high level, the potential of the third drive signal line DL3B becomes the low level, and the second drive signal as a reset signal is input to the set/reset unit 621 in the boost circuit 620C. This allows the potential of the node NB to be reset (reset action), and the writing into the source bus line SL3 is completed.

After that, when the writing into the source bus lines SL1 and SL3 is completed (the potential is determined), the gate signal supplied from the gate bus line GLn becomes the off-level (at a time point t7), and the writing of the display voltage into the pixel PIX is completed. After that, the actions described above are repeated to perform the writing for the all gate bus lines GL.

Figure 10:
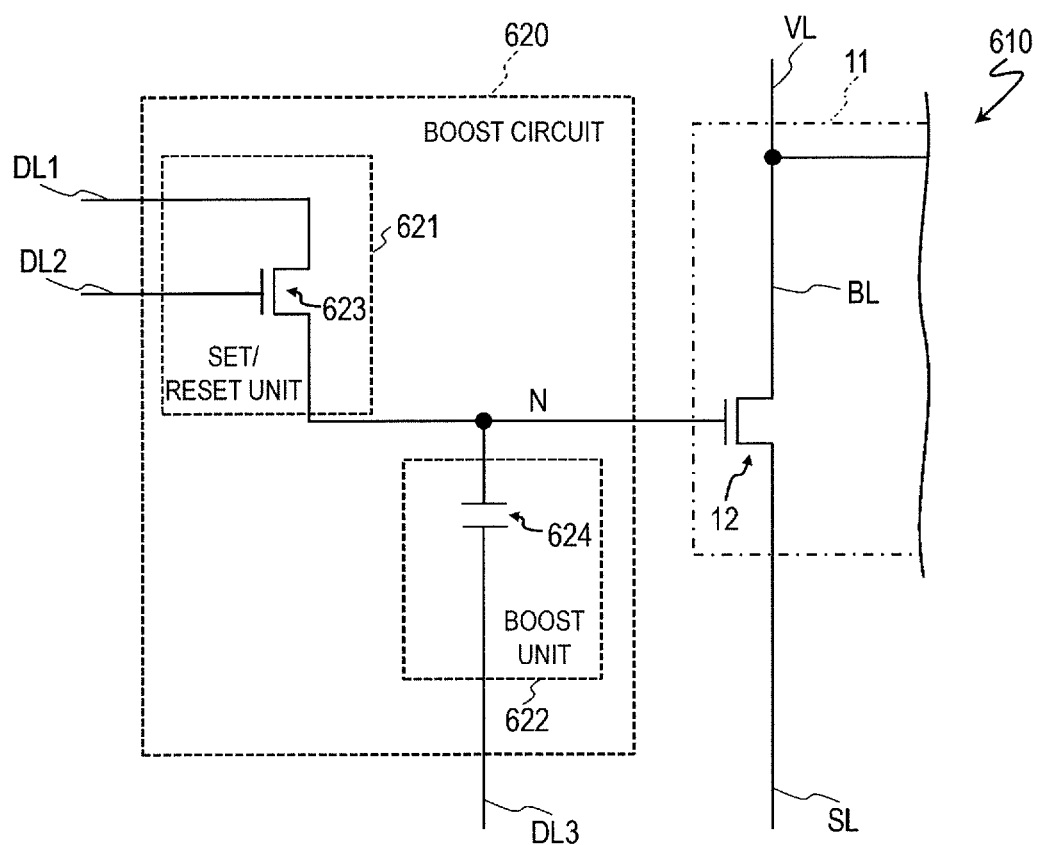
FIG. 10 is a diagram illustrating a specific configuration of a set/reset unit 621 and a boost unit 622 included in the boost circuit 620.

With reference to FIG. 10, a more specific configuration of the boost circuit 620 is described. FIG. 10 is a diagram illustrating an example of a specific configuration of the set/reset unit 621 and the boost unit 622 in the boost circuit 620.

As illustrated in FIG. 10, the set/reset unit 621 includes a TFT (hereinafter, referred to as a "setting/resetting TFT") 623. A gate electrode of the setting/resetting TFT 623 is connected to the second drive signal line DL2. A drain electrode of the setting/resetting TFT 623 is connected to the first drive signal line DL1, and a source electrode of the setting/resetting TFT 623 is connected to the node N.

The boost unit 622 includes a capacitance element (hereinafter, referred to as a "boost capacitance element") 624. The boost capacitance element 624 includes an electrode (a first capacitance electrode) connected to the third drive signal line DL3 and an electrode (a second capacitance electrode) connected to the node N.

Figure 11:
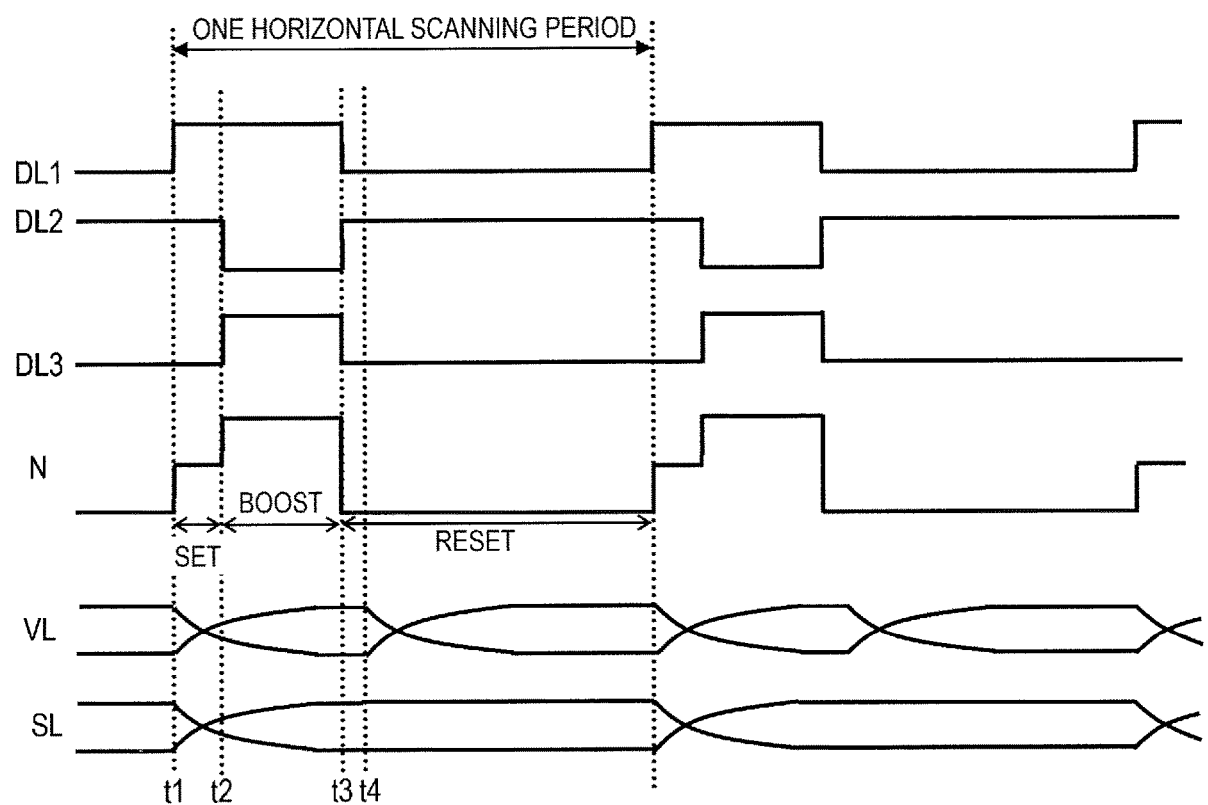
FIG. 11 is a timing chart for describing actions of the boost circuit 620.

With reference to FIG. 11, actions of the boost circuit 620 is described. FIG. 11 is a timing chart for describing the actions of the boost circuit 620. FIG. 11 illustrates potentials of the first drive signal line DL1, the second drive signal line DL2, the third drive signal line DL3, the node N, the signal output line VL, and the source bus line SL.

First, at a time point t1, when the potential of the first drive signal line DL1 (set signal) changes from the low level to the high level while the potential of the second drive signal line DL2 (reset signal) remains at the high level, the setting/resetting TFT 623 turns to the on state and the node N is precharged. At this time, the gate electrode and drain electrode of the setting/resetting TFT 623 are at the same potential and the setting/resetting TFT 623 is in a state of being so-called diode-connected, and therefore, assuming that a threshold voltage for the setting/resetting TFT 623 is Vth, the node N is precharged to the potential (VDH−Vth).

Next, at a time point t2, when the potential of the third drive signal line DL3 (boost signal) changes from the low level to the high level (at this time, the potential of the second drive signal line DL2 becomes the low level), the potential of the node N is boosted. A degree of the boost varies depending on a ratio of a total Cn1 of a load capacitance of the node N (a total load capacitance) to a capacitance value Cbst of the boost capacitance element 624. More specifically, the potential of a boosted differential is obtained by multiplying an amplitude of the drive signal (=VDH−VDL) by (Cbst/Cn1). Therefore, for example, in a case where the total load capacity Cn1 of the node N is 0.2 pF and the capacitance value Cbst of the boost capacitance element 624 is 0.1 pF, the potential of the node N is boosted from (VDH−Vth) to {(VDH−Vth)+(VDH−VDL)·(0.1/0.2)}. In a case where VDH=10 V, VDL=−10 V, and Vth=2 V, the node N is boosted to 18 V.

After that, at a time point t3, when the potential of the first drive signal line DL1 and the potential of the third drive signal line DL3 change to the low level, and the potential of the second drive signal line DL2 (reset signal) changes to the high level, the potential of the node N is reset (pulled down).

As described above, each of the first drive signal, the second drive signal, and the third drive signal has a periodical waveform containing the change from the low level to the high level and the change from the high level to the low level, and when the first drive signal and the second drive signal are at the high level, the set action is performed. When the third drive signal is at the high level, the boost action is performed, and when the first drive signal is at the low level and the second drive signal is at the high level, the reset action is performed.

In the DEMUX circuit 510 in Comparison Example 1, the boost circuit 520 includes the set unit 521, the reset unit 522, and the boost unit 523. In contrast, in the DEMUX circuit 610 in Comparison Example 2, the boost circuit 610 includes the set/reset unit 621 and the boost unit 622. Therefore, in the DEMUX circuit 610 in Comparison Example 2, the number of elements in the boost circuit 620 can be decreased. For example, in the configuration illustrated in FIG. 5, the boost circuit 520 includes two TFT (the setting TFT 524 and the resetting TFT 525) and one capacitance element (the boost capacitance element 526), whereas, in the configuration illustrated in FIG. 10, the boost circuit 620 includes one TFT (the setting/resetting TFT 623) and one capacitance element (the boost capacitance element 624). For this reason, the frame narrowing can be further improved in the DEMUX circuit 610 in Comparison Example 2 compared with the DEMUX circuit 510 in Comparison Example 1.

DEMUX Circuit in Comparison Example 3

Figure 12:
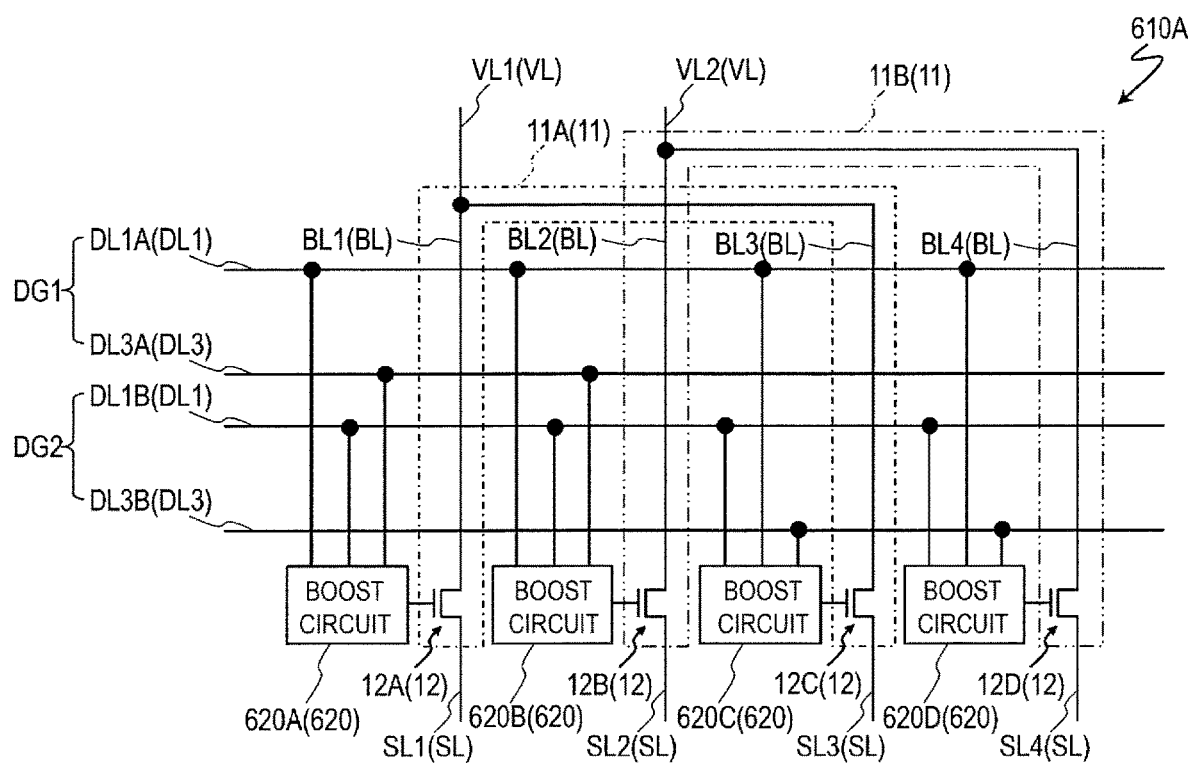
FIG. 12 is a diagram illustrating a DEMUX circuit 610A according to Comparison Example 3.
Figure 13:
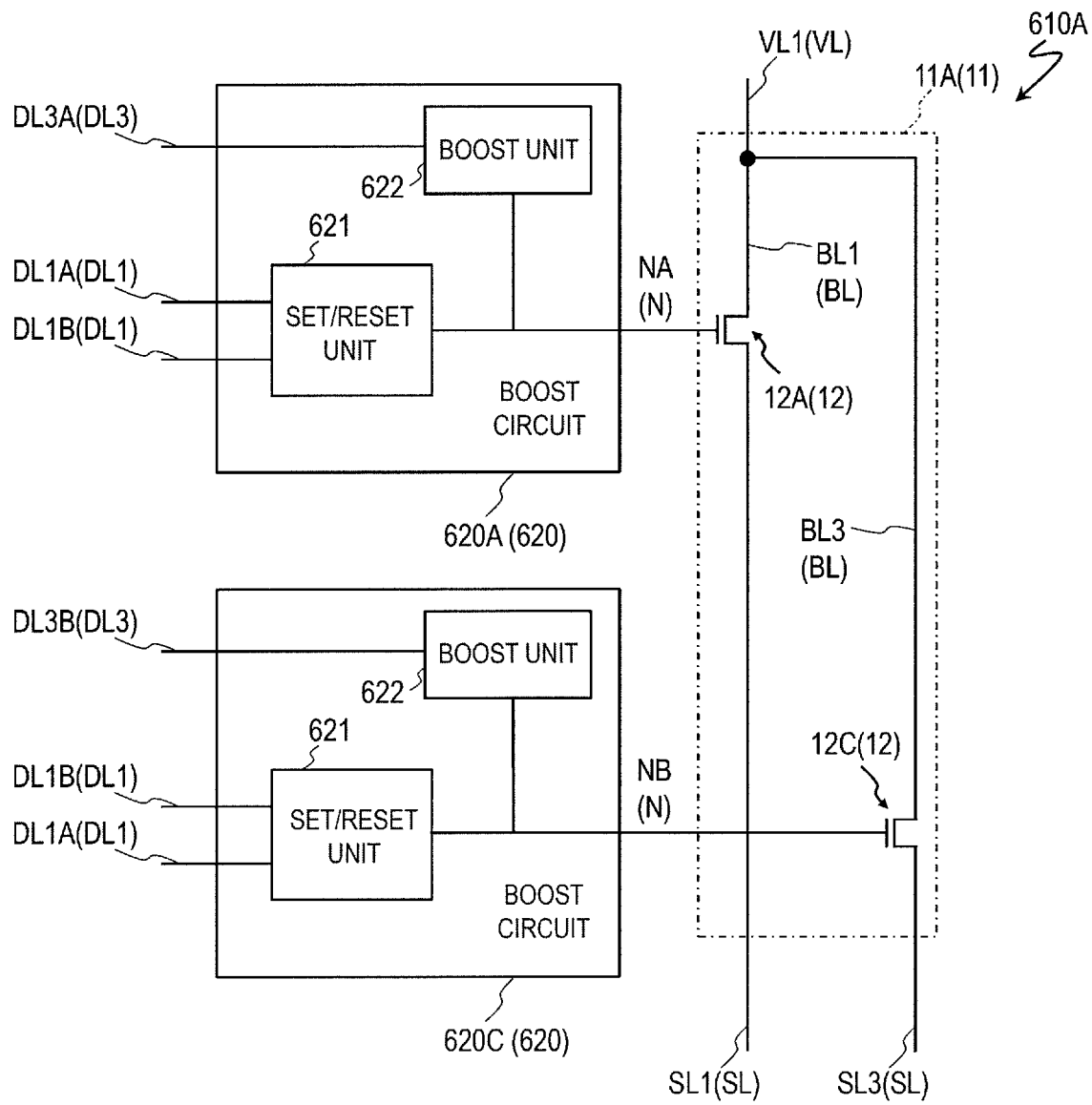
FIG. 13 is a diagram illustrating a boost circuit 620 included in the DEMUX circuit 610A.

With reference to FIGS. 12 and 13, a description is given of a DEMUX circuit 610A according to Comparison Example 3.

The DEMUX circuit 610A in Comparison Example 3 is different from the DEMUX circuit 610 in Comparison Example 2 in that the DEMUX circuit 610A does not include the second drive signal line DL2 as illustrated in FIG. 12. FIG. 13 illustrates boost circuits (a first boost circuit and a second boost circuit) 620A and 620C connected to two switching TFTs (a first switching TFT and a second switching TFT) 12A and 12C included in the unit circuit 11A in the DEMUX circuit 610A. The first switching TFT 12A and the second switching TFT 12C are turned to the on state at timings different from each other within one horizontal scan period.

As illustrated in FIG. 13, a set/reset unit 621 in the first boost circuit 620A is connected to a first drive signal line DL1B for the second boost circuit 620C in place of the second drive signal line DL2. A set/reset unit 621 in the second boost circuit 620C is connected to a first drive signal line DL1A for the first boost circuit 620A in place of the second drive signal line DL2.

In this way, in the DEMUX circuit 610A in Comparison Example 3, the first drive signal line DL1A for the first boost circuit 620A also serves as the second drive signal line for the second boost circuit 620C, and the first drive signal line DL1B for the second boost circuit 620C also serves as the second drive signal line for the first boost circuit 620A. By adopting the configuration in Comparison Example 3, the second drive signal line can be omitted to further decrease the number of wiring lines.

Figure 14:
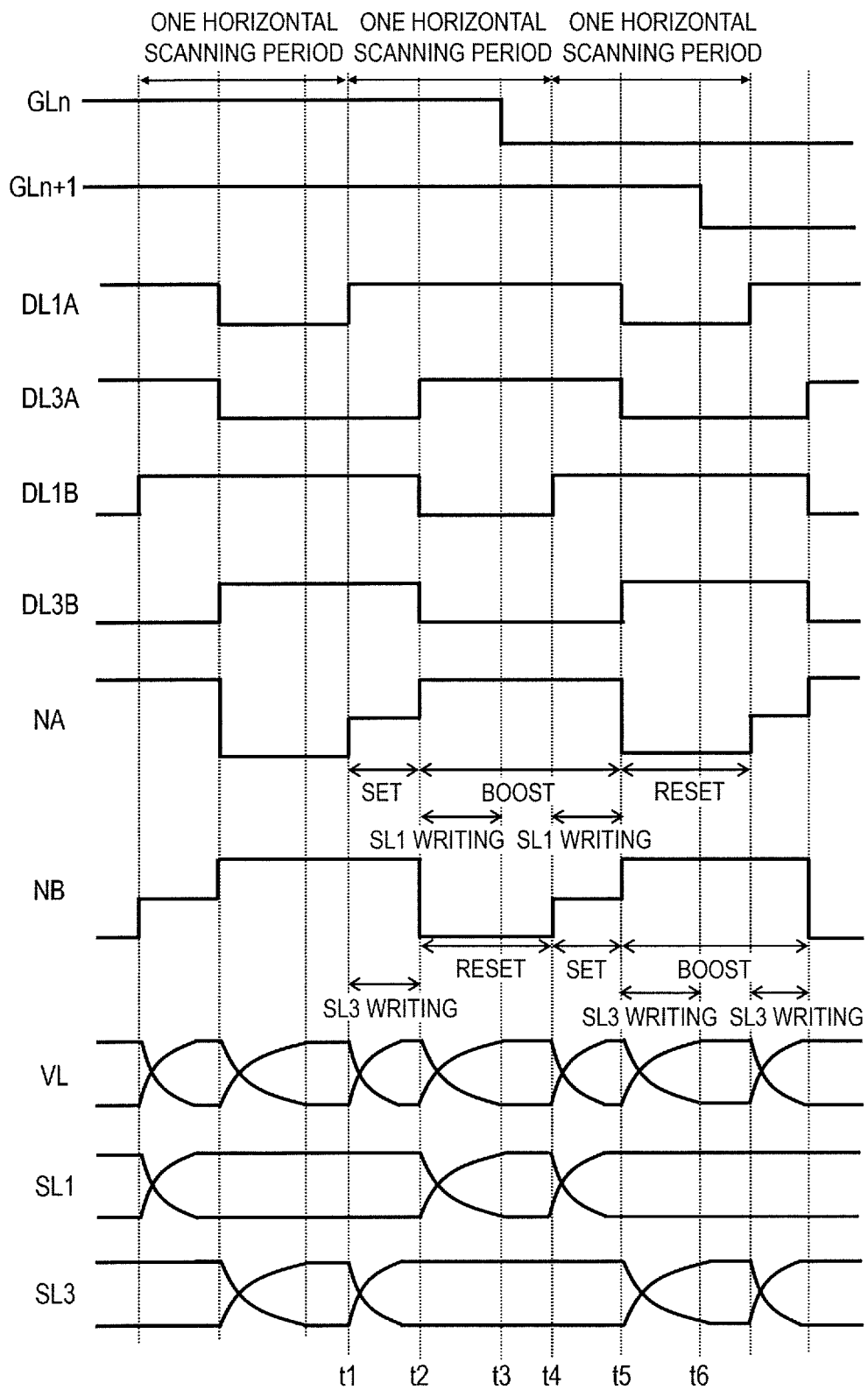
FIG. 14 is a timing chart for describing actions of the DEMUX circuit 610A.

Here, actions of the DEMUX circuit 610A are described also with reference to FIG. 14. FIG. 14 is a timing chart for describing the actions of the DEMUX circuit 610A.

Time Point t1

Side on the first switching TFT 12A: The potential of the first drive signal line DL1A for the first boost circuit 620A becomes the high level. At this time, the potential of the first drive signal line DL1B for the second boost circuit 620C remains at the high level from the previous horizontal scan period, and the first drive signal for the first boost circuit 620A as a set signal is input to the set/reset unit 621 in the boost circuit 620A. This allows the node NA connected to the gate electrode of the first switching TFT 12A to be precharged (set action).

Side on the second switching TFT 12C: The node NB connected to the gate electrode of the second switching TFT 12C holds the voltage boosted during the previous horizontal scan period, and therefore, the source bus line SL3 is charged to the write voltage level of the signal output line VL.

Time Point t2

Side on the first switching TFT 12A: The potential of the third drive signal line DL3A becomes the high level, and the third drive signal as a boost signal is input to the boost unit 622 in the boost circuit 620A. This allows the potential of the node NA to be boosted (boost action). The potential of the node NA being boosted allows the source bus line SL1 to be sufficiently charged through the switching TFT 12A.

Side on the second switching TFT 12C: The potential of the first drive signal line DL1B and the potential of the third drive signal line DL3B become the low level, and the first drive signal for the first boost circuit 620A as a reset signal is input to the set/reset unit 621 in the second boost circuit 620C. This allows the potential of the node NB to be reset (reset action).

Time Point t3

In a state that each of the source bus lines SL1 and SL3 is charged with the write voltage, the gate signal supplied from the gate bus line GLn becomes the off-level, and the writing of the display voltage is completed.

Time Point t4

Side on the first switching TFT 12A: The node NA connected to the gate electrode of the first switching TFT 12A holds the voltage boosted during the previous horizontal scan period, and therefore, the source bus line SL1 is charged to the write voltage level of the signal output line VL.

Side on the second switching TFT 12C: The potential of the first drive signal line DL1B for the second boost circuit 620A becomes the high level. At this time, the potential of the first drive signal line DL1A for the first boost circuit 620A remains at the high level from the previous horizontal scan period, and the first drive signal for the second boost circuit 620C as a set signal is input to the set/reset unit 621 in the boost circuit 620C. This allows the node NB connected to the gate electrode of the second switching TFT 12C to be precharged (set action).

Time Point t5

Side on the first switching TFT 12A: The potential of the first drive signal line DL1A and the potential of the third drive signal line DL3A become the low level, and the first drive signal for the second boost circuit 620C as a reset signal is input to the set/reset unit 621 in the first boost circuit 620A. This allows the potential of the node NA to be reset (reset action).

Side on the second switching TFT 12C: The potential of the third drive signal line DL3B becomes the high level, and the third drive signal as a boost signal is input to the boost unit 622 in the boost circuit 620C. This allows the potential of the node NB to be boosted (boost action). The potential of the node NB being boosted allows the source bus line SL3 to be sufficiently charged through the switching TFT 12C.

Time Point t6

In a state that each of the source bus lines SL1 and SL3 is charged with the write voltage, the gate signal supplied from the gate bus line GLn+1 becomes the off-level, and the writing of the display voltage is completed. After that, the actions described above are repeated to perform the writing for the all gate bus lines GL.

In the example illustrated in FIG. 14, the set action is performed by the set/reset unit 621 in the second boost circuit 620C within a period during which the boost action is performed by the boost unit 622 in the first boost circuit 620A. The set action is performed by the set/reset unit 621 in the first boost circuit 620A within a period during which the boost action is performed by the boost unit 622 in the second boost circuit 620C. For this reason, a time for precharge of the node N and a time for charge of the source bus line SL can be lengthened to improve charge performance.

In the example illustrated in FIG. 9, one cycle of the periodical waveform of each of the first drive signal, the second drive signal, and the third drive signal corresponds to a time equivalent to one horizontal scan period. In other words, within a time equivalent to one horizontal scan period, the change from the low level to the high level and the change from the high level to the low level occur one time each.

In contrast, in the example illustrated in FIG. 14, one cycle of the periodical waveform of each of the first drive signal, the second drive signal, and the third drive signal corresponds to a time equivalent to two horizontal scan periods. In other words, within a time equivalent to two horizontal scan periods, the change from the low level to the high level and the change from the high level to the low level occur one time each. In this way, a frequency of the drive signal in the example illustrated in FIG. 14 is lower than a frequency in the example illustrated in FIG. 9, and thus power consumption reduction can be attained.

In the example illustrated in FIG. 9, the source bus lines SL1 and SL3 are selected alternately, in other words, in order of the source bus lines SL1, SL3, SL1, SL3, . . . . In contrast, in the example illustrated in FIG. 14, one of the source bus lines SL1 and SL3 is successively selected two times, and thereafter, the other is successively selected two times. In other words, the selection is performed in order of the source bus lines SL1, SL1, SL3, SL3, SL1, SL1, . . . .

Figure 15:
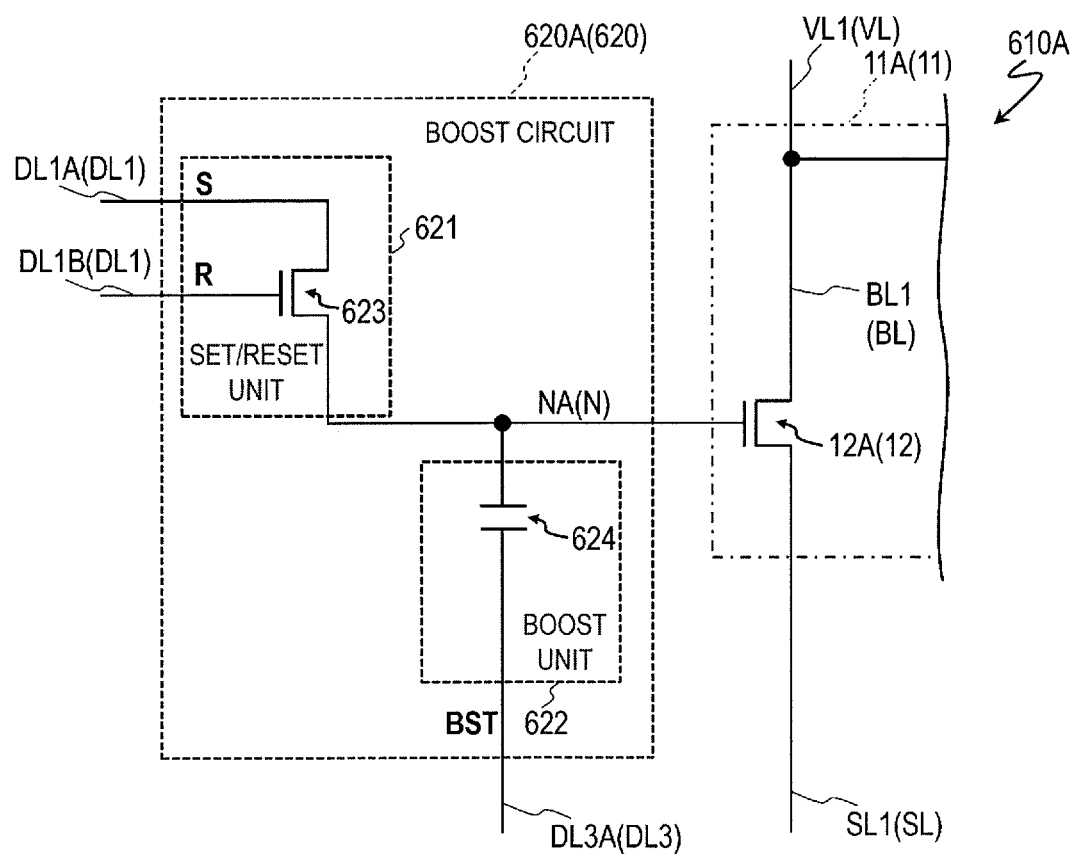
FIG. 15 is a diagram illustrating a specific configuration of a set/reset unit 621 and a boost unit 622 included in the boost circuit 620 in the DEMUX circuit 610A.

With reference to FIG. 15, a more specific configuration of the boost circuit 620 in Comparison Example 3 is described. FIG. 15 is a diagram illustrating an example of a specific configuration of the set/reset unit 621 and the boost unit 622 included in the first boost circuit 620A.

As illustrated in FIG. 15, the set/reset unit 621 includes a setting/resetting TFT 623. A gate electrode of the setting/resetting TFT 623 is connected to the first drive signal line DL1B for the second boost circuit 620C, and is supplied with a reset signal R from the first drive signal line DL1B. A drain electrode of the setting/resetting TFT 623 is connected to the first drive signal line DL1A, and is supplied with a set signal S from the first drive signal line DL1A. A source electrode of the setting/resetting TFT 623 is connected to the node NA.

The boost unit 622 includes a capacitance element (hereinafter, referred to as a "boost capacitance element") 624. The boost capacitance element 624 includes an electrode (a first capacitance electrode) connected to the third drive signal line DL3A and an electrode (a second capacitance electrode) connected to the node NA. The first capacitance electrode is supplied with a boost signal BST from the third drive signal line DL3A.

Figure 16:
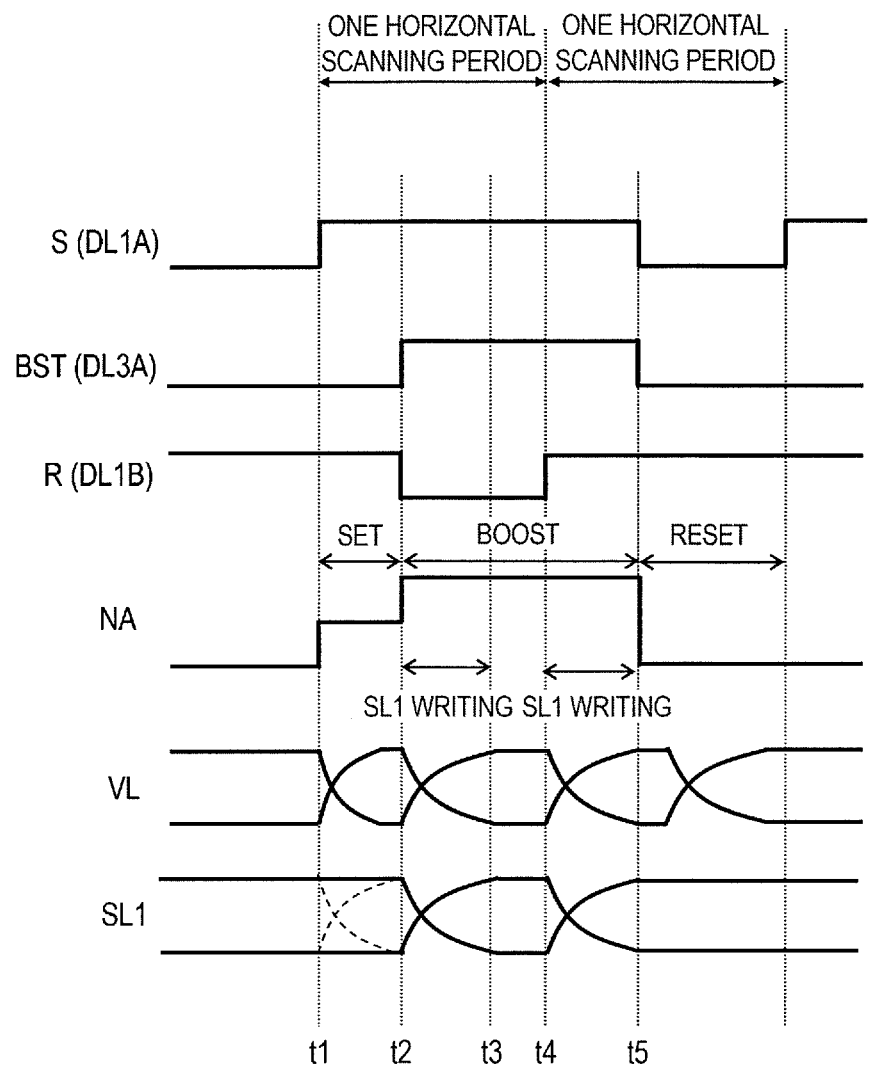
FIG. 16 is a timing chart for describing actions of the boost circuit 620 in the DEMUX circuit 610A.

With reference to FIG. 16, actions of the boost circuit 620 is described. FIG. 16 is a timing chart for describing the actions of the boost circuit 620. In the following descriptions, the high level and the low level of the potentials of the set signal S, reset signal R, and boost signal BST are expressed as "VDH" and "VDL", respectively.

First, at a time point t1, when the set signal S changes from the low level to the high level while the reset signal R remains at the high level, the setting/resetting TFT 623 turns to the on state and the node NA is precharged. At this time, the gate electrode and drain electrode of the setting/resetting TFT 623 are at the same potential and the setting/resetting TFT 623 is in a state of being so-called diode-connected, and therefore, assuming that a threshold voltage for the setting/resetting TFT 623 is Vth, the node NA is precharged to the potential (VDH−Vth).

Next, at a time point t2, when the boost signal BST changes from the low level to the high level (at this time, the reset signal R becomes the low level), the potential of the node NA is boosted to charge the source bus line SL1 (to write the display voltage). A degree of the boost varies depending on a ratio of a total Cn1 of a load capacitance of the node NA (a total load capacitance) to a capacitance value Cbst of the boost capacitance element 624. More specifically, the potential of a boosted differential is obtained by multiplying an amplitude of the drive signal (=VDH−VDL) by (Cbst/Cn1). Therefore, for example, in a case where the total load capacity Cn1 of the node NA is 0.2 pF and the capacitance value Cbst of the boost capacitance element 624 is 0.1 pF, the potential of the node NA is boosted from (VDH−Vth) to {(VDH−Vth)+(VDH−VDL)·(0.1/0.2)}. In a case where VDH=10 V, VDL=−10 V, and Vth=2 V, the node N1A is boosted to 18 V.

Subsequently, at a time point t3, in a state that the potential of the node NA is boosted, the gate signal supplied from the gate bus line GL becomes the off-level, and the writing is completed.

Next, at a time point t4, the node NA holds the voltage boosted during the previous horizontal scan period, and therefore, the source bus line SL1 is charged again.

After that, at a time point t5, when each of the set signal S and the boost signal BST changes to the low level while the reset signal R remains at the high level, the potential of the node NA is reset (pulled down).

Problems in DEMUX Circuits in Comparison Examples 1 to 3

In the DEMUX circuit 510 in Comparison Example 1, since the setting TFT 524 is diode-connected, magnitudes of a gate voltage and a drain voltage in the set action are the same. Therefore, a voltage after the set action (precharge voltage) has a magnitude dropped lower by a threshold voltage for the setting TFT 524. Therefore, a voltage after the boost action (boost voltage) also has a magnitude dropped lower by the threshold voltage for the setting TFT 524. The voltage after the boost action is expressed specifically as VGH−Vth+α·Vpp. Here, VGH represents a power supply voltage of the high level, α represents a pushing up efficiency, and Vpp represents a voltage amplitude of the third drive signal supplied to the boost unit 523.

In the DEMUX circuits 610 and 610A in Comparison Examples 2 and 3, although the setting/resetting TFT 623 is not diode-connected, the magnitudes of the gate voltage and the drain voltage in the set action are the same. Therefore, the precharge voltage has a magnitude dropped lower by the threshold voltage for the setting/resetting TFT 623, and thus, the boost voltage is also dropped lower by the threshold voltage for the setting/resetting TFT 623.

In this way, the DEMUX circuits 510, 610, and 610A in Comparison Examples 1, 2 and 3 have problems that the boost voltage is dropped lower by the threshold voltage for the setting TFT 524 or the setting/resetting TFT 623. An oxide semiconductor TFT has a characteristic that the threshold voltage is likely to vary due to a voltage stress, if an oxide semiconductor TFT is used as the setting TFT 524 or the setting/resetting TFT 623, varying in the threshold voltage causes varying in the boost voltage to vary. For this reason, in a case where characteristic degradation in the oxide semiconductor TFT progresses to increase the threshold voltage, the boost voltage is further dropped.

DEMUX Circuit of Embodiment of Disclosure

Figure 17:
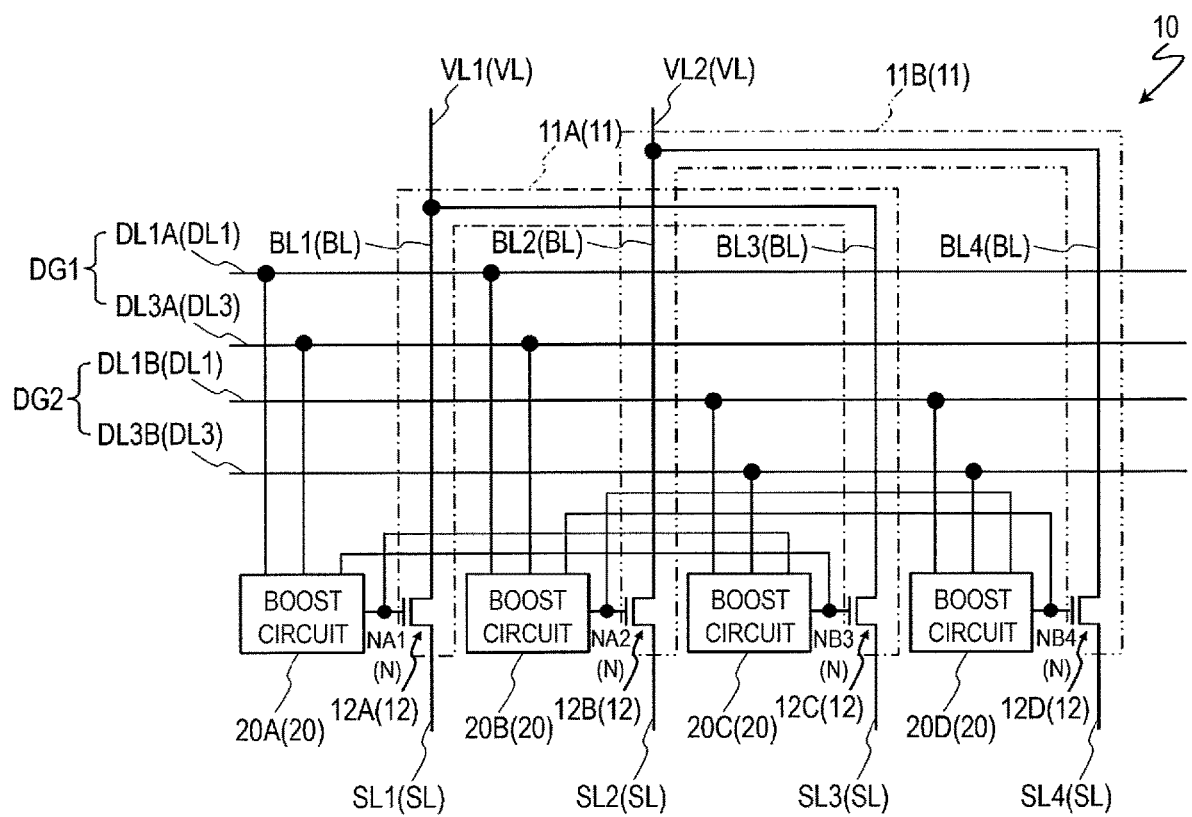
FIG. 17 is a diagram illustrating an example of a configuration of a DEMUX circuit 10 included in the active matrix substrate 100.

With reference to FIG. 17, a description is given of a DEMUX circuit 10 included in the active matrix substrate 100 according to the present embodiment. FIG. 17 is a diagram illustrating an example of a configuration of the DEMUX circuit 10.

As illustrated in FIG. 17, the DEMUX circuit 10 includes a plurality of unit circuits 11 supported by the substrate 1. Each of the plurality of unit circuits 11 distributes a display signal from one signal output line VL into n source bus lines SL (n is an integer equal to or more than 2). FIG. 17 illustrates a case of n=2, in other words, a case that each unit circuit 11 distributes the display signal from one signal output line VL into two source bus lines SL. FIG. 17 illustrates two unit circuits 11. A unit circuit 11A (a first unit circuit) that is one of the two unit circuits 11 distributes a display signal from a signal output line VL1 into source bus lines SL1 and SL3, and a unit circuit 11B (a second unit circuit) that is the other distributes a display signal from a signal output line VL2 into source bus lines SL2 and SL4.

Each unit circuit 11 includes n (two, in this case) branch wiring lines BL and n (two, in this case) switching TFTs 12.

The two branch wiring lines BL of each unit circuit 11 are connected to one signal output line VL. The two switching TFTs 12 in each unit circuit 11 are connected to the two branch wiring lines BL, respectively. The two switching TFTs 12 individually (independently) performs on/off control of electrical connection between two branch wiring lines BL and two source bus lines SL. In the present embodiment, each of two switching TFTs 12 includes an oxide semiconductor layer as an active layer (i.e., an oxide semiconductor TFT).

A switching TFT 12A that is one of the two switching TFTs 12A and 12C in the first unit circuit 11A performs on/off control of the electrical connection between a branch wiring line BL1 and a source bus line SL1, and a switching TFT 12C that is the other performs on/off control of the electrical connection between a branch wiring line BL3 and a source bus line SL3. A source electrode and a drain electrode of the former switching TFT 12A are connected to the branch wiring line BL1 and the source bus line SL1, respectively, and a source electrode and a drain electrode of the latter switching TFT 12C are connected to the branch wiring line BL3 and the source bus line SL3, respectively.

A switching TFT 12B that is one of the two switching TFTs 12B and 12D in the second unit circuit 11B performs on/off control of the electrical connection between a branch wiring line BL2 and a source bus line SL2, and a switching TFT 12D that is the other performs on/off control of the electrical connection between a branch wiring line BL4 and a source bus line SL4. A source electrode and a drain electrode of the former switching TFT 12B are connected to the branch wiring line BL2 and the source bus line SL2, respectively, and a source electrode and a drain electrode of the latter switching TFT 12D are connected to the branch wiring line BL4 and the source bus line SL4, respectively.

The DEMUX circuit 10 according to the present embodiment further includes a plurality of boost circuits 20 each of which can boost a voltage applied to the gate electrode of each of n (two in this case) switching TFTs 12 in each unit circuit 11 as illustrated in FIG. 17. In the example illustrated in FIG. 17, one boost circuit 20 is connected to each switching TFT 12. Specifically, the gate electrodes of the switching TFTs 12A, 12B, 12C, and 12D are connected to output sides of boost circuits 20A, 20B, 20C, and 20D, respectively.

In the example illustrated in FIG. 17, each boost circuit 20 is driven by a drive signal group supplied from a first drive signal line DL1, and a further third drive signal line DL3. The drive signal line DL1 and the further drive signal line DL3 correspond to the first drive signal line DL1 and the third drive signal line DL3 in the DEMUX circuits 510, 610, and 610A in Comparison Examples 1, 2, and 3, respectively, and therefore, in the following descriptions, the drive signal line DL1 and the further drive signal line DL3 in the DEMUX circuit 10 may be referred to as a "first drive signal line" and a "third drive signal line", respectively, for the purpose of easy understanding. The drive signal supplied by the drive signal line DL1 and the drive signal supplied by the further drive signal line DL3 may be referred to as a "first drive signal" and a "third drive signal", respectively.

As illustrated in FIG. 17, each boost circuit 20 is also connected to a node N boosted by another boost circuit 20 (that is a boost circuit 20 performing the boost action at a different timing as describe later). In the example illustrated in FIG. 17, the boost circuit 20A is connected not only to a node NA1 connected to a gate electrode of the switching TFT 12A, but also to a node NB3 boosted by the boost circuit 20C, and the boost circuit 20B is connected not only to a node NA2 connected to a gate electrode of the switching TFT 12B, but also to a node NB4 boosted by the boost circuit 20D. The boost circuit 20C is connected not only to the node NB3 connected to a gate electrode of the switching TFT 12C, but also to the node NA1 boosted by the boost circuit 20A, and the boost circuit 20D is connected not only to the node NB4 connected to a gate electrode of the switching TFT 12D, but also to the node NA2 boosted by the boost circuit 20B. Hereinafter, in focusing on a certain boost circuit 20, a node N boosted by the boost circuit 20 is referred to as "own node" and a node N boosted by another boost circuit 20 at a different timing is referred to as "another node".

In this way, each boost circuit 20 is connected not only to the own node but also to another node, and inputs a potential of another node as a so-called drive signal. In other words, the DEMUX circuit 10 according to the present embodiment is different from the DEMUX circuit 610 in Comparison Example 2 in that the potential of another node, in place of the second drive signal (supplied from the second drive signal line DL2), is input to each boost circuit 20. As described later in detail, each boost circuit 20 performs boosting the voltage such that a drive amplitude of a gate potential of the switching TFT 12 increases corresponding to amplitudes of the first drive signal and the third drive signal, and an amplitude of the potential of another node.

In the example illustrated in FIG. 17, two systems of drive signal line groups DG1 and DG2 are provided. The boost circuits 20A and 20B are driven by a first drive signal line DL1A and a third drive signal line DL3A in the drive signal line group DG1 that is one of the drive signal line groups DG1 and DG2. The boost circuits 20C and 20D are driven by a first drive signal line DL1B and a third drive signal line DL3B in the drive signal line group DG2 that is the other of the drive signal line groups DG1 and DG2.

As described above, in the active matrix substrate 100 according to the present embodiment, since the DEMUX circuit 10 includes the boost circuit 20 which can boost the voltage applied to the gate electrode of the switching TFT 12, an effective drive voltage of the DEMUX circuit 10 can be increased. Therefore, since the DEMUX circuit 10 can be driven by a drive signal of a relatively small amplitude, power consumption due to charging and discharging of the drive signal can be reduced. A voltage (drive voltage) applied to the gate electrode of the switching TFT 12 can be increased by the boost circuit 20, and therefore, a resistance (on-resistance) of the switching TFT 12 in the selection can be lowered to heighten a charging capability. Furthermore, the drive voltage can be increased, and therefore, a size of the switching TFT 12 can also be reduced. For this reason, a layout size of the DEMUX circuit 10 can be reduced, and narrowing of the peripheral region FR (frame narrowing) can be attained. In this way, according to the embodiments of the disclosure, both the reduction in the drive power for the active matrix substrate provided with the DEMUX circuit and the frame narrowing can be achieved.

Figure 18:
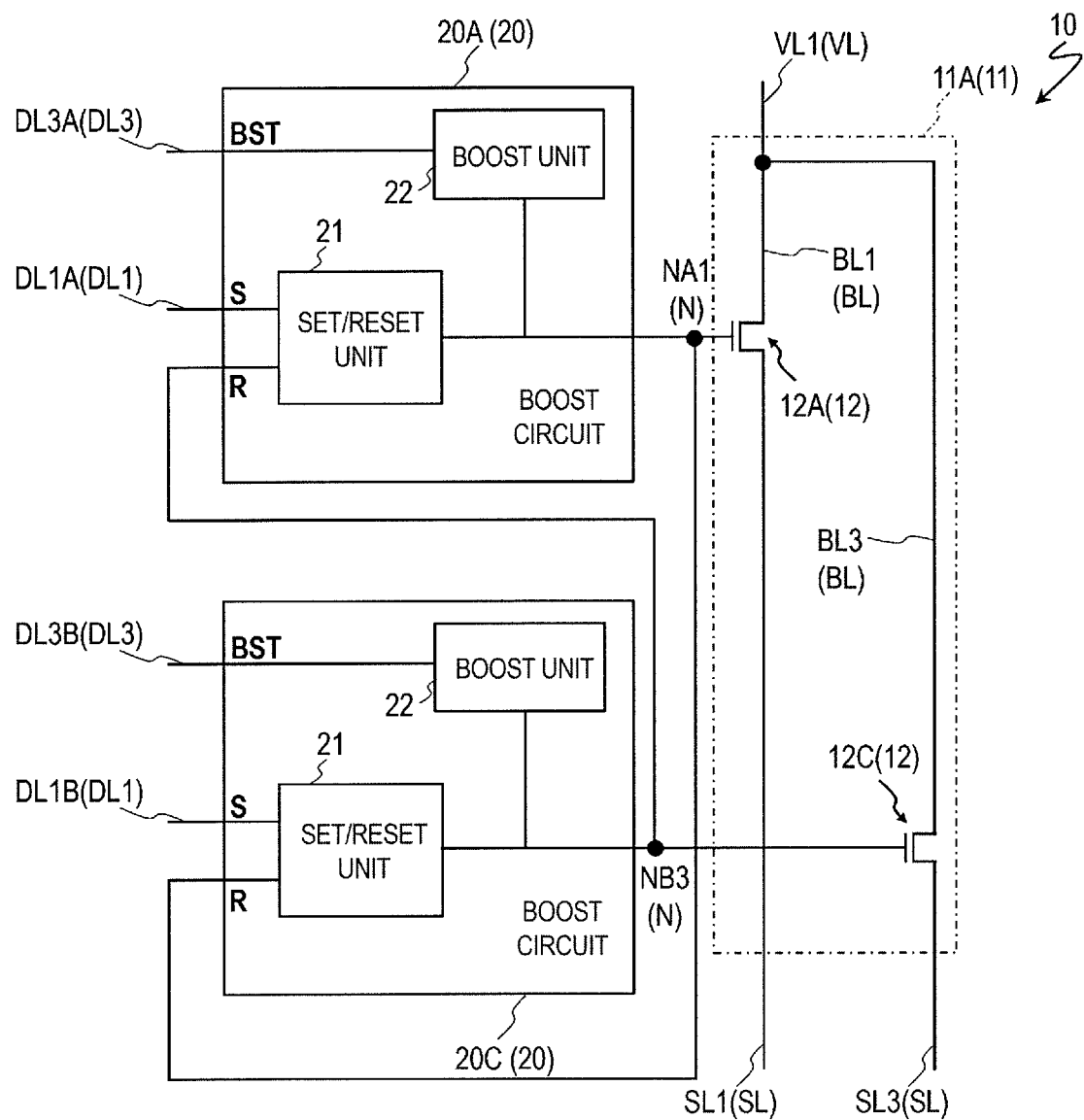
FIG. 18 is a diagram illustrating an example of a configuration of a boost circuit 20 included in the DEMUX circuit 10.

Subsequently, with reference to FIG. 18, a specific configuration of the boost circuit 20 is described. FIG. 18 is a diagram illustrating an example of a configuration of the boost circuit 20. FIG. 18 illustrates boost circuits (a first boost circuit and a second boost circuit) 20A and 20C connected to two switching TFTs (a first switching TFT and a second switching TFT) 12A and 12C included in the unit circuit 11A in the DEMUX circuit 10. The first switching TFT 12A and the second switching TFT 12C are turned to the on state at timings different from each other within one horizontal scan period.

In the example illustrated in FIG. 18, the boost circuit 20 includes a set/reset unit 21 and a boost unit 22. The set/reset unit 21 and the boost unit 22 are connected to a node N connected to the gate electrode of the switching TFT 12. The set/reset unit 21 is connected to the first drive signal line DL1, and the boost unit 22 is connected to the third drive signal line DL3.

The set/reset unit 21 is supplied with the first drive signal (set signal S) from the first drive signal line DL1 to perform an action to precharge the node N (set action). The set signal S is a signal whose level is changed at least at the start of the set action.

The boost unit 22 is supplied with the third drive signal (boost signal BST) from the third drive signal line DL3 to perform an action to boost the potential of the node N precharged due to the set action by the set/reset unit 21 (boost action). The boost signal BST is a signal whose level is changed at least at the start of the boost action.

The set/reset unit 21 is supplied with the potential of another node as a reset signal R to perform an action to reset the potential of the node N (reset action). The reset signal R is a signal whose level is not changed at the start of the set action and is different from a level of the set signal S in the reset action. As illustrated in FIG. 18, the set/reset unit 21 in the first boost circuit 20A is connected to a node NB3 boosted by the second boost circuit 20C, and inputs a potential of the node NB3 as a reset signal R. The set/reset unit 21 in the second boost circuit 20C is connected to a node NA1 boosted by the first boost circuit 20A, and inputs a potential of the node NA1 as a reset signal R. The set action and reset action by the set/reset unit 21 are performed at timings different from each other.

Figure 19:
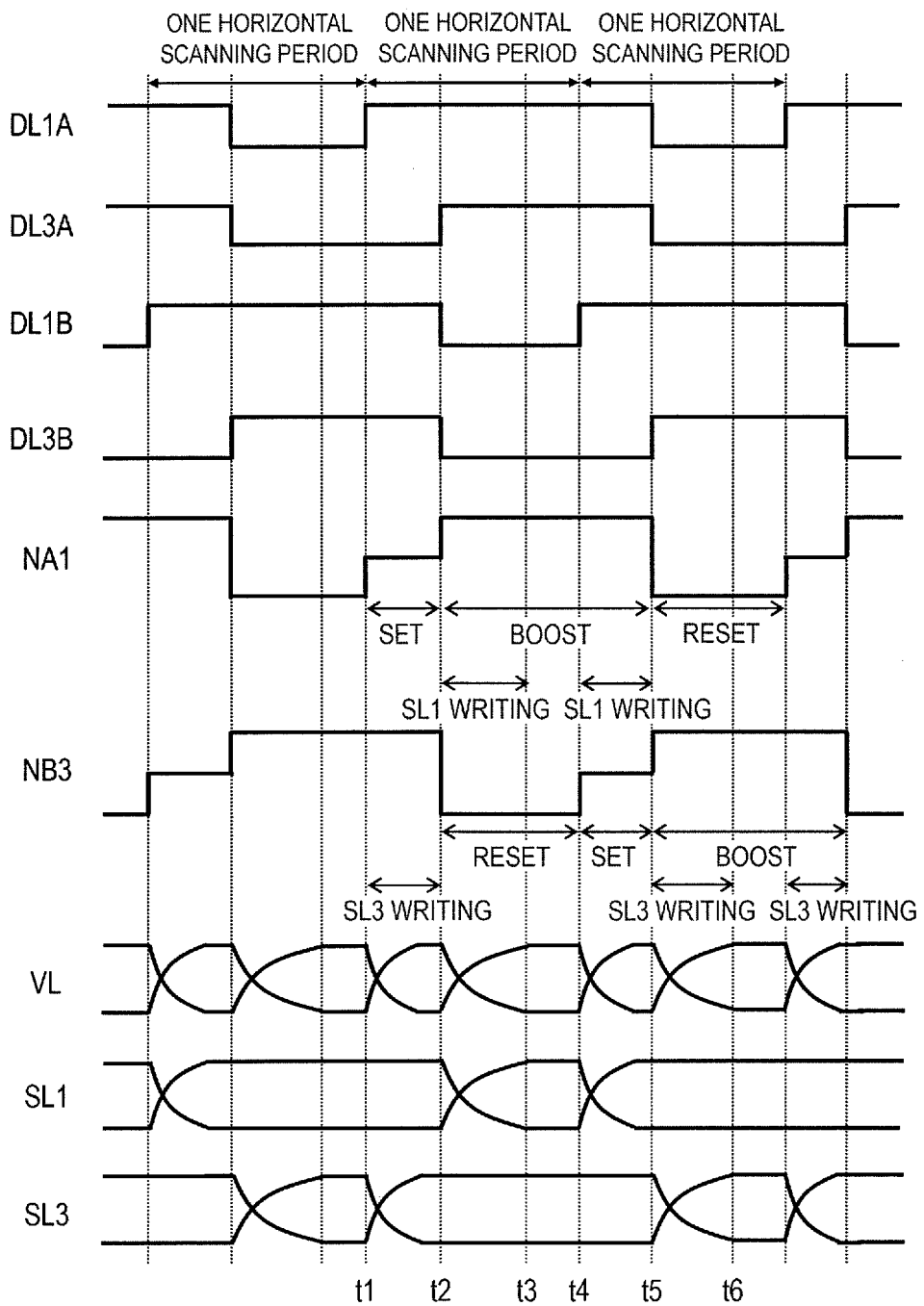
FIG. 19 is a timing chart for describing actions of the DEMUX circuit 10.

Here, actions of the boost circuit 20 (DEMUX circuit 10) are described also with reference to FIG. 19. FIG. 19 is a timing chart for describing actions of the DEMUX circuit 10. FIG. 19 illustrates potentials of the first drive signal lines DL1A and DL1B, the third drive signal lines DL3A and DL3B, the nodes NA1 and NB3, the signal output line VL, and the source bus lines SL1 and SL3.

Time Point t1

Side on the first switching TFT 12A: The potential of the first drive signal line DL1A becomes the high level. At this time, the potential of another node (node NB3) remains at the high level from the previous horizontal scan period, and the first drive signal as a set signal S is input to the set/reset unit 21. This allows the node NA1 connected to the gate electrode of the first switching TFT 12A to be precharged (set action).

Side on the second switching TFT 12C: The node NB3 connected to the gate electrode of the second switching TFT 12C holds the voltage boosted during the previous horizontal scan period, and therefore, the source bus line SL3 is charged to the write voltage level of the signal output line VL.

Time Point t2

Side on the first switching TFT 12A: The potential of the third drive signal line DL3A becomes the high level, and the third drive signal as a boost signal BST is input to the boost unit 22. This allows the potential of the node NA1 to be boosted (boost action). The potential of the node NA1 being boosted allows the source bus line SL1 to be sufficiently charged through the switching TFT 12A.

Side on the second switching TFT 12C: The potential of the first drive signal line DL1B and the potential of the third drive signal line DL3B become the low level, the potential of another node (node NA1) as a reset signal R is input to the set/reset unit 21. This allows the potential of the node NB3 to be reset (reset action).

Time Point t3

In a state that each of the source bus lines SL1 and SL3 is charged with the write voltage, the gate signal supplied from the gate bus line GLn becomes the off-level, and the writing of the display voltage is completed.

Time Point t4

Side on the first switching TFT 12A: The node NA1 connected to the gate electrode of the first switching TFT 12A holds the voltage boosted during the previous horizontal scan period, and therefore, the source bus line SL1 is charged to the write voltage level of the signal output line VL.

Side on the second switching TFT 12C: The potential of the first drive signal line DL1B becomes the high level. At this time, the potential of the node NA1 remains at the high level from the previous horizontal scan period, and the first drive signal as a set signal S is input to the set/reset unit 21. This allows the node NB3 connected to the gate electrode of the second switching TFT 12C to be precharged (set action).
Time Point t5

Side on the first switching TFT 12A: The potential of the first drive signal line DL1A and the potential of the third drive signal line DL3A become the low level, the potential of another node (node VB3) as a reset signal R is input to the set/reset unit 21. This allows the potential of the node NA1 to be reset (reset action).

Side on the second switching TFT 12C: The potential of the third drive signal line DL3B becomes the high level, and the third drive signal as a boost signal BST is input to the boost unit 22. This allows the potential of the node NB3 to be boosted (boost action). The potential of the node NB3 being boosted allows the source bus line SL3 to be sufficiently charged through the switching TFT 12C.
Time Point t6

In a state that each of the source bus lines SL1 and SL3 is charged with the write voltage, the gate signal supplied from the gate bus line GLn+1 becomes the off-level, and the writing of the display voltage is completed. After that, the actions described above are repeated to perform the writing for the all gate bus lines GL.

Figure 20:
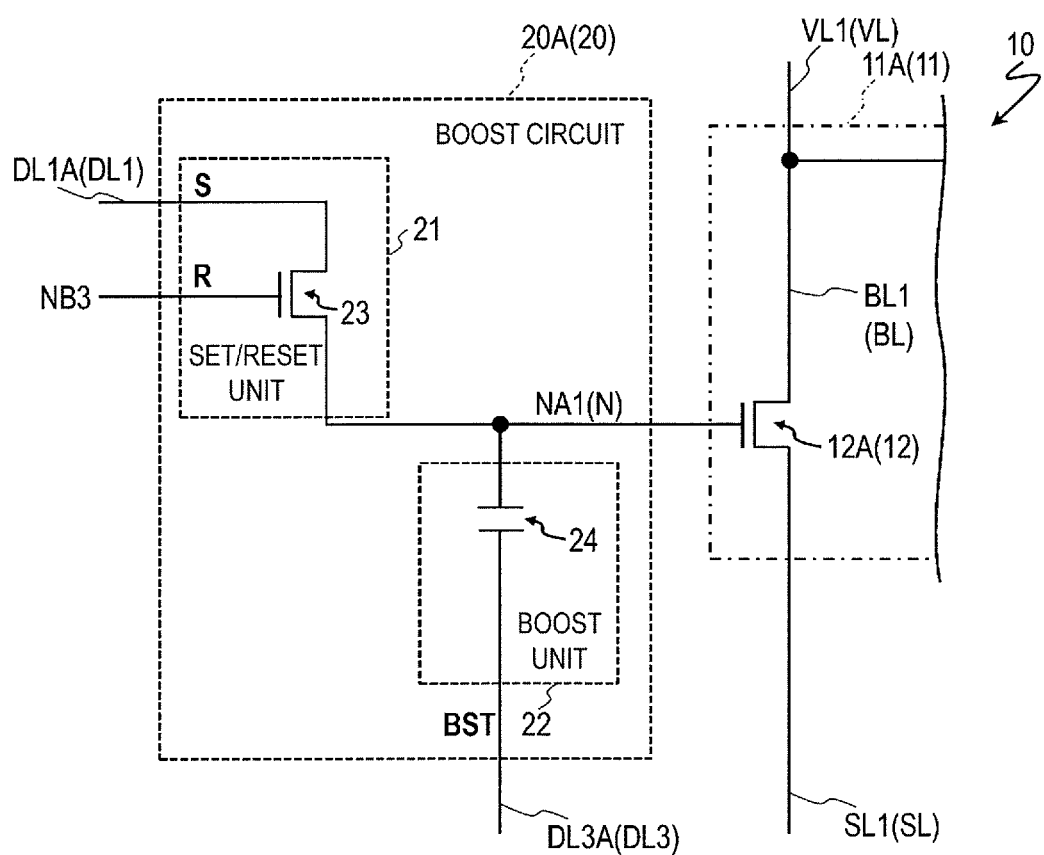
FIG. 20 is a diagram illustrating an example of a specific configuration of a set/reset unit 21 and a boost unit 22 included in the boost circuit 20.

With reference to FIG. 20, a more specific configuration of the boost circuit 20 is described. FIG. 20 is a diagram illustrating an example of a specific configuration of the set/reset unit 21 and the boost unit 22 in the boost circuit 20.

In the example illustrated in FIG. 20, the set/reset unit 21 includes a setting/resetting TFT 23. To be more specific, the set/reset unit 21 includes only the setting/resetting TFT 23 as a TFT. A drain electrode of the setting/resetting TFT 23 is connected to the first drive signal line DL1A, and a source electrode of the setting/resetting TFT 23 is connected to the node NA1. A gate electrode of the setting/resetting TFT 23 is connected to another node (node NB3).

The boost unit 22 includes a boost capacitance element 24. The boost capacitance element 24 includes an electrode (a first capacitance electrode) connected to a third drive signal line DL3A and an electrode (a second capacitance electrode) connected to the node NA1.

Figure 21:
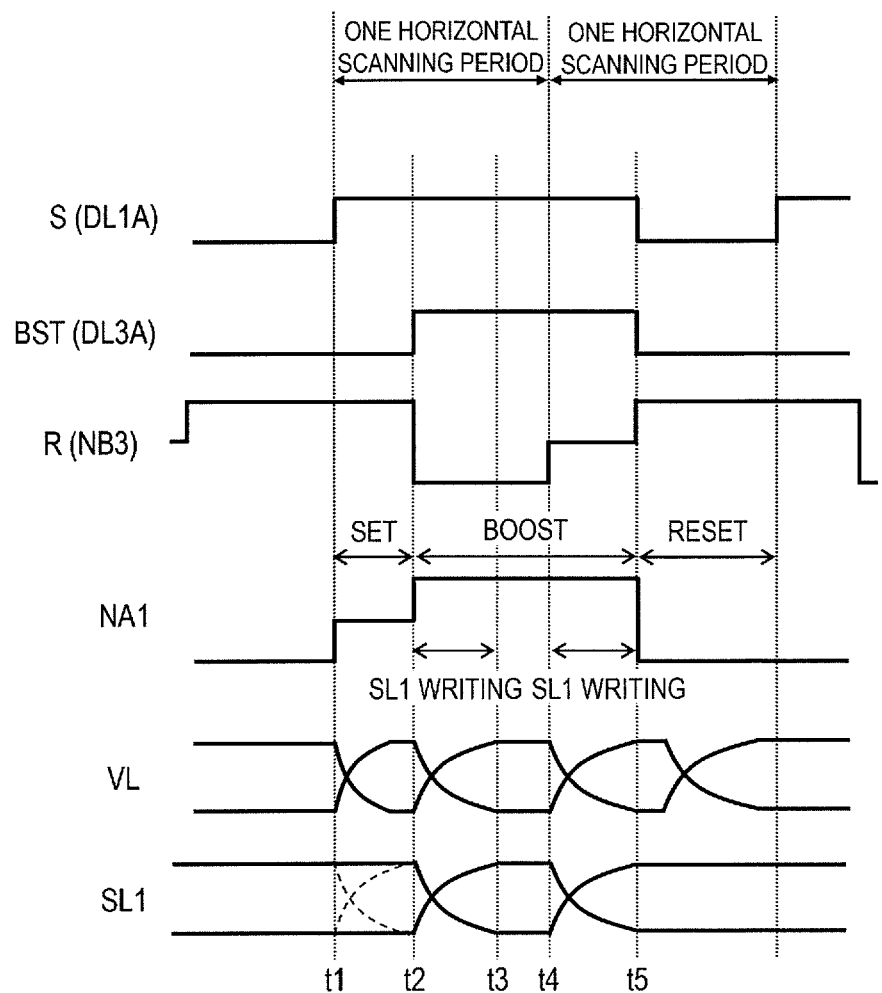
FIG. 21 is a timing chart for describing actions of the boost circuit 20.

With reference to FIG. 21, actions of boost circuit 20 illustrated in the FIG. 20 is described. FIG. 21 is a timing chart for describing the actions of the boost circuit 20. FIG. 21 illustrates potentials of the set signal S (the first drive signal line DL1A), the boost signal BST (the third drive signal line DL3A), the reset signal R (the node NB3), the node NA1, the signal output line VL, and the source bus line SL1. In the following descriptions, the high level and the low level of the potentials of the set signal S and boost signal BST are expressed as "VDH" and "VDL", respectively. For example, VDH is 10 V, and VDL is −10 V.

First, at a time point t1, when the set signal S changes from the low level to the high level while the reset signal R (the potential of the node NB3) remains at the high level, the setting/resetting TFT 23 turns to the on state and the node NA1 is precharged. At this time, a potential Vg of the gate electrode of the setting/resetting TFT 23 is higher than a potential Vd of the drain electrode (Vg>>Vd). Specifically, assuming that a signal voltage supplied to the drain electrode from the drive signal line when the set action is performed is a first signal voltage V1, a second signal voltage V2 higher than the first signal voltage V1 is supplied to the gate electrode. For this reason, the node NA1 can be precharged to the high level potential VDH of the set signal S. Specifically, voltage drop due to an influence of the threshold voltage Vth of the setting/resetting TFT 23 can be prevented from occurring.

Next, at a time point t2, when the boost signal BST changes from the low level to the high level (at this time, the reset signal R is the low level), the potential of the node NA1 is boosted. A degree of the boost varies depending on a ratio of a total Cn1 of a load capacitance of the node NA1 (a total load capacitance) to a capacitance value Cbst of the boost capacitance element 24. Specifically, the potential of a boosted differential is obtained by multiplying an amplitude of the boost signal BST (=VDH−VDL) by (Cbst/Cn1). Therefore, for example, in a case where the total load capacity Cn1 of the node NA1 is 0.2 pF and the capacitance value Cbst of the boost capacitance element 24 is 0.1 pF, the potential of the node NA1 is boosted from VDH to VDH+(VDH−VDL)·(0.1/0.2). In a case where VDH=10 V, VDL=−10 V, and Vth=2 V, the node NA1 is boosted to 20 V.

Subsequently, at a time point t3, in a state that the potential of the node NA1 is boosted, the gate signal supplied from the gate bus line GL becomes the off-level, and the writing is completed.

Next, at a time point t4, the node NA1 holds the voltage boosted during the previous horizontal scan period, and therefore, the source bus line SL1 is charged again.

After that, at a time point t5, when each of the set signal S and the boost signal BST changes to the low level and the reset signal R becomes the high level, the potential of the node NA1 is reset (pulled down).

Figure 22A:
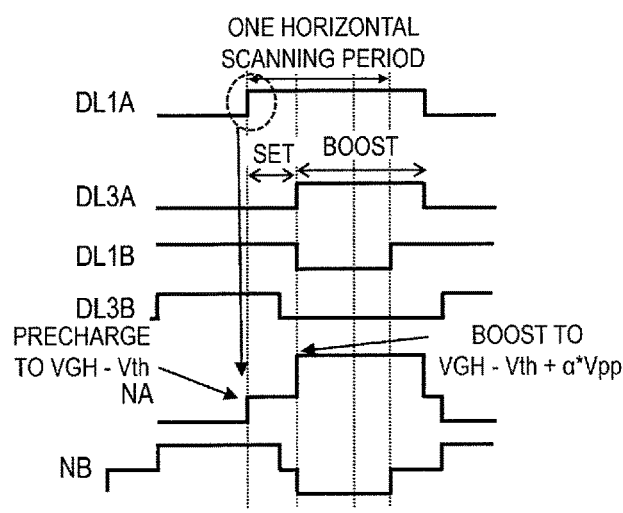
FIGS. 22A and 22B are timing charts illustrating time changes of potentials in the DEMUX circuit 610A in Comparison Example 3 and the DEMUX circuit 10 in the first embodiment, respectively.
Figure 22B:
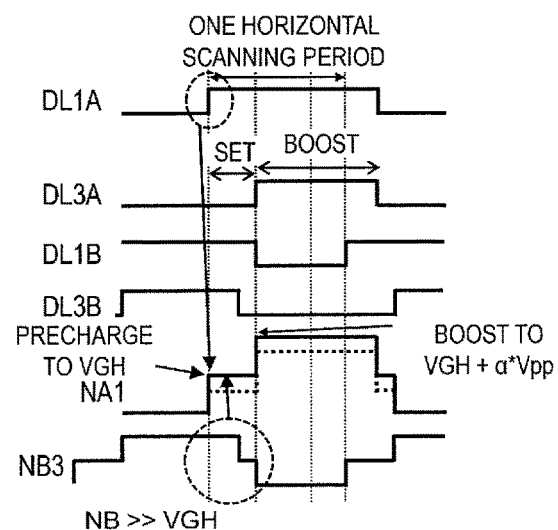

FIGS. 22A and 22B illustrate time changes (timing charts) of potentials in the DEMUX circuit 610A of Comparison Example 3 and the DEMUX circuit 10 of the present embodiment, in a comparison manner. Here, a power supply voltage of the high level is expressed as VGH, a pushing up efficiency is expressed as a, and an amplitude of the third drive signal (a signal voltage supplied to the boost unit) is expressed as Vpp.

In the DEMUX circuit 610A in Comparison Example 3, as illustrated in FIG. 22A, the potential of the node NA is precharged to VGH−Vth when being set, and boosted to VGH−Vth+α·Vpp when being boosted.

In contrast, in the DEMUX circuit 10 in the present example, as illustrated in FIG. 22B, the potential of the node NA1 is precharged to VGH when being set, and boosted to VGH+α·Vpp when being boosted.

As described above, in the DEMUX circuit 10 in the present embodiment, when the set action is performed, the signal voltage (the second signal voltage V2) supplied to the gate electrode is higher than the signal voltage (the first signal voltage V1) supplied to the drain electrode of the setting/resetting TFT 23. This can prevent the voltage drop of the precharge voltage and the voltage drop of the boost voltage caused by the threshold voltage Vth of the setting/resetting TFT 23.

Therefore, in the DEMUX circuit 10 in the present embodiment, the effective drive voltage can be further increased compared with the DEMUX circuits 510, 610, and 610A in Comparison Examples 1, 2, and 3. Therefore, the resistance (on-resistance) of the switching TFT 12 in the selection can be lowered to further heighten the charging capability (in other words, further higher performance can be attained). Moreover, since drive voltage can be further increased, an operation margin can be improved to further reduce the size of the switching TFT 12. For this reason, the layout size of the DEMUX circuit 10 can be further reduced to attain the further frame narrowing. The load is decreased by an amount corresponding to such reduction, and therefore, the further power consumption reduction can be made. Furthermore, the boost voltage is not influenced by the threshold deterioration of the setting/resetting TFT 23 (the drive voltage reduction caused by the threshold deterioration does not occur), and thus reliability is improved.

In order to substantially eliminate the influence of the threshold voltage Vth of the setting/resetting TFT 23 on the precharge voltage or the boost voltage, the first signal voltage V1 supplied to the drain electrode of the setting/resetting TFT 23 and the second signal voltage V2 supplied to the gate electrode preferably satisfy a relationship V2−Vth>V1 when the set action is performed.

Second Embodiment

Figure 23:
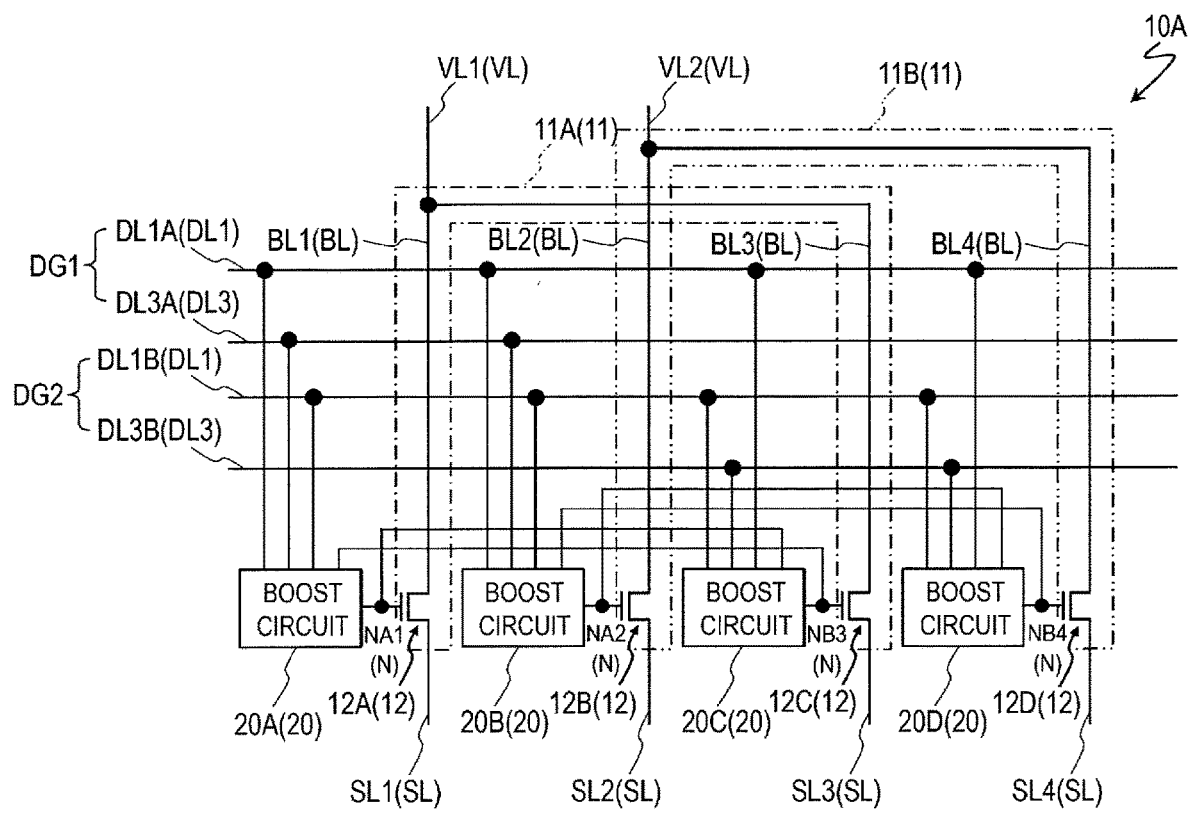
FIG. 23 is a diagram illustrating a configuration of a DEMUX circuit 10A included in an active matrix substrate according to a second embodiment.

With reference to FIG. 23, a description is given of a DEMUX circuit 10A included in an active matrix substrate according to the present embodiment. FIG. 23 is a diagram illustrating an example of a configuration of the DEMUX circuit 10A. Hereinafter, descriptions will mainly focus on differences between the DEMUX circuit 10A in the present embodiment and the DEMUX circuit 10 in the first embodiment.

In the DEMUX circuit 10 in the first embodiment, each boost circuit 20 is connected with two drive signal lines, as illustrated in FIG. 17. Specifically, each of the first boost circuits 20A and 20B is connected to the first drive signal line DL1A and the third drive signal line DL3A, and each of the second boost circuits 20C and 20D is connected to the first drive signal line DL1B and the third drive signal line DL3B.

In contrast, in the DEMUX circuit 10A in the present embodiment, each boost circuit 20 is connected with three drive signal lines. Specifically, each of first boost circuits 20A and 20B is connected to a first drive signal line DL1A and a third drive signal line DL3A for the first boost circuit, and additionally to a first drive signal line DL1B for a second boost circuit. Each of second boost circuits 20C and 20D is connected to a first drive signal line DL1B and a third drive signal line DL3B for the second boost circuit, and additionally to the first drive signal line DL1A for the first boost circuit.

In the DEMUX circuit 10A in the present embodiment, each boost circuit 20 boosts the voltage such that a drive amplitude of a gate potential of the switching TFT 12 increases corresponding to amplitudes of the drive signals supplied from three drive signal lines and an amplitude of the potential of another node.

Figure 24:
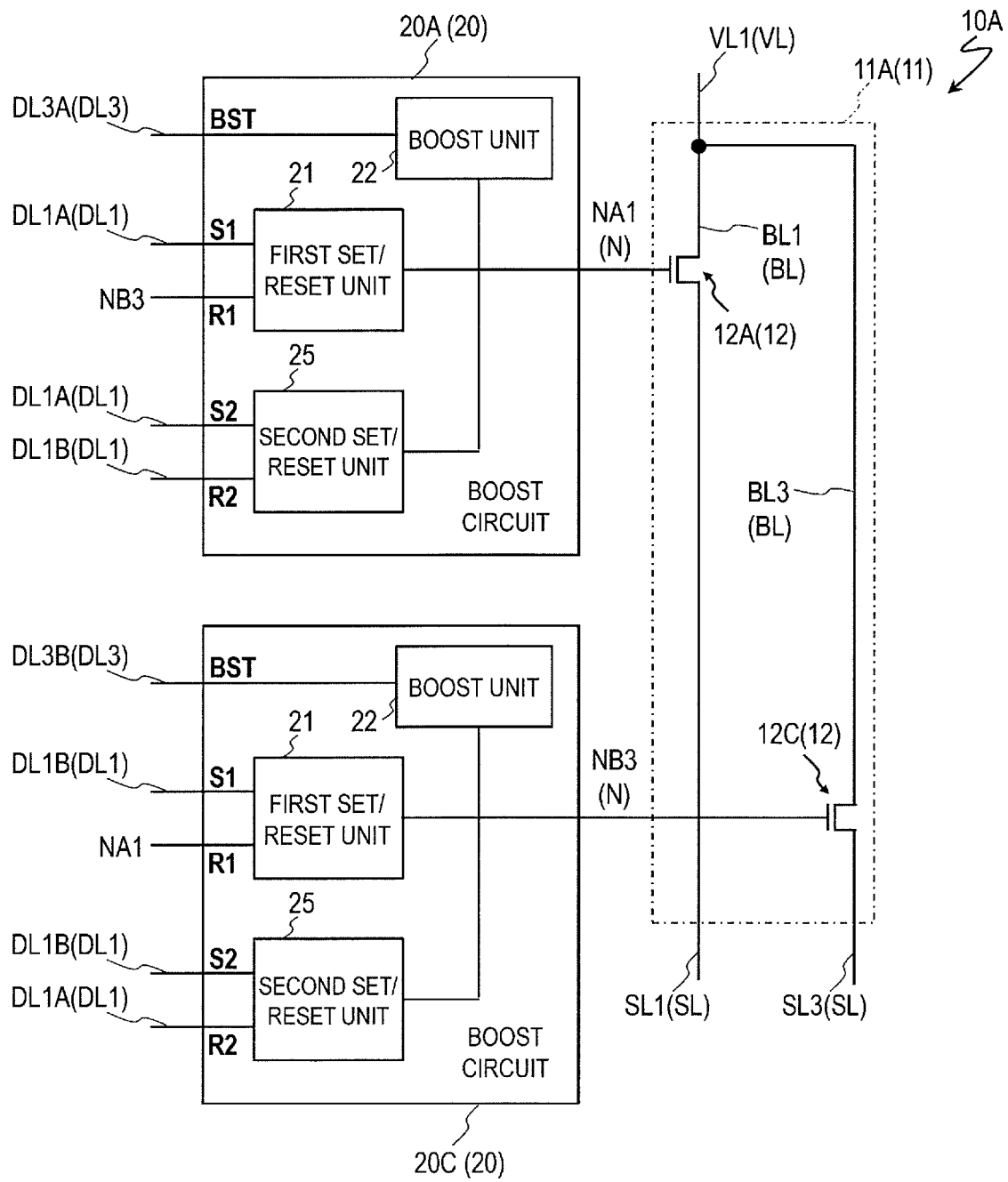
FIG. 24 is a diagram illustrating an example of a configuration of a boost circuit 20 included in the DEMUX circuit 10A.

Subsequently, with reference to FIG. 24, a specific configuration of each boost circuit 20 in the DEMUX circuit 10A is described. FIG. 24 is a diagram illustrating an example of a configuration of the boost circuit 20. FIG. 24 illustrates boost circuits (a first boost circuit and a second boost circuit) 20A and 20C connected to two switching TFTs (a first switching TFT and a second switching TFT) 12A and 12C included in a unit circuit 11A in the DEMUX circuit 10A.

In the example illustrated in FIG. 24, the boost circuit 20 includes a set/reset unit 21, a boost unit 22, and a further set/reset unit 25. Hereinafter the set/reset unit 21 is referred to as a "first set/reset unit", and the further set/reset unit 25 is referred to as a "second set/reset unit".

The second set/reset unit 25 is connected to an own node, similarly to the first set/reset unit 21, and performs the set action and the reset action. The second set/reset unit 25 performs the set action and the reset action at timings the same as the first set/reset unit 21.

A set signal S1 input to the first set/reset unit 21 is the same as a set signal S2 input to the second set/reset unit 25. In other words, the first set/reset unit 21 and the second set/reset unit 25 are connected to the same first drive signal line DL1. As illustrated in FIG. 24, the first set/reset unit 21 and the second set/reset unit 25 in the first boost circuit 20A are connected to the same first drive signal line DL1A, and the first set/reset unit 21 and the second set/reset unit 25 in the second boost circuit 20C are connected to the same first drive signal line DL1B.

In contrast, a reset signal R1 input to the first set/reset unit 21 is different from a reset signal R2 input to the second set/reset unit 25 as described below.

To the first set/reset unit 21, a potential of another node as a reset signal R1 is input. As illustrated in FIG. 24, the first set/reset unit 21 in the first boost circuit 20A is connected to a node NB3 boosted by the second boost circuit 20C, and the first set/reset unit 21 in the second boost circuit 20C is connected to a node NA1 boosted by the first boost circuit 20A.

On the other hand, input to the second set/reset unit 25 is a signal voltage (a first drive signal) of the first drive signal line DL1 for the boost circuit 20 boosting another node as a reset signal R2. As illustrated in FIG. 24, the second set/reset unit 25 in the first boost circuit 20A is connected to the first drive signal line DL1B for the second boost circuit 20C, and the second set/reset unit 25 in the second boost circuit 20C is connected to the first drive signal line DL1A for the first boost circuit 20A.

Figure 25:
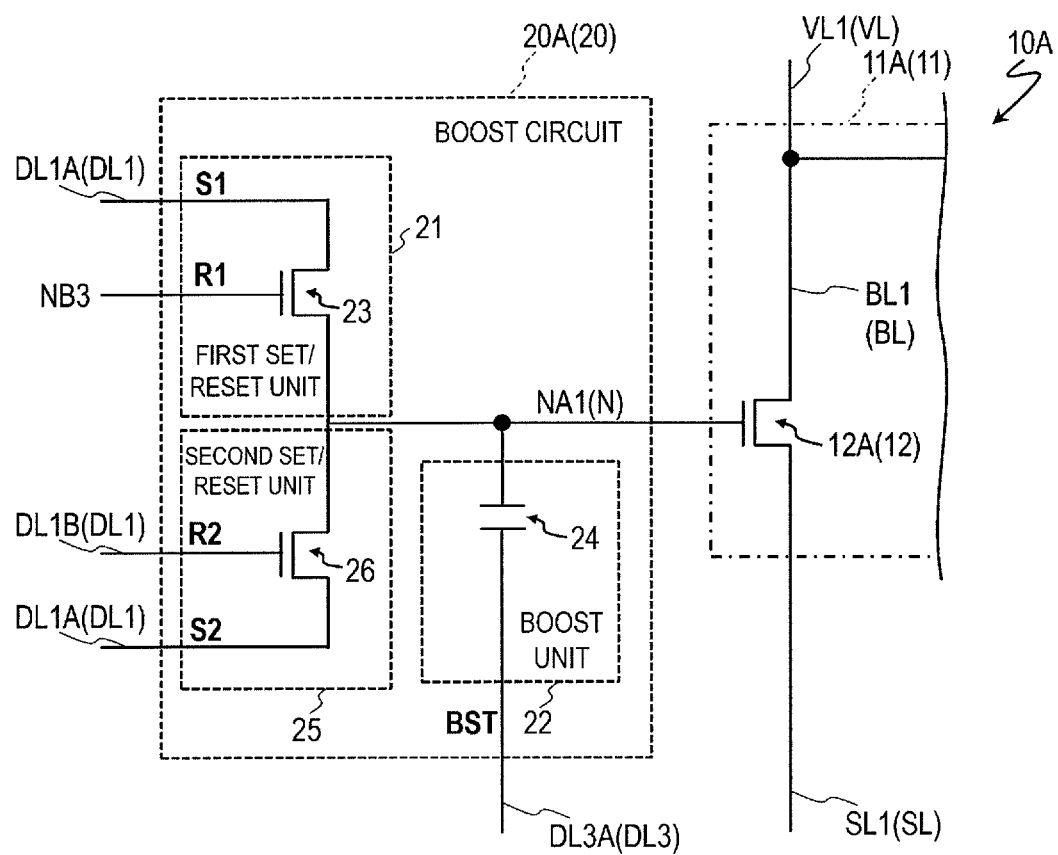
FIG. 25 is a diagram illustrating an example of a specific configuration of a first set/reset unit 21, a second set/reset unit 25 and a boost unit 22 included in the boost circuit 20 in the DEMUX circuit 10A.

FIG. 25 illustrates a more specific configuration of the boost circuit 20. FIG. 25 is a diagram illustrating an example of a specific configuration of the first set/reset unit 21, the second set/reset unit 25 and the boost unit 22 included in the boost circuit 20.

In the example illustrated in FIG. 25, the first set/reset unit 21 includes a setting/resetting TFT (hereinafter, referred to as a "first setting/resetting TFT") 23. A drain electrode of the first setting/resetting TFT 23 is connected to the first drive signal line DL1A, and a source electrode of the first setting/resetting TFT 23 is connected to the node NA1. A gate electrode of the first setting/resetting TFT 23 is connected to another node (node NB3).

The second set/reset unit 25 includes a further setting/resetting TFT (hereinafter, referred to as a "second setting/resetting TFT") 26. A drain electrode of the second setting/resetting TFT 26 is connected to the first drive signal line DL1A, and a source electrode of the second setting/resetting TFT 26 is connected to the node NA1. A gate electrode of the second setting/resetting TFT 26 is connected to the first drive signal line DL1B for the boost circuit 20C for boosting another node (node NB3).

The boost unit 22 includes a boost capacitance element 24. The boost capacitance element 24 includes an electrode (a first capacitance electrode) connected to a third drive signal line DL3A and an electrode (a second capacitance electrode) connected to the node NA1.

In the DEMUX circuit 10A in the present embodiment, since the boost circuit 20 includes the first set/reset unit 21 and additionally the second set/reset unit (the further set/reset unit) 25, the set action and the reset action can be made to have redundancy, further improving the reliability. The potential of another node input as a reset signal R1 to the first setting/resetting TFT 23 can be said to be a signal voltage generated within the boost circuit 20, and signal dulling or signal delay may be probably generated due to circuit deterioration and the like. For this reason, the first setting/resetting TFT 23 may possibly be influenced by such signal dulling or signal delay. In contrast, the drive signal input as a reset signal R2 to the second setting/resetting TFT 26 is supplied from the first drive signal line DL1 and can be said to be external input, and thus dulling or delay of the input signal is unlikely to be generated and the reliable action can be made.

Third Embodiment

Figure 26:
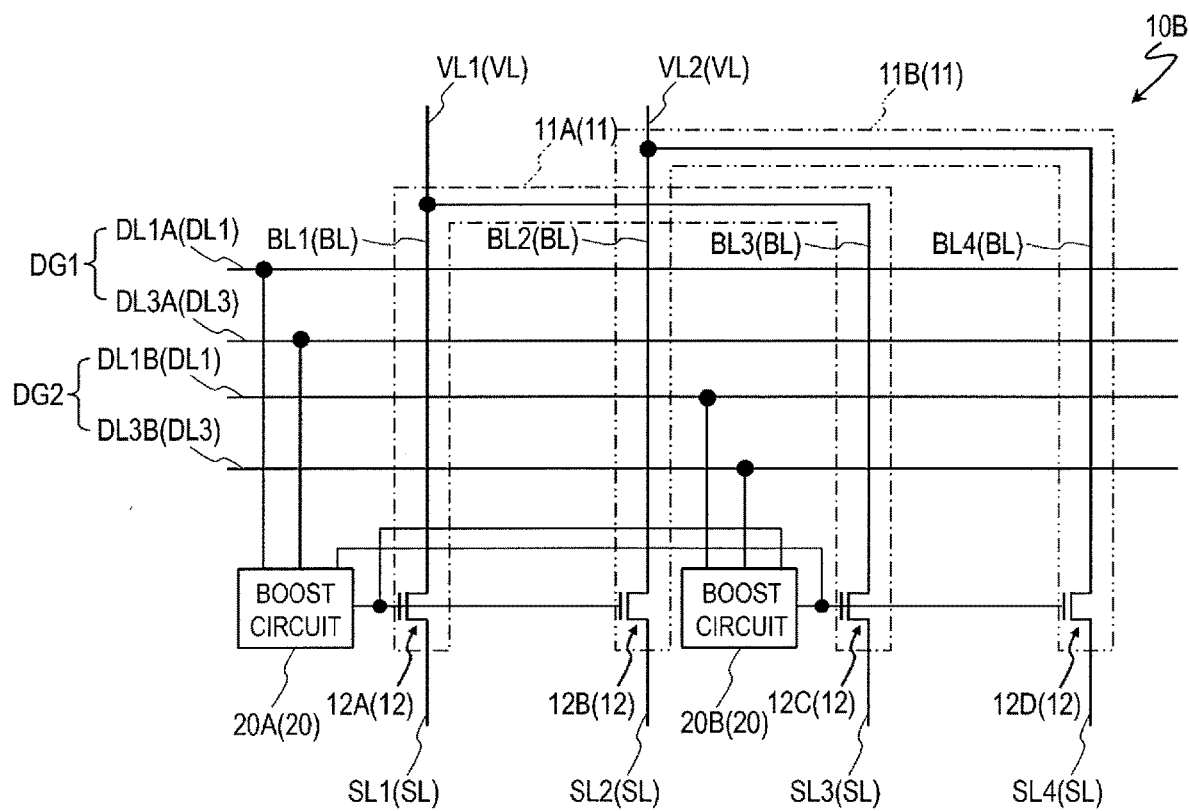
FIG. 26 is a diagram illustrating a configuration of a DEMUX circuit 10B included in an active matrix substrate according to a third embodiment.

With reference to FIG. 26, a description is given of an active matrix substrate according to the present embodiment. FIG. 26 is a diagram illustrating a configuration of a DEMUX circuit 10B included in the active matrix substrate according to the present embodiment.

In the DEMUX circuit 10 illustrated in FIG. 17, one boost circuit 20 is connected to each switching TFT 12. In contrast, in the DEMUX circuit 10B in the present embodiment, one boost circuit 20 is connected to two switching TFTs 12 as illustrated in FIG. 26. Hereinafter, a more detailed description is given.

Two switching TFTs 12 included in a first unit circuit 11A are a first switching TFT 12A and a second switching TFT 12C which are turned to the on state at timings different from each other within one horizontal scan period. Similarly, two switching TFTs 12 included in a second unit circuit 11B are a first switching TFT 12B and a second switching TFT 12D which are turned to the on state at timings different from each other within one horizontal scan period.

A boost circuit 20A that is one of two boost circuits 20A and 20B illustrated in FIG. 26 is connected in common to the first switching TFT 12A in the first unit circuit 11A and the first switching TFT 12B in the second unit circuit 11B. The other boost circuit 20B is connected in common to the second switching TFT 12C in the first unit circuit 11A and the second switching TFT 12D in the second unit circuit 11B.

In this way, in the present embodiment, one boost circuit 20 is shared by two switching TFTs 12 selected at the same time. Therefore, the number of circuit elements can be decreased. The decrease in the number of circuit elements allows the load to be decreased, and therefore, the further power consumption reduction can be attained. Furthermore, the decrease in the number of circuit elements allows a circuit area to be decreased, and therefore, the layout size can be reduced to attain the further frame narrowing.

Fourth Embodiment

Figure 27:
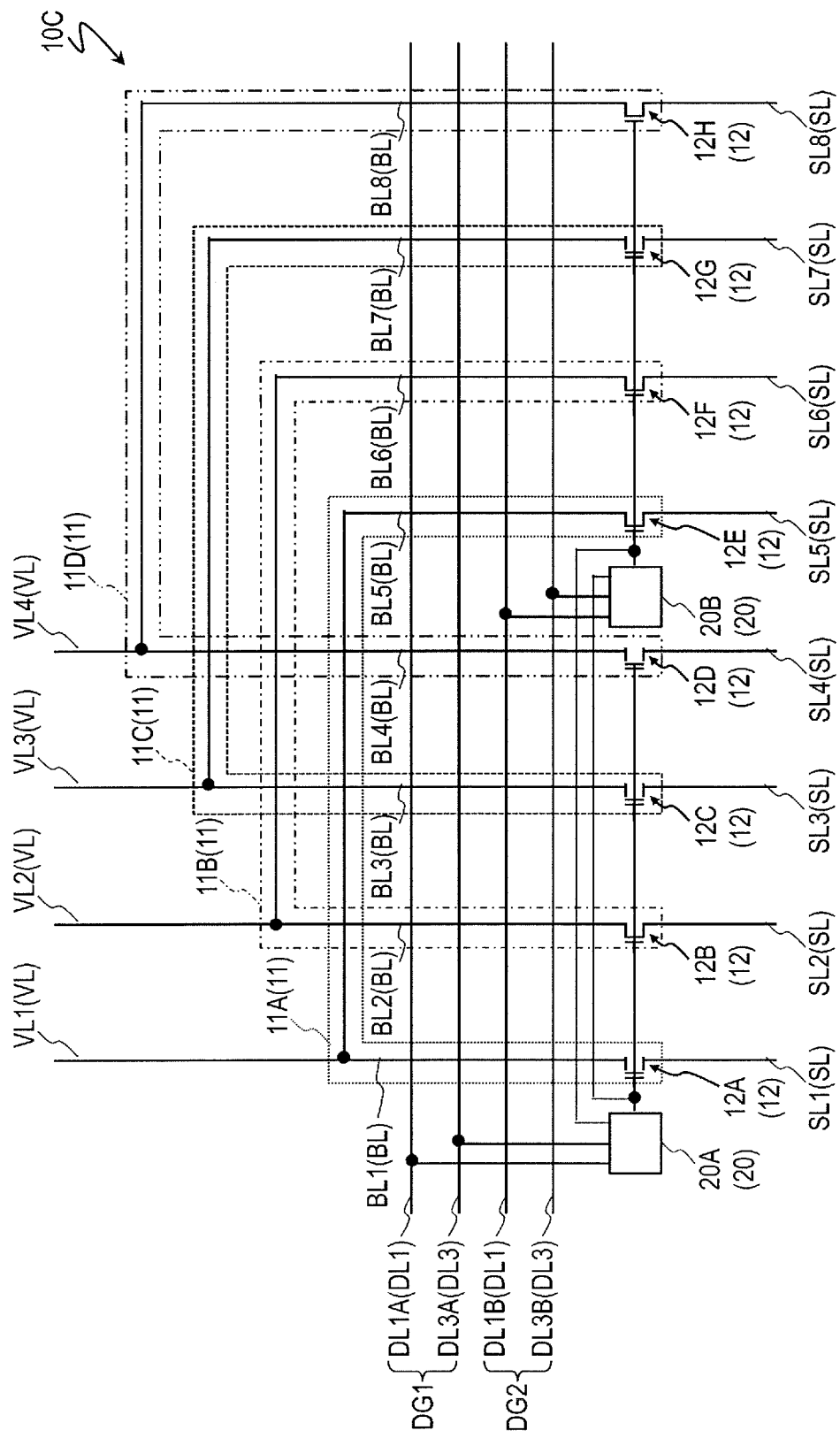
FIG. 27 is a diagram illustrating a configuration of a DEMUX circuit 10C included in an active matrix substrate according to a fourth embodiment.

Two switching TFTs 12 share one boost circuit 20 in the DEMUX circuit 10B in the third embodiment, but three or more switching TFTs 12 may share one boost circuit 20. Hereinafter, with reference to FIG. 27, a description is given of an active matrix substrate according to the present embodiment. FIG. 27 is a diagram illustrating a configuration of a DEMUX circuit 10C included in the active matrix substrate according to the present embodiment.

FIG. 27 illustrates four unit circuits 11A, 11B, 11C, and 11D (hereinafter, referred to as a "first unit circuit", a "second unit circuit", a "third unit circuit", and a "fourth unit circuit", respectively) among a plurality of unit circuits 11 included in the DEMUX circuit 10C.

The first unit circuit 11A includes two branch wiring lines BL1 and BL5, and two switching TFTs 12A and 12E, and distributes a display signal from a signal output line VL1 into source bus lines SL1 and SL5. The two switching TFTs (a first switching TFT and a second switching TFT) 12A and 12E in the first unit circuit 11A are turned to the on state at timings different from each other within one horizontal scan period.

The second unit circuit 11B includes two branch wiring lines BL2 and BL6 and two switching TFTs 12B and 12F, and distributes a display signal from a signal output line VL2 into source bus lines SL2 and SL6. The two switching TFTs (the first switching TFT and the second switching TFT) 12B and 12F in the second unit circuit 11B is turned to the on state at timings different from each other within one horizontal scan period.

The third unit circuit 11C includes two branch wiring lines BL3 and BL7 and two switching TFTs 12C and 12G, and distributes a display signal from a signal output line VL3 into source bus lines SL3 and SL7. The two switching TFTs (the first switching TFT and the second switching TFT) 12C and 12G in the third unit circuit 11C are turned to the on state at timings different from each other within one horizontal scan period.

The fourth unit circuit 11D includes two branch wiring lines BL4 and BL8 and two switching TFTs 12D and 12H, and distributes a display signal from a signal output line VL4 into source bus lines SL4 and SL8. The two switching TFTs (the first switching TFT and the second switching TFT) 12D and 12H in the fourth unit circuit 11D are turned to the on state at timings different from each other within one horizontal scan period.

The boost circuit 20A that is one of two boost circuits 20A and 20B illustrated in FIG. 27 is connected in common to the first switching TFT 12A in the first unit circuit 11A, the first switching TFT 12B in the second unit circuit 11B, the first switching TFT 12C in the third unit circuit 11C, and the first switching TFT 12D in the fourth unit circuit 11D. The other boost circuit 20B is connected in common to the second switching TFT 12E in the first unit circuit 11A, the second switching TFT 12F in the second unit circuit 11B, the second switching TFT 12G in the third unit circuit 11C, and the second switching TFT 12H in the fourth unit circuit 11D.

In this way, in the present embodiment, one boost circuit 20 is shared by four switching TFTs 12 selected at the same time. For this reason, the number of circuit elements can be further decreased as compared to the third embodiment in which one boost circuit 20 is shared by two switching TFTs 12. Therefore, further power consumption reduction and further frame narrowing can be attained.

Note that the present embodiment describes the example in which four switching TFTs 12 share one boost circuit 20, but three or more switching TFTs 12 sharing one boost circuit 20 can decrease the number of circuit elements as compared to the third embodiment. Three switching TFTs 12 selected at the same time may share one boost circuit 20, or five or more switching TFTs 12 selected at the same time may share one boost circuit 20.

Fifth Embodiment

Figure 28:
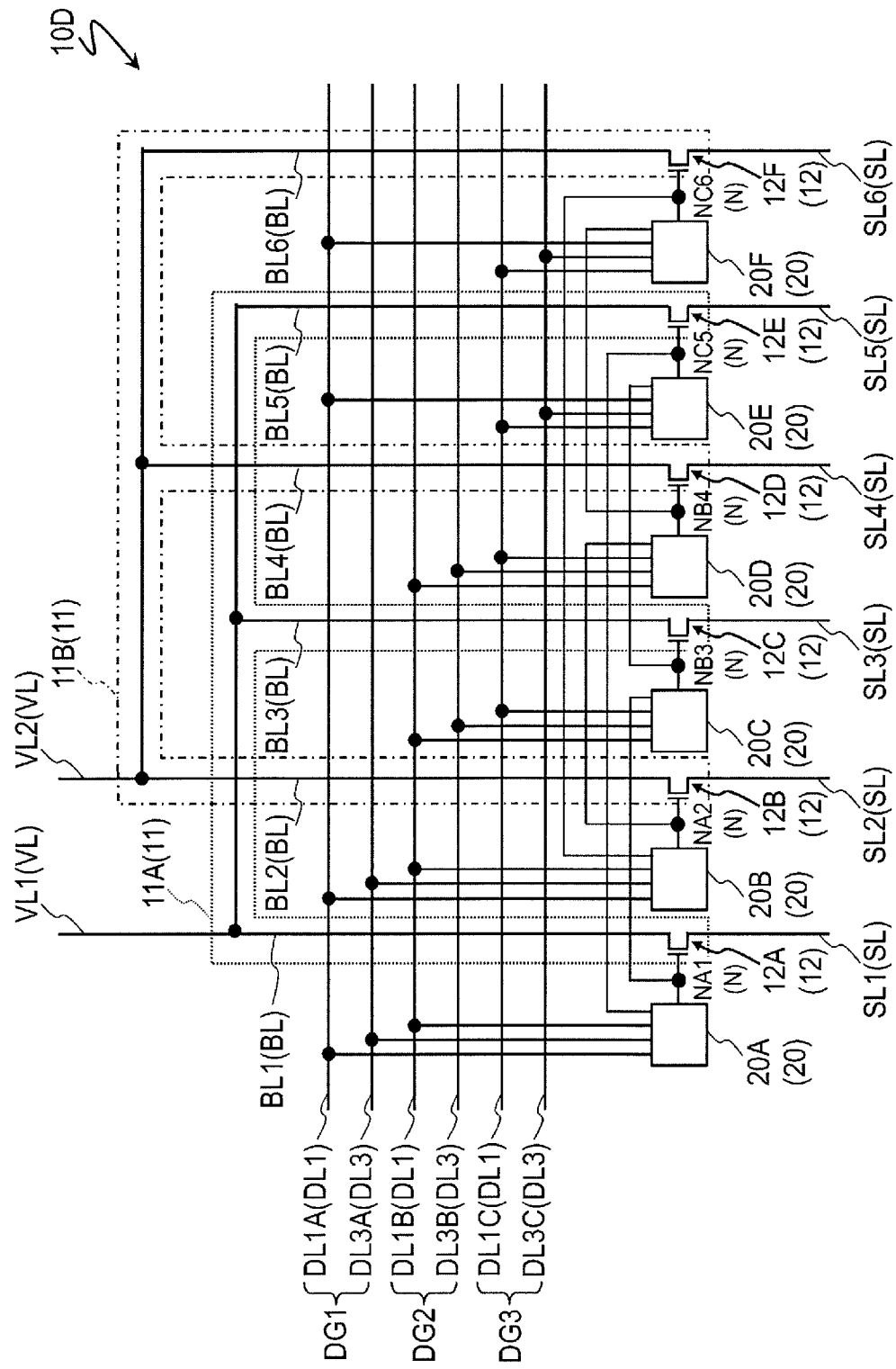
FIG. 28 is a diagram illustrating a configuration of a DEMUX circuit 10D included in an active matrix substrate according to a fifth embodiment.

With reference to FIG. 28, a description is given of an active matrix substrate according to the present embodiment. FIG. 28 is a diagram illustrating a configuration of a DEMUX circuit 10D included in the active matrix substrate according to the present embodiment.

In the DEMUX circuits 10, 10A, 10B, and 10C illustrated in FIG. 17, FIG. 23, FIG. 26 and FIG. 27, each unit circuit 11 distributes a display signal from one signal output line VL into two source bus lines SL. In contrast, in the DEMUX circuit 10D in the present embodiment, each unit circuit 11 distributes a display signal from one signal output line VL into three source bus lines SL. Hereinafter, a more detailed description is given.

FIG. 28 illustrates two unit circuits (a first unit circuit and a second unit circuit) 11A and 11B among a plurality of unit circuits 11 included in the DEMUX circuit 10D.

The first unit circuit 11A includes three branch wiring lines BL1, BL3, and BL5, and three switching TFTs 12A, 12C, and 12E, and distributes a display signal from one signal output line VL1 into three source bus lines SL1, SL3, and SL5. The three switching TFTs 12A, 12C, and 12E included in the first unit circuit 11A (also referred to as a first switching TFT, a second switching TFT, and a third switching TFT, respectively) are turned to the on state at timings different from each other within one horizontal scan period.

The second unit circuit 11B includes three branch wiring lines BL2, BL4 and BL6, and three switching TFTs 12B, 12D, and 12F, and distributes a display signal from one signal output line VL2 into three source bus lines SL2, SL4, and SL6. The three switching TFTs 12B, 12D, and 12F included in the second unit circuit 11B (also referred to as a first switching TFT, a second switching TFT, and a third switching TFT, respectively) are turned to the on state at timings different from each other within one horizontal scan period.

The DEMUX circuit 10D includes a plurality of boost circuits 20 each of which can boost a voltage applied to a gate electrode of each of three switching TFTs 12 in each unit circuit 11. In the example illustrated in FIG. 28, one boost circuit 20 is connected to each switching TFT 12. Specifically, gate electrodes of the switching TFTs 12A, 12B, 12C, 12D, 12E, and 12F are connected to output sides of boost circuits 20A, 20B, 20C, 20D, 20E, and 20F respectively.

In the example illustrated in FIG. 28, three systems of drive signal line groups DG1, DG2, and DG3 are provided. The first boost circuits 20A and 20B connected to the first switching TFTs 12A and 12B are driven by a first drive signal line DL1A and a third drive signal line DL3A in the drive signal line group DG1, and a first drive signal line DL1B in the drive signal line group DG2. The second boost circuits 20C and 20D connected to the second switching TFTs 12C and 12D are driven by the first drive signal line DL1B and a third drive signal line DL3B in the drive signal line group DG2, and a first drive signal line DL1C in the drive signal line group DG3. The third boost circuits 20E and 20F connected to the third switching TFTs 12E and 12F are driven by the first drive signal line DL1C and a third drive signal line DL3C in the drive signal line group DG3, and the first drive signal line DL1A in the drive signal line group DG1.

As illustrated in FIG. 28, each boost circuit 20 is also connected to a node N (another node) boosted by another boost circuit 20. In the example illustrated in FIG. 28, the boost circuit 20A is connected not only to an own node NA1 but also to a node NC5 boosted by the boost circuit 20E, and the boost circuit 20B is connected not only to an own node NA2 but also to a node NC6 boosted by the boost circuit 20F. The boost circuit 20C is connected not only to an own node NB3 but also to the node NA1 boosted by the boost circuit 20A, and the boost circuit 20D is connected not only to an own node NB4 but also to the node NA2 boosted by the boost circuit 20B. Furthermore, the boost circuit 20E is connected not only to an own node NC5 but also to the node NB3 boosted by the boost circuit 20C, and the boost circuit 20F is connected not only to an own node NC6 but also to the node NB4 boosted by the boost circuit 20D.

In this way, each boost circuit 20 is connected not only to the own node but also to another node, and inputs a potential of another node as a reset signal.

In the active matrix substrate according to the present embodiment, the DEMUX circuit 10D including the boost circuit 20 allows the drive power to be reduced similarly to the active matrix substrates in first to fourth embodiments. In the present embodiment, since each unit circuit 11 distributes a display signal from one signal output line VL to three source bus lines SL, the number of signal output lines VL can be decreased as compared to first to fourth embodiments. Therefore, a wiring line region (a region where the signal output lines VL are arranged) can be reduced to attain the further frame narrowing. Moreover, the number of amplifiers in the COG-mounted source driver 6 can be decreased so that the chip size can be further reduced. Therefore, the number of chips to be obtained from a wafer increases so that a chip cost can be reduced.

Figure 29:
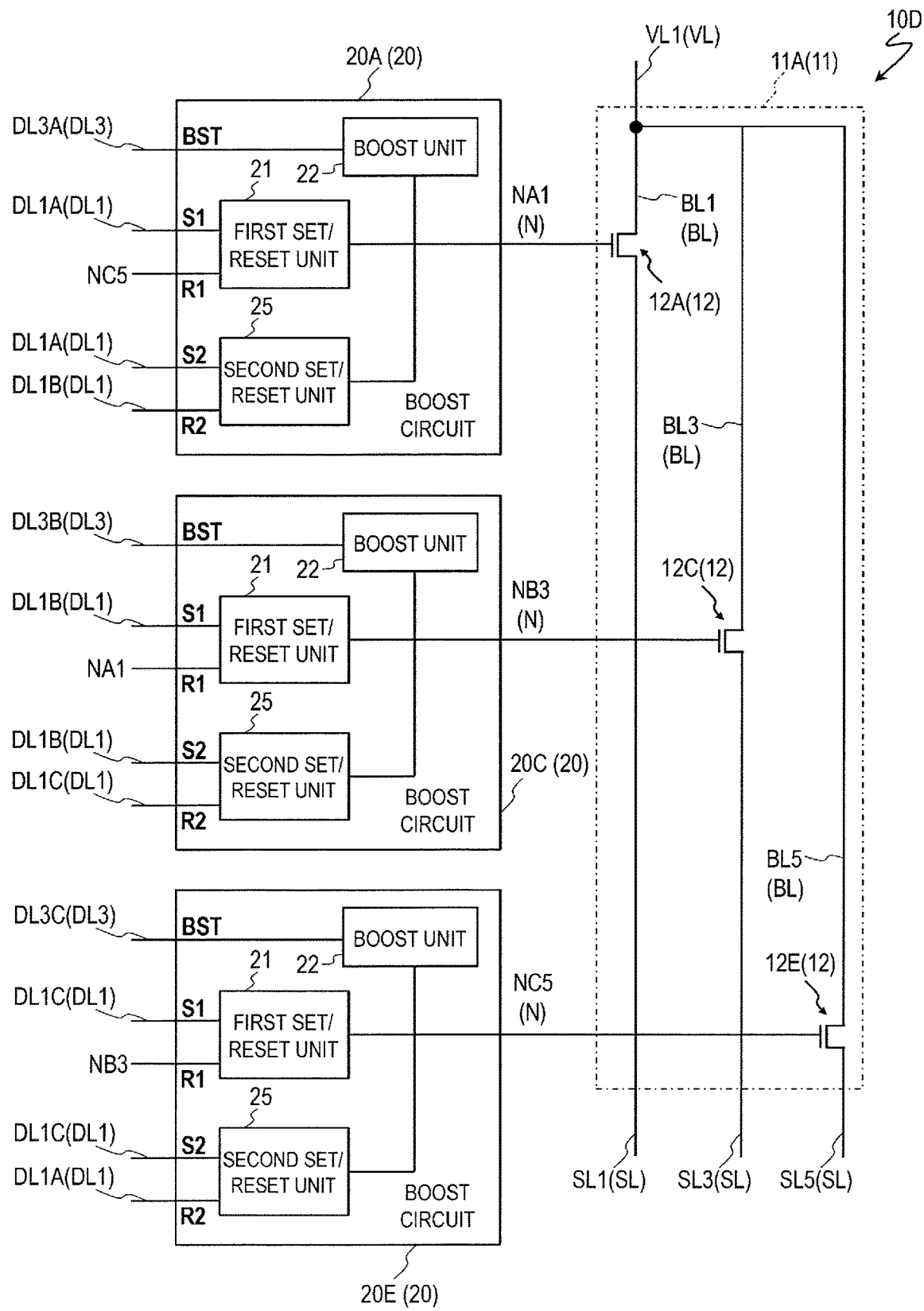
FIG. 29 is a diagram illustrating an example of a configuration of a boost circuit 20 included in the DEMUX circuit 10D.

FIG. 29 is a diagram illustrating an example of a configuration of the boost circuit 20 included in the DEMUX circuit 10D.

In the example illustrated in FIG. 29, the boost circuit 20 includes a first set/reset unit 21, a second set/reset unit 25, and a boost unit 22. The first set/reset unit 21, the second set/reset unit 25, and the boost unit 22 are connected to a node N connected to the gate electrode of the switching TFT 12. The first set/reset unit 21 and the second set/reset unit 25 are connected to the first drive signal line DL1, and the boost unit 22 is connected to the third drive signal line DL3.

The first set/reset unit 21 and the second set/reset unit 25 are supplied with the first drive signal (set signal S1) from the first drive signal line DL1 to perform the set action. The boost unit 22 is supplied with the third drive signal (boost signal B) from the third drive signal line DL3 to perform the boost action.

The first set/reset unit 21 is supplied with the potential of another node as a reset signal R1 to perform the reset action. As illustrated in FIG. 29, the set/reset unit 21 in the first boost circuit 20A is connected to the node NC5 boosted by the third boost circuit 20E, and inputs a potential of the node NC5 as the reset signal R1. The second boost circuit 20C is connected to the node NA1 boosted by the first boost circuit 20A, and inputs a potential of the node NA1 as the reset signal R1. The third boost circuit 20E is connected to the node NB3 boosted by the second boost circuit 20C, and inputs a potential of the node NB3 as the reset signal R1.

In contrast, input to the second set/reset unit 25 is a signal voltage (first drive signal) of the first drive signal line DL1 for the boost circuit 20 boosting another node as a reset signal R2. As illustrated in FIG. 29, the second set/reset unit 25 in the first boost circuit 20A is connected to the first drive signal line DL1B for the second boost circuits 20C and 20D. The second set/reset unit 25 in the second boost circuit 20C is connected to the first drive signal line DL1C for the third boost circuits 20E and 20F, and the second set/reset unit 25 in the third boost circuit 20E is connected to the first drive signal line DL1A for the first boost circuits 20A and 20B.

Figure 30:
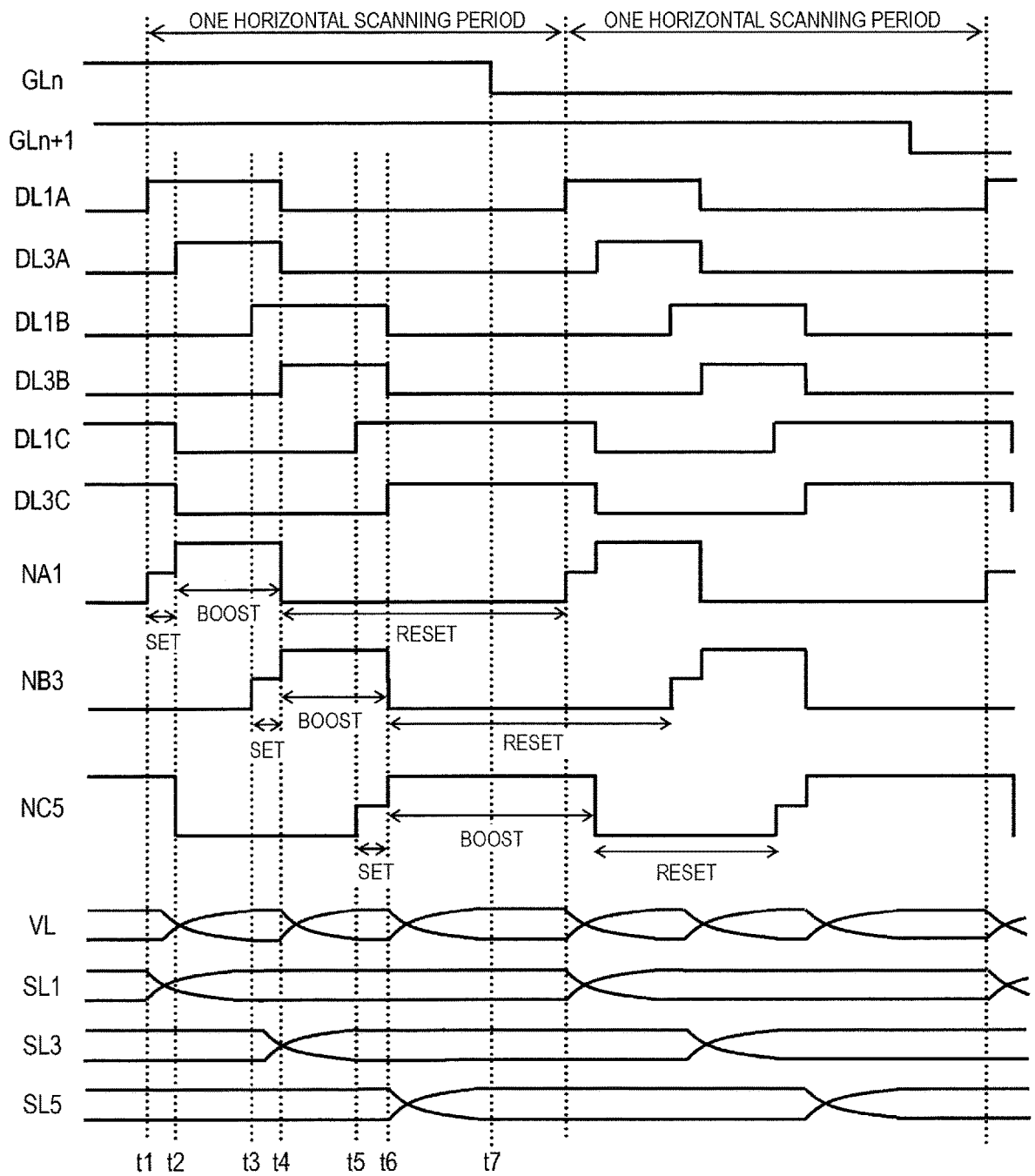
FIG. 30 is a timing chart for describing actions of the boost circuit 20 in the DEMUX circuit 10D.

Here, actions of the boost circuit 20 (DEMUX circuit 10D) are described also with reference to FIG. 30. FIG. 30 is a timing chart for describing the actions of the DEMUX circuit 10D.

Time Point t1

Side on the first switching TFT 12A: The potential of the first drive signal line DL1A becomes the high level. At this time, the potential of another node (node NC5) remains at the high level from the previous horizontal scan period, and the first drive signal as a set signal S1 is input to the first set/reset unit 21. This allows the node NA1 connected to the gate electrode of the first switching TFT 12A to be precharged (set action).

Side on the second switching TFT 12C: It is in a reset state.

Side on the third switching TFT 12E: It is in a boost state.

Time Point t2

Side on the first switching TFT 12A: The potential of the third drive signal line DL3A becomes the high level, and the third drive signal as a boost signal B is input to the boost unit 22. This allows the potential of the node NA1 to be boosted (boost action). The potential of the node NA1 being boosted allows the source bus line SL1 to be sufficiently charged through the switching TFT 12A.

Side on the second switching TFT 12C: It is in the reset state.

Side on the third switching TFT 12E: The potential of the first drive signal line DL1C becomes the low level while the potential of the first drive signal line DL1A remains at the high level, and the node NC5 is pulled down to the low level (reset action).

Time Point t3

Side on the first switching TFT 12A: It is in the boost state.

Side on the second switching TFT 12C: The potential of the first drive signal line DL1B becomes the high level. At this time, the potential of another node (node NA1) remains at the high level from the previous horizontal scan period, and the first drive signal as a set signal S1 is input to the first set/reset unit 21. This allows the node NB3 connected to the gate electrode of the second switching TFT 12C to be precharged (set action).

Side on the third switching TFT 12E: It is in the reset state.

Time Point t4

Side on the first switching TFT 12A: The potential of the first drive signal line DL1A becomes the low level while the potential of the first drive signal line DL1B remains at the high level, and the node NA1 is pulled down to the low level (reset action).

Side on the second switching TFT 12C: The potential of the third drive signal line DL3B becomes the high level, and the third drive signal as a boost signal B is input to the boost unit 22. This allows the potential of the node NB3 to be boosted (boost action). The potential of the node NB3 being boosted allows the source bus line SL3 to be sufficiently charged through the switching TFT 12C.

Side on the third switching TFT 12E: It is in the reset state.

Time Point t5

Side on the first switching TFT 12A: It is in the reset state.

Side on the second switching TFT 12C: It is in the boost state.

Side on the third switching TFT 12E: The potential of the first drive signal line DL1C becomes the high level. At this time, the potential of another node (node NB3) remains at the high level from the previous horizontal scan period, and the first drive signal as a set signal S1 is input to the first set/reset unit 21. This allows the node NC5 connected to the gate electrode of the third switching TFT 12E to be precharged (set action).

Time Point t6

Side on the first switching TFT 12A: It is in the reset state.

Side on the second switching TFT 12C: The potential of the first drive signal line DL1B becomes the low level while the potential of the first drive signal line DL1C remains at the high level, and the node NB3 is pulled down to the low level (reset action).

Side on the third switching TFT 12E: The potential of the third drive signal line DL3C becomes the high level, and the third drive signal as a boost signal B is input to the boost unit 22. This allows the potential of the node NC5 to be boosted (boost action). The potential of the node NC5 being boosted allows the source bus line SL5 to be sufficiently charged through the switching TFT 12E.

Time Point t7

Side on the first switching TFT 12A: It is in the reset state.

Side on the second switching TFT 12C: It is in the reset state.

Side on the third switching TFT 12E: It is in the boost state.

When the writing into the source bus lines SL1, SL3, and SL5 is completed (the potential is determined), the gate signal supplied from the gate bus line GLn becomes the off-level, and the writing of the display voltage into the pixel PIX is completed. After that, the actions described above are repeated to perform the writing for the all gate bus lines GL.

Sixth Embodiment

Figure 31:
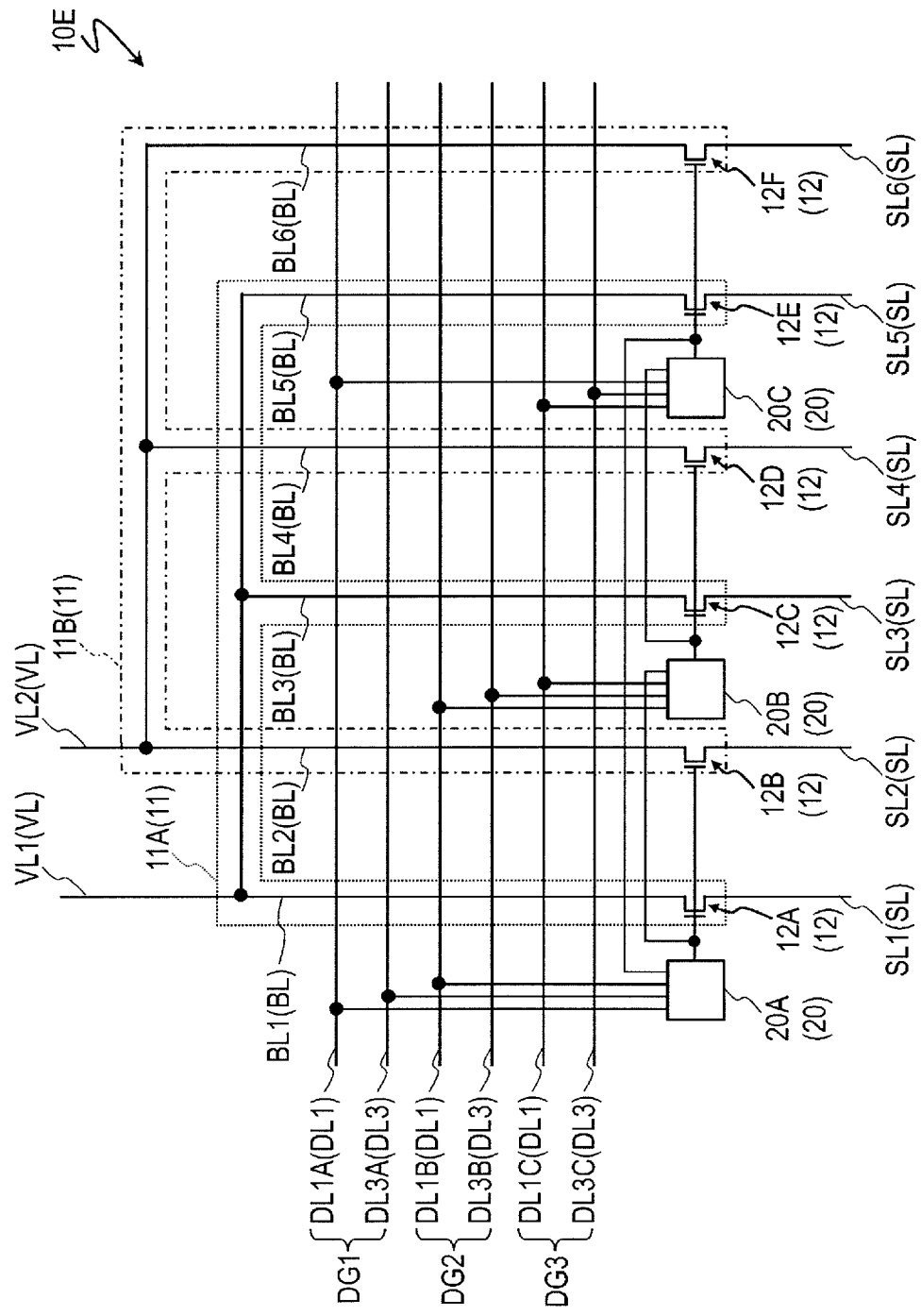
FIG. 31 is a diagram illustrating a configuration of a DEMUX circuit 10E included in an active matrix substrate according to a sixth embodiment.

With reference to FIG. 31, a description is given of an active matrix substrate according to the present embodiment. FIG. 31 is a diagram illustrating a configuration of a DEMUX circuit 10E included in the active matrix substrate according to the present embodiment.

In the DEMUX circuit 10D illustrated in FIG. 28, one boost circuit 20 is connected to each switching TFT 12. In contrast, in the DEMUX circuit 10E in the present embodiment, one boost circuit 20 is connected to two switching TFTs 12 as illustrated in FIG. 31. Hereinafter, a more detailed description is given.

Three switching TFTs 12 included in the first unit circuit 11A are a first switching TFT 12A, a second switching TFT 12C, and a third switching TFT 12E which are turned to the on state at timings different from each other within one horizontal scan period. Similarly, three switching TFTs 12 included in the second unit circuit 11B are a first switching TFT 12B, a second switching TFT 12D, and a third switching TFT 12F which are turned to the on state at timings different from each other within one horizontal scan period.

The boost circuit 20A among three boost circuits 20A, 20B, and 20C illustrated in FIG. 31 is connected in common to the first switching TFT 12A in the first unit circuit 11A and the first switching TFT 12B in the second unit circuit 11B. The boost circuit 20B is connected in common to the second switching TFT 12C in the first unit circuit 11A and the second switching TFT 12D in the second unit circuit 11B. The boost circuit 20C is connected in common to the third switching TFT 12E in the first unit circuit 11A and the third switching TFT 12F in the second unit circuit 11B.

In this way, in the present embodiment, one boost circuit 20 is shared by two switching TFTs 12 selected at the same time. Therefore, the number of circuit elements can be decreased. The decrease in the number of circuit elements allows the load to be decreased, and therefore, the further power consumption reduction can be attained. Furthermore, the decrease in the number of circuit elements allows a circuit area to be decreased, and therefore, the layout size can be reduced to attain the further frame narrowing.

Seventh Embodiment

Figure 32:
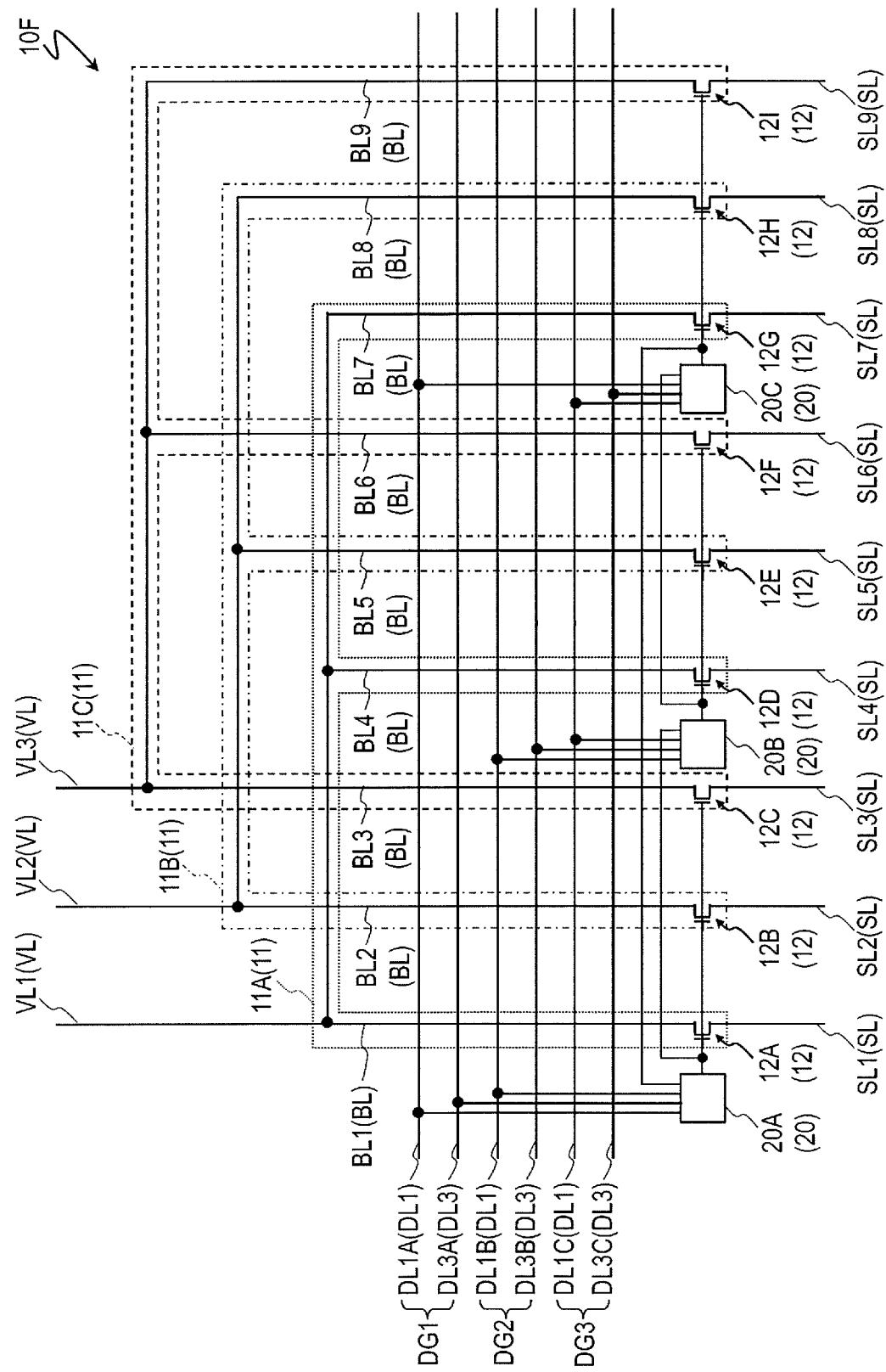
FIG. 32 is a diagram illustrating a configuration of a DEMUX circuit 10F included in an active matrix substrate according to a seventh embodiment.

Two switching TFTs 12 share one boost circuit 20 in the DEMUX circuit 10E in the sixth embodiment, but three or more switching TFTs 12 may share one boost circuit 20. Hereinafter, with reference to FIG. 32, a description is given of an active matrix substrate according to the present embodiment. FIG. 32 is a diagram illustrating a configuration of a DEMUX circuit 10F included in the active matrix substrate according to present embodiment.

FIG. 32 illustrates three unit circuits (hereinafter, referred to as a "first unit circuit", a "second unit circuit", and a "third unit circuit") 11A, 11B, and 11C among a plurality of unit circuits 11 included in the DEMUX circuit 10F.

The first unit circuit 11A includes three branch wiring lines BL1, BL4, and BL7, and three switching TFTs 12A, 12D, and 12G, and distributes a display signal from the signal output line VL1 into the source bus lines SL1, SL4, and SL7. The three switching TFTs (a first switching TFT, a second switching TFT, and a third switching TFT) 12A, 12D, and 12G in the first unit circuit 11A are turned to the on state at timings different from each other within one horizontal scan period.

The second unit circuit 11B includes three branch wiring lines BL2, BL5 and BL8, and three switching TFTs 12B, 12E, and 12H, and distributes a display signal from the signal output line VL2 into the source bus lines SL2, SL5, and SL8. The three switching TFTs (the first switching TFT, the second switching TFT, and the third switching TFT) 12B, 12E, and 12H in the second unit circuit 11B are turned to the on state at timings different from each other within one horizontal scan period.

The third unit circuit 11C includes three branch wiring lines BL3, BL6, and BL9, and three switching TFTs 12C, 12F, and 12I, and distributes a display signal from the signal output line VL3 into the source bus lines SL3, SL6, and SL9. The three switching TFTs (the first switching TFT, the second switching TFT, and the third switching TFT) 12C, 12F, and 12I in the third unit circuit 11C are turned to the on state at timings different from each other within one horizontal scan period.

The boost circuit 20A among three boost circuits 20A, 20B, and 20C illustrated in FIG. 32 is connected in common to the first switching TFT 12A in the first unit circuit 11A, the first switching TFT 12B in the second unit circuit 11B, and the first switching TFT 12C in the third unit circuit 11C. The boost circuit 20B is connected in common to the second switching TFT 12D in the first unit circuit 11A, the second switching TFT 12E in the second unit circuit 11B, and the second switching TFT 12F in the third unit circuit 11C. The boost circuit 20C is connected in common to the third switching TFT 12G in the first unit circuit 11A, the third switching TFT 12H in the second unit circuit 11B, and the third switching TFT 12I in the third unit circuit 11C.

In this way, in the present embodiment, one boost circuit 20 is shared by three switching TFTs 12 selected at the same time. Therefore, the number of circuit elements can be further decreased as compared to the sixth embodiment in which one boost circuit 20 is shared by two switching TFTs 12. Therefore, the further power consumption reduction and the further frame narrowing can be attained.

Note that the present embodiment describes the example in which three switching TFTs 12 share one boost circuit 20, but four or more switching TFTs 12 selected at the same time may share one boost circuit 20.

Eighth Embodiment

Figure 33:
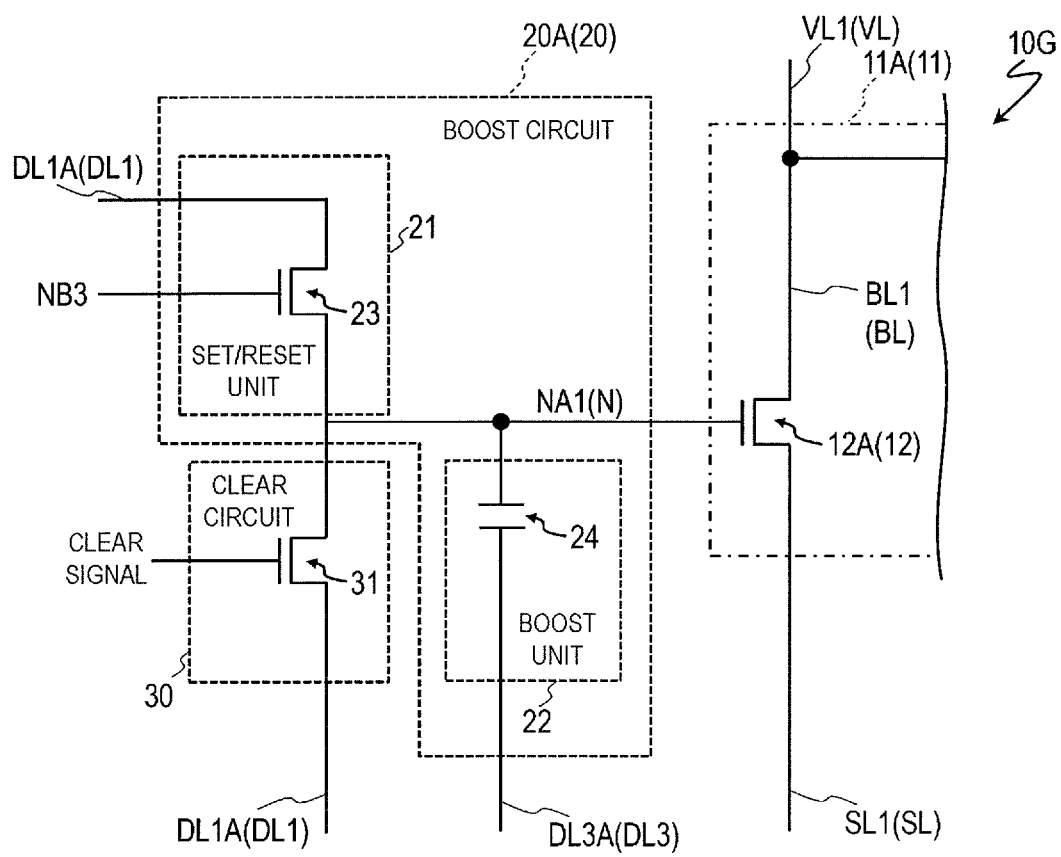
FIG. 33 is a diagram illustrating a configuration of a DEMUX circuit 10G included in an active matrix substrate according to an eighth embodiment.

With reference to FIG. 33, a description is given of an active matrix substrate according to the present embodiment. FIG. 33 is a diagram illustrating a configuration of a DEMUX circuit 10G included in the active matrix substrate according to the present embodiment.

As illustrated in FIG. 33, the DEMUX circuit 10G further includes a plurality of clear circuits 30 each of which is connected to corresponding boost circuit 20 (FIG. 33 illustrates one clear circuit 30). The clear circuit 30 can initialize the corresponding boost circuit 20 at a prescribed timing.

In the example illustrated in FIG. 33, the clear circuit 30 includes a TFT (hereinafter, referred to a "clearing TFT") 31. A gate electrode of the clearing TFT 31 is supplied with a clear signal. A source electrode of the clearing TFT 31 is connected to a first drive signal line DL1 (DL1A), and a drain electrode of the clearing TFT 31 is connected to a node N (NA1).

In the DEMUX circuit 10G including the clear circuit 30, when the clear signal supplied to the gate electrode of the clearing TFT 31 becomes the high level, the boost circuit 20 is initialized. The initialization of the boost circuit 20 by the clear circuit 30 is performed at the beginning or end of a drive period, for example.

In a case where the boost circuit 20 is initialized at the beginning of the drive period, the operation is performed from a state where the boost circuit 20 is initialized, and therefore, an unexpected action or output can be suppressed. In a case where the boost circuit 20 is initialized at end of the drive period, electric charge of each node (which is accumulated through the driving) can be discharged, and therefore, TFT deterioration caused by the electric charge remained during no action can be prevented.

Ninth Embodiment

Figure 34:
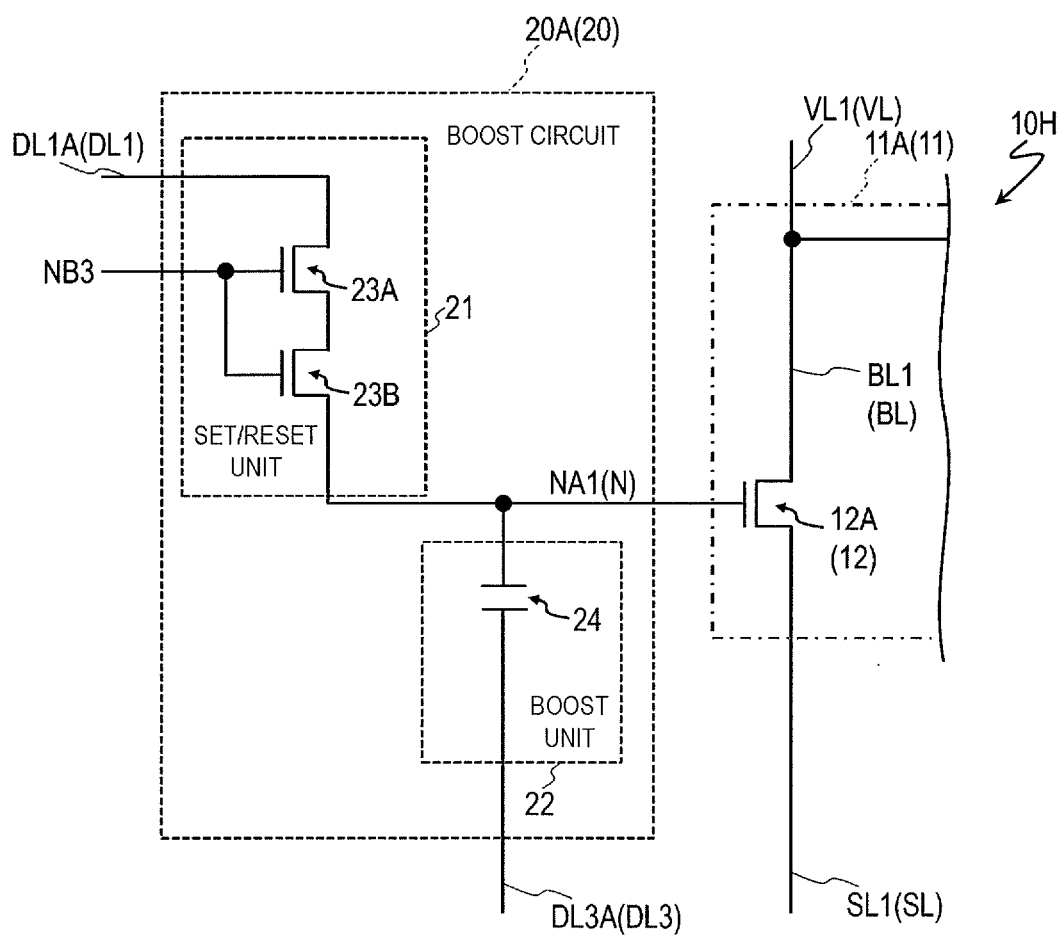
FIG. 34 is a diagram illustrating a configuration of a DEMUX circuit 10H included in an active matrix substrate according to a ninth embodiment.

With reference to FIG. 34, a description is given of an active matrix substrate according to the present embodiment. FIG. 34 is a diagram illustrating a configuration of a DEMUX circuit 10H included in the active matrix substrate according to the present embodiment.

In the DEMUX circuit 10H, a set/reset unit 21 in a boost circuit 20 includes a plurality of (here, two) setting/resetting TFTs 23A and 23B connected in series with each other as illustrated in FIG. 34.

Gate electrodes of the setting/resetting TFTs 23A and 23B are connected to another node (node NB3). A drain electrode of the setting/resetting TFT 23A is connected to a first drive signal line DL1A. A source electrode of the setting/resetting TFT 23A is connected to a drain electrode of the setting/resetting TFT 23B. A source electrode of the setting/resetting TFT 23B is connected to a node NA1.

As described above, the set/reset unit 21 in the boost circuit 20 including a plurality of setting/resetting TFTs 23A and 23B connected in series with each other makes it possible to reduce (by about half, in the illustrated configuration) a potential difference between the source and the drain of the individual TFT which is given when the node NA1 is boosted by the action of the boost circuit 20. Specifically, a pressure resistance can be improved.

Tenth Embodiment

Figure 35:
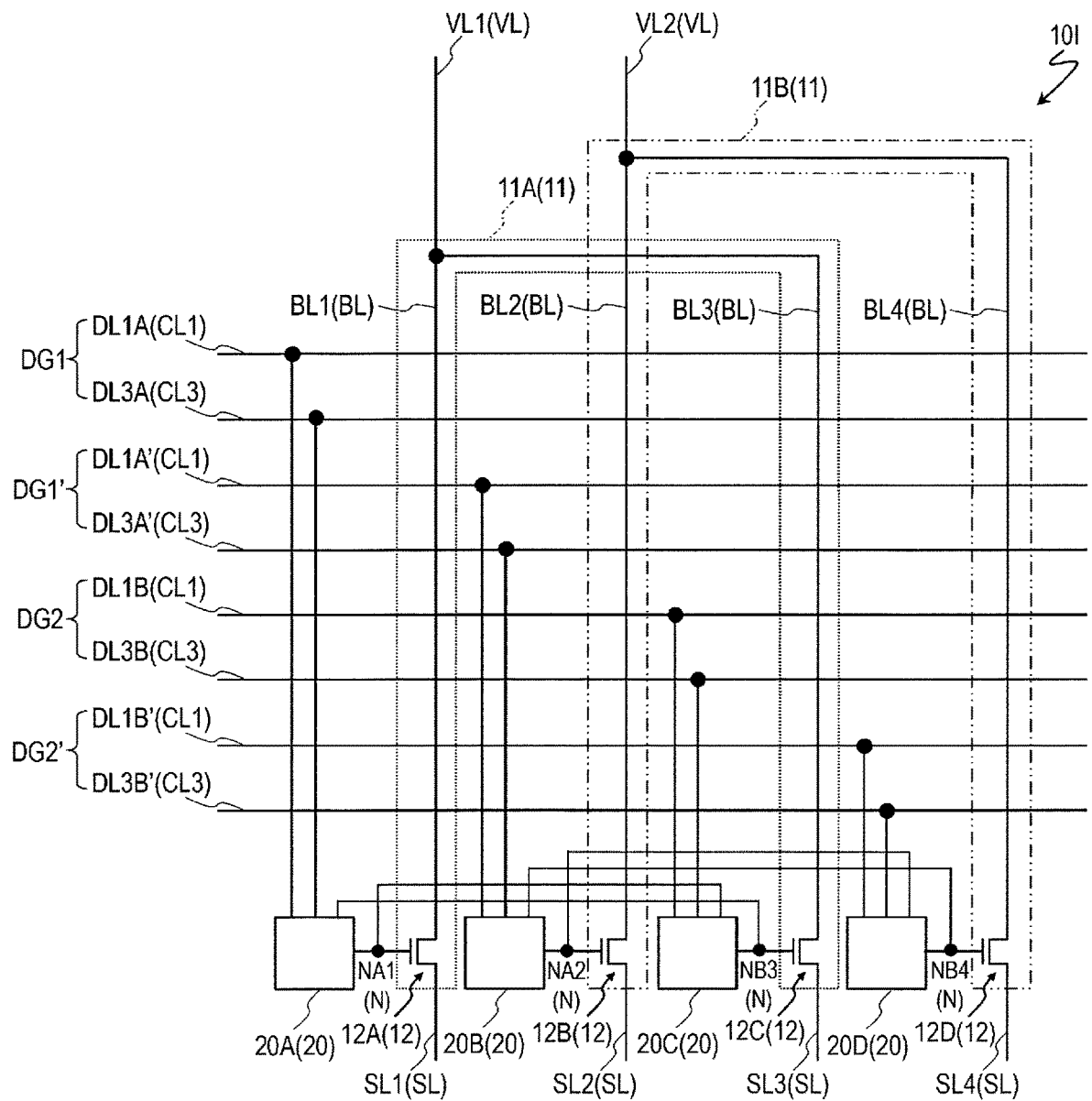
FIG. 35 is a diagram illustrating a configuration of a DEMUX circuit 10I included in an active matrix substrate according to a tenth embodiment.

With reference to FIG. 35, a description is given of an active matrix substrate according to the present embodiment. FIG. 35 is a diagram illustrating a configuration of a DEMUX circuit 10I included in the active matrix substrate according to the present embodiment.

The DEMUX circuit 10I illustrated in FIG. 35 is different from the DEMUX circuit 10 illustrated in FIG. 17 in further including drive signal line groups DG1' and DG2', in addition to the drive signal line groups DG1 and DG2.

Among four boost circuits 20 illustrated in FIG. 35, a boost circuit 20A is driven by the drive signal line group DG1, and a boost circuit 20B is driven by the drive signal line group DG1'. A boost circuit 20C is driven by the drive signal line group DG2, a boost circuit 20D is driven by the drive signal line group DG2'.

In the DEMUX circuit 10 illustrated in FIG. 17, the boost circuit 20A and the boost circuit 20B driven at the same timing are driven by the same drive signal line group DG1. The boost circuit 20C and the boost circuit 20D driven at the same timing are driven by the same drive signal line group DG2.

In contrast, in the DEMUX circuit 10I FIG. 35, the boost circuit 20A and the boost circuit 20B driven at the same timing are driven by the drive signal line groups GD1 and GD1' different from each other, respectively. The boost circuit 20C and the boost circuit 20D driven at the same timing are driven by the drive signal line groups GD2 and GD2' different from each other, respectively.

The drive signal line groups GD1 and GD1' are supplied with a phase development of the drive signal for driving the boost circuit 20 at certain timing. Specifically, the drive signal line groups GD1 and GD1' are wiring line groups different from each other and supplying substantially the same signal.

The drive signal line groups GD2 and GD2' are supplied with a phase development of the drive signal for driving the boost circuit 20 at certain timing. Specifically, the drive signal line groups GD2 and GD2' are wiring line groups different from each other and supplying substantially the same signal.

As described above, in the present embodiment, there are provided a wiring line group supplying the drive signal group for driving some boost circuits 20 among two or more boost circuits 20 which are driven at the same timing, and another wiring line group supplying a drive signal group for driving other some boost circuits 20. Therefore, the number of circuits connected to one drive signal line can be decreased, and thus, a load on each drive signal line is reduced to allow transit times (a rise time and a fall time) of the drive signal to be shortened. Therefore, faster action becomes possible.

Action when Power Supply is Started

Figure 36:
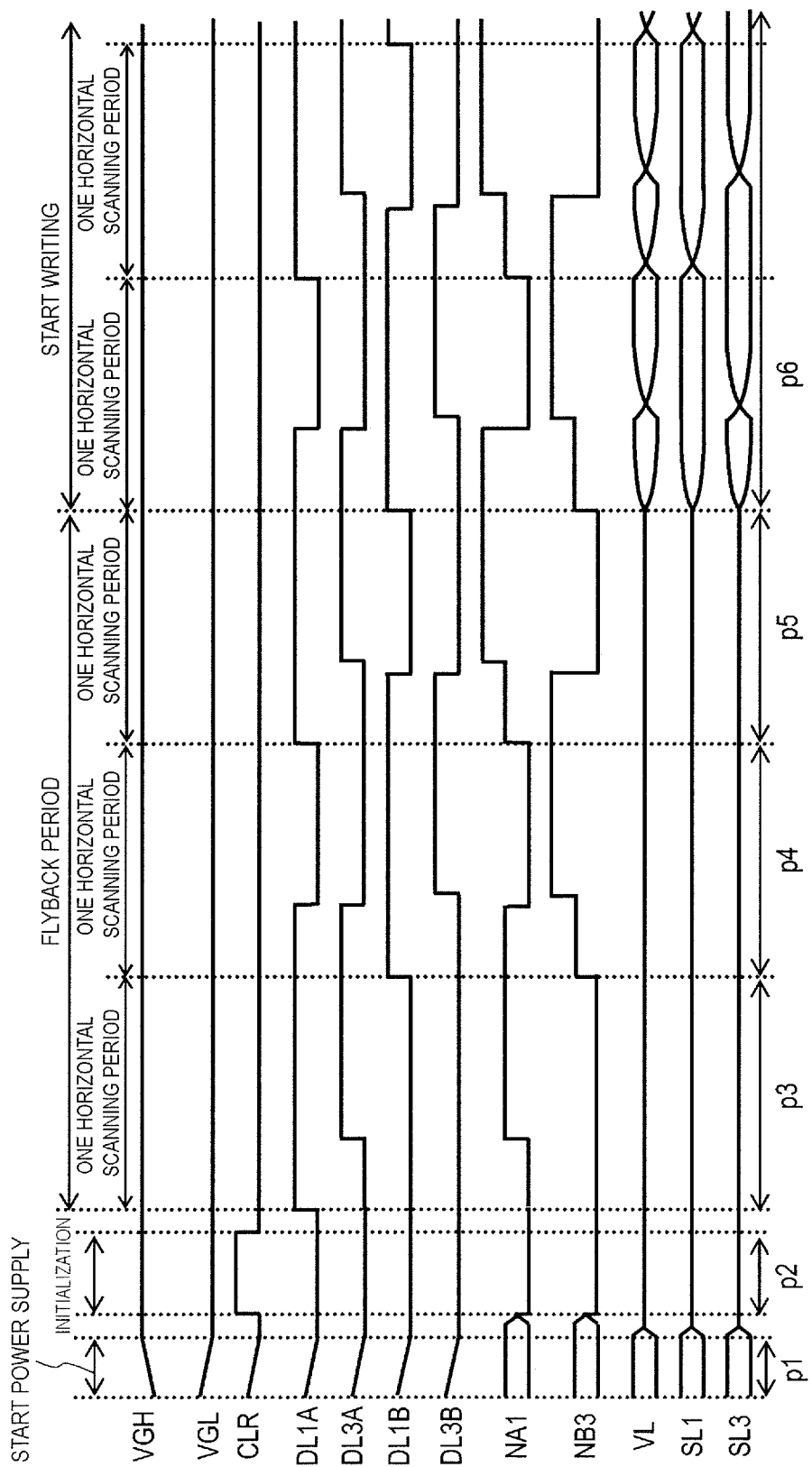
FIG. 36 is a timing chart for describing actions of the DEMUX circuit 10 when power supply is started.

Here, with reference to FIG. 36, a description is given of actions of the DEMUX circuit 10 when power supply is started. FIG. 36 is a timing chart from when the power supply is started, through initialization and a flyback period, until when writing (normal action) is started, and illustrates potentials of power supply voltages VGH and VGL, a clear signal CLR, first drive signal lines DL1A and DL1B, third drive signal lines DL3A and DL3B, nodes NA1 and NB3, signal output line VL, and source bus lines SL1 and SL3.

Period p1: Start of Power Supply

When the power supply is started, the power supply voltages VGH and VGL in the driver change to an initial state. Specifically, VGH changes to the high level, and VGL changes to the low level.

Period p2: Initialization

The clear signal CLR becomes the high level, and the nodes in the circuit are initialized.

Period p3: After Initialization, Rising of Drive Signal for First Boost Circuit

At the beginning, the first drive signal for the first boost circuit 20A (supplied from the first drive signal line DL1A) rises, but at this time, the first drive signal for the second boost circuit 20C (supplied from the first drive signal line DL1B) does not rise, and therefore, the node NA1 is not charged.

When the third drive signal for the first boost circuit 20A (supplied from the third drive signal line DL3A) rises, the node NA1 is pushed to rise to a prescribed voltage. At this timing, the potential of the signal output line VL (the display signal voltage) is fixed to 0 V.

Period p4: After Initialization, Rising of Drive Signal for Second Boost Circuit When the first drive signal for the second boost circuit 20C (supplied from the first drive signal line DL1B) rises, the node NB3 is charged because the node NA1 has risen to a prescribed potential. Subsequently, when the third drive signal for the second boost circuit 20C (supplied from the third drive signal line DL3B) rises, the node NB3 is pushed to be charged to a high potential. Also at this timing, the display signal voltage of the signal output line VL is fixed to 0 V.

Period p5: After Initialization, Before Normal Action

In a state where the potential of the node NB3 is high, the first drive signal for the first boost circuit 20A rises, and the node NA1 is charged to a level the same as in the normal action. Also at this timing, the display signal voltage of the signal output line VL is fixed to 0 V.

Period p6: Start of Normal Action (Writing)

Scanning by the gate driver is started. The signal output line VL outputs a display signal voltage corresponding to a desired image.

Oxide Semiconductor

The oxide semiconductor included in the oxide semiconductor layer in the switching TFT 12 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor with a c-axis oriented substantially perpendicular to the layer face.

The oxide semiconductor layer may have a layered structure of two or more layers. In a case where the oxide semiconductor layer has a layered structure, the oxide semiconductor layer may include an amorphous oxide semiconductor layer and a crystalline oxide semiconductor layer, may include a plurality of crystalline oxide semiconductor layers different in a crystal structure, or may include a plurality of amorphous oxide semiconductor layers. In cases where the oxide semiconductor layer has a two-layer structure including an upper layer and a lower layer, the energy gap of the oxide semiconductor included in the upper layer is preferably greater than the energy gap of the oxide semiconductor included in the lower layer. However, when the different in the energy gap between these layers is relatively small, the energy gap of the lower layer oxide semiconductor may be greater than the energy gap of the upper layer oxide semiconductor.

JP 2014-007399 A, for example, describes materials, structures, film formation methods, and the configuration of oxide semiconductor layers having layered structures for amorphous oxide semiconductors and each of the above described crystalline oxide semiconductors. For reference, the entire contents of JP 2014-007399 A are incorporated herein.

The oxide semiconductor layer may include, for example, at least one metal element selected from In, Ga, and Zn. In the embodiment of the present disclosure, the oxide semiconductor layer includes, for example, an In—Ga—Zn—O-based semiconductor (for example, indium gallium zinc oxide). Here, the In—Ga—Zn—O based semiconductor is a ternary oxide of In (indium), Ga (gallium), and Zn (zinc), and the ratio (composition ratio) of In, Ga, and Zn is not particularly limited to a specific value. For example, the ratio includes In:Ga:Zn=2:2:1, In:Ga:Zn=1:1:1, or In:Ga:Zn=1:1:2. Such an oxide semiconductor layer can be formed from an oxide semiconductor film including an In—Ga—Zn—O based semiconductor.

The In—Ga—Zn—O based semiconductor may be an amorphous semiconductor or a crystalline semiconductor. A crystalline In—Ga—Zn—O based semiconductor in which the c-axis is oriented substantially perpendicular to the layer surface is preferable as the crystalline In—Ga—Zn—O based semiconductor.

Note that the crystal structure of the crystalline In—Ga—Zn—O based semiconductor is disclosed in, for example, the above-mentioned JP 2014-007399 A, JP 2012-134475 A, and JP 2014-209727 A. For reference, the entire contents of JP 2012-134475 A and 2014-209727 A are incorporated herein. The TFT including the In—Ga—Zn—O-based semiconductor layer, which has a higher mobility (more than 20 times an a-SiTFT) and a lower leakage current (less than one hundredth of an a-SiTFT), is preferably used as the switching TFT 12, and also used as a driving TFT (e.g., a TFT included in a drive circuit provided on the same substrate as a display region around the display region including a plurality of pixels) or an image TFT (a TFT provided to a pixel).

The oxide semiconductor layer may include another oxide semiconductor in place of the In—Ga—Zn—O-based semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, or an Hf—In—Zn—O-based semiconductor.

Eleventh Embodiment

Figure 37:
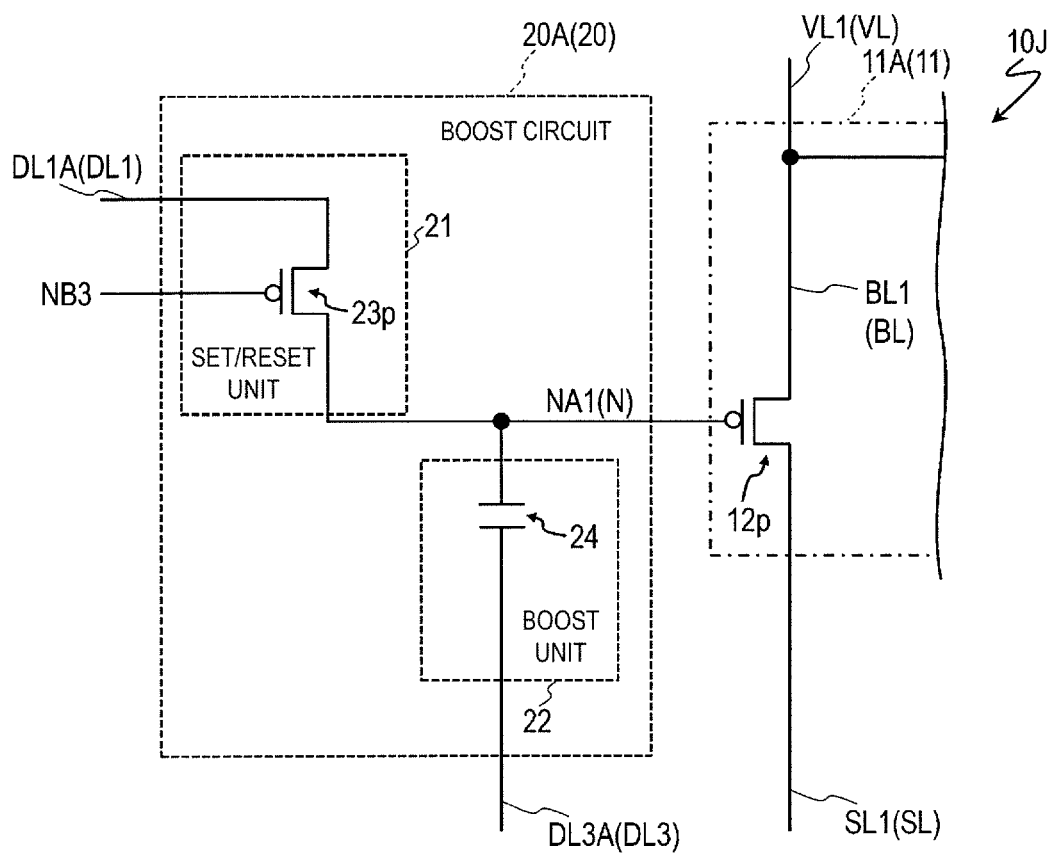
FIG. 37 is a diagram illustrating a configuration of a DEMUX circuit 10J included in an active matrix substrate according to an eleventh embodiment.

With reference to FIG. 37, a description is given of an active matrix substrate according to the present embodiment. FIG. 37 is a diagram illustrating a configuration of a DEMUX circuit 10J included in the active matrix substrate according to the present embodiment.

The DEMUX circuit 10J illustrated in FIG. 37 is different from the DEMUX circuit 10 illustrated in FIG. 20 in that a switching TFT 12p in each unit circuit 11 is a PMOS transistor including a polycrystalline silicon semiconductor layer (e.g., a low-temperature polysilicon (LIPS) layer) as an active layer. In the DEMUX circuit 10J, each of other TFTs constituting the circuit is also a PMOS transistor including a polycrystalline silicon semiconductor layer. Therefore, a setting/resetting TFT 23p in a set/reset unit 21 is a PMOS transistor including a polycrystalline silicon semiconductor layer.

Also in a case where the DEMUX circuit is constituted by the PMOS transistors like the DEMUX circuit 10J illustrated in FIG. 37, the driving can be made at the timing or the like the same as in the case of the DEMUX circuit 10 illustrated in FIG. 17 except only that a polarity of the signal or the like is reverse.

As already described above, the mobility of the polycrystalline silicon is higher than the oxide semiconductor, but the mobility of the PMOS is lower than the NMOS. For this reason, in a case where only a PMOS transistor including a polycrystalline silicon semiconductor layer as an active layer is used as a TFT for the DEMUX circuit, a problem similar to the problem in the use of the oxide semiconductor TFT occurs.

The DEMUX circuit 10J including the boost circuit 20 as in the present embodiment can achieve the drive power reduction and the frame narrowing.

Twelfth Embodiment

Figure 38:
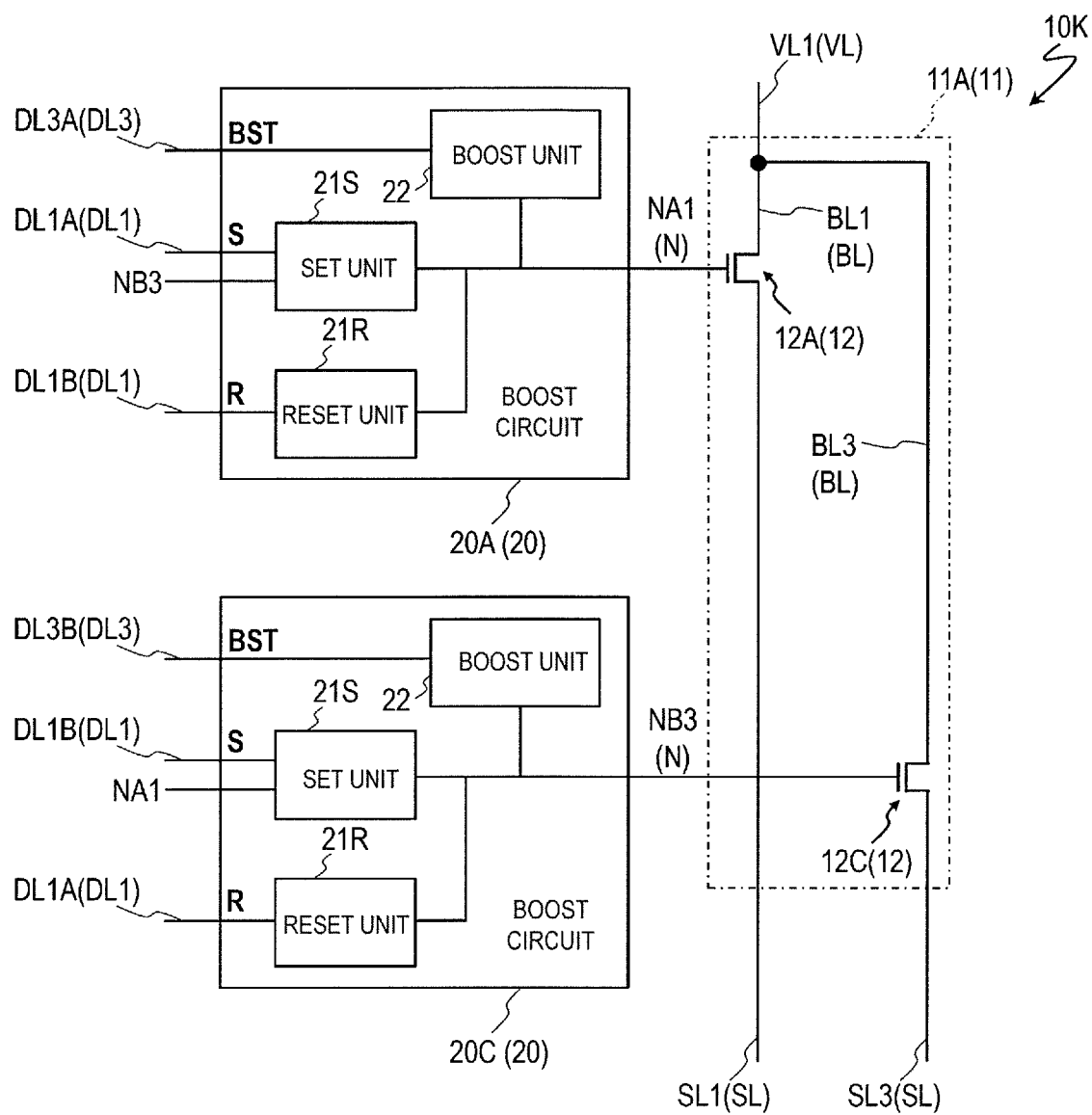
FIG. 38 is a diagram illustrating a configuration of a DEMUX circuit 10K included in an active matrix substrate according to a twelfth embodiment.

With reference to FIG. 38, a description is given of an active matrix substrate according to the present embodiment. FIG. 38 is a diagram illustrating a configuration of a DEMUX circuit 10K included in the active matrix substrate according to the present embodiment. FIG. 38 illustrates two boost circuits (a first boost circuit and a second boost circuit) 20A and 20C connected to two switching TFTs (a first switching TFT and a second switching TFT) 12A and 12C included in a certain unit circuit 11A.

The DEMUX circuit 10K illustrated in FIG. 38 is different from the DEMUX circuit 10 illustrated in FIG. 18 in that each boost circuit 20 includes a set unit 21S and a reset unit 21R in place of the set/reset unit 21.

The set/reset unit 21S, the reset unit 21R, and a boost unit 22 are connected to a node N connected to a gate electrode of a switching TFT 12.

The set unit 21S is supplied with a set signal S from a first drive signal line DL1 to perform the set action to precharge the node N. The boost unit 22 is supplied with a boost signal B from a third drive signal line DL3 to perform the boost action to boost a potential of the node N precharged by the set unit 21S.

The reset unit 21R is supplied with a reset signal R to perform the reset action to reset the potential of the node N. In the example illustrated in FIG. 38, the reset unit 21R in the first boost circuit 20A is connected to a first drive signal line DL1B for the second boost circuit 20C, and inputs a signal voltage of the first drive signal line DL1B as reset signal R. The reset unit 21R in the second boost circuit 20B is connected to the first drive signal line DL1A for the first boost circuit 20A, and inputs a signal voltage of the first drive signal line DL1A as a reset signal R.

As is seen from the timing charts referred to above, the signal supplied from the first drive signal line DL1A for the first boost circuit 20A and the signal supplied from the first drive signal line DL1B for the second boost circuit 20C are signals of which phases are reverse to each other. Therefore, the first drive signal line DL1A for the first boost circuit 20A, the first drive signal line DL1B for the second boost circuit 20C become the high level at timings different from each other. Therefore, the signal supplied from the first drive signal line DL1B for the second boost circuit 20C can be used as the reset signal R for the first boost circuit 20A, and the signal supplied from the first drive signal line DL1A for the first boost circuit 20A can be used as the reset signal R for the second boost circuit 20C. Note that as in the DEMUX circuit 510 in Comparison Example 1, the second drive signal line DL2 for supplying the reset signal R may be provided.

As illustrated in FIG. 38, a potential of a node NB3 boosted by the second boost circuit 20C is input to the set unit 21S in the first boost circuit 20A, and a potential of the node NA1 boosted by the first boost circuit 20A is input to the set unit 21S in the second boost circuit 20C.

Figure 39:
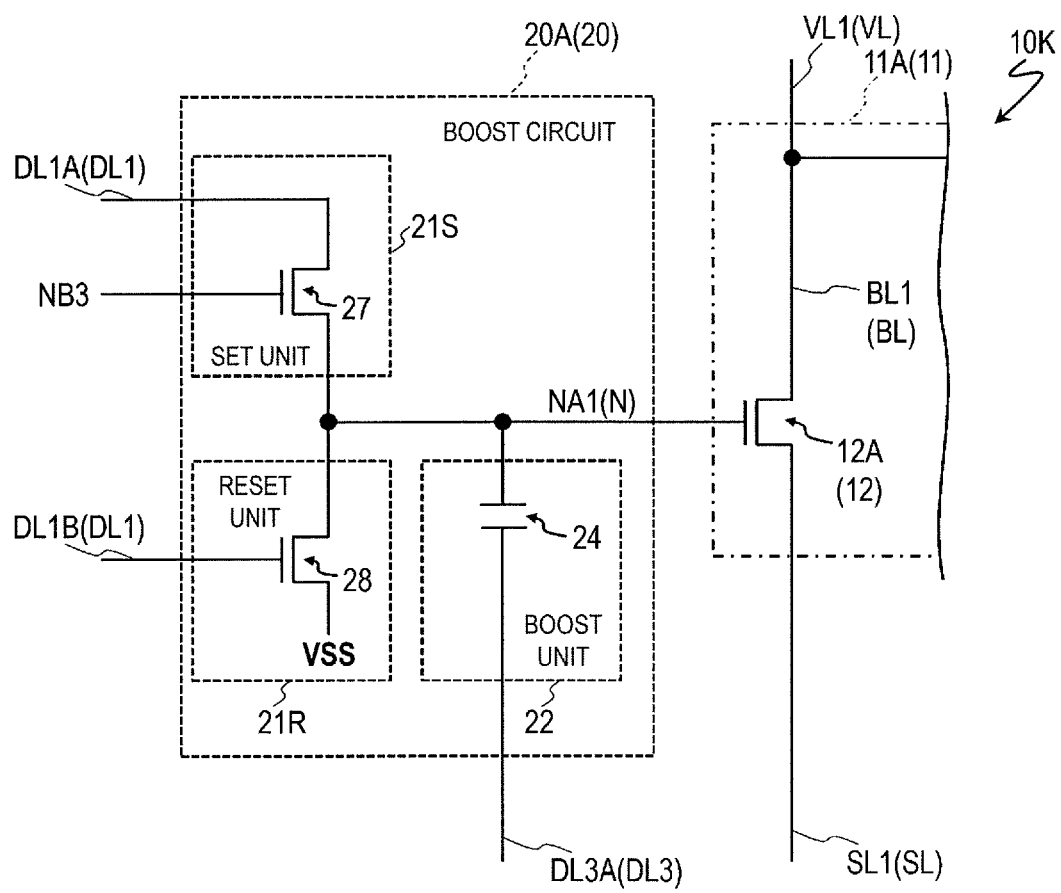
FIG. 39 is a diagram illustrating an example of a configuration of a boost circuit 20 included in the DEMUX circuit 10K.

With reference to FIG. 39, a more specific configuration of the boost circuit 20 is described. FIG. 39 is a diagram illustrating an example of the specific configuration of the set unit 21S, the reset unit 21R, and the boost unit 22 in the first boost circuit 20A.

As illustrated in FIG. 39, the set unit 21S includes a setting TFT 27. A drain electrode and a source electrode of setting TFT 27 are connected to the first drive signal line DL1A and the node NA1, respectively. A gate electrode of the setting TFT 27 is connected to another node (node NB3).

The reset unit 21R includes a resetting TFT 28. A source electrode of the resetting TFT 28 is given a constant potential (negative power supply potential VSS), and a drain electrode of the resetting TFT 28 is connected to the node NA1. A gate electrode of the resetting TFT 28 is connected to the first drive signal line DL1B for the second boost circuit 20C.

The boost unit 22 includes a boost capacitance element 24. The boost capacitance element 24 includes an electrode (a first capacitance electrode) connected to a third drive signal line DL3A and an electrode (a second capacitance electrode) connected to the node NA1.

In the DEMUX circuit 10K having the above described configuration in the present embodiment, when the set action is performed, the signal voltage (second signal voltage V2) supplied to the gate electrode of the setting TFT 27 is higher than the signal voltage (first signal voltage V1) supplied to the drain electrode. This can prevent the voltage drop of the precharge voltage and the voltage drop of the boost voltage caused by the threshold voltage Vth of the setting TFT 27. Therefore, also in the DEMUX circuit 10K in the present embodiment, the effective drive voltage can be further increased similar to the DEMUX circuit 10 in the first embodiment and the like.

In this way, the boost circuit in the DEMUX circuit included in the active matrix substrate according to the embodiments of the disclosure may include the set unit and the reset unit, or may include the set/reset unit (in other words, the set unit may function as the reset unit).

Display Device

The active matrix substrate (semiconductor device) according to the embodiments of the disclosure is suitably used for a display device. The description hereinabove is given using, as an example, the active matrix substrate for the liquid crystal display device performing display in a transverse electrical field mode such as an FFS mode, but may be applied to an active matrix substrate of a liquid crystal display device performing display in a vertical electric field mode in which a voltage is applied in a thickness direction of the liquid crystal layer (e.g., a TN mode or a vertical alignment mode). The active matrix substrate according to the embodiments of the disclosure is suitably used for a display device other than the liquid crystal display device (a display device with a display medium layer other than a liquid crystal layer). For example, the active matrix substrate according to the embodiments of the disclosure is used for an electrophoretic display device and an organic EL (Electroluminescence) display device or the like.

The liquid crystal display device can include an active matrix substrate, a counter substrate arranged to face the active matrix substrate, and a liquid crystal layer provided between the active matrix substrate and the counter substrate. The organic EL display device can include an active matrix substrate and an organic EL layer provided on the active matrix substrate.

INDUSTRIAL APPLICABILITY

According to the embodiments of the disclosure, the driving power for the active matrix substrate provided with the demultiplexer circuit can be reduced. The active matrix substrate of the embodiments of the disclosure, is suitably used for various display devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An active matrix substrate including a display region including a plurality of pixel regions and a peripheral region located around the display region, the active matrix substrate comprising:
    a substrate;
    a plurality of gate bus lines and a plurality of source bus lines provided on the substrate;
    a source driver arranged in the peripheral region and including a plurality of output terminals;
    a plurality of signal output lines connected respectively to the plurality of output terminals of the source driver; and
    a demultiplexer circuit including a plurality of unit circuits supported by the substrate, the demultiplexer circuit being arranged in the peripheral region,
    wherein each of the plurality of unit circuits in the demultiplexer circuit distributes a display signal from one signal output line of the plurality of signal output lines to n source bus lines (n is an integer equal to or more than 2) of the plurality of source bus lines,
    each of the plurality of unit circuits includes
    n branch wiring lines connected to the one signal output line, and
    n switching TFTs connected to the n branch wiring lines, respectively, the n switching TFTs individually performing on/off control of electrical connections between the n branch wiring lines and the n source bus lines,
    the demultiplexer circuit further including a plurality of boost circuits capable of boosting voltages applied to gate electrodes of the n switching TFTs,
    each of the plurality of boost circuit includes
    a set unit configured to perform a set action to precharge a node connected to the gate electrode,
    a boost unit configured to perform a boost action to boost a potential of the node precharged by the set unit, and
    a reset unit configured to perform a reset action to reset the potential of the node, the demultiplexer circuit includes a drive signal line connected to the set unit, the set unit includes a setting TFT including a gate electrode, a source electrode, and a drain electrode, the drain electrode being connected to the drive signal line and the source electrode being connected to the node, when the set unit performs the set action, the drain electrode of the setting TFT is configured to be supplied with a first signal voltage V1 from the drive signal line, and the gate electrode of the setting TFT is configured to be supplied with a second signal voltage V2 higher than the first signal voltage V1, and during the set action, the setting TFT is in an on state.

2. The active matrix substrate according to claim 1, wherein assuming that a threshold voltage for the setting TFT is Vth, the first signal voltage V1 and the second signal voltage V2 satisfy a relationship V2−Vth>V1.

3. The active matrix substrate according to claim 1, wherein the set unit is a set/reset unit configured to further function as the reset unit to perform the set action and the reset action at timings different from each other, and the setting TFT is a setting/resetting TFT used not only in performing the set operation but also in performing the reset action.

4. The active matrix substrate according to claim 3, wherein the set/reset unit includes only the setting/resetting TFT as a TFT, the demultiplexer circuit includes a further drive signal line connected to the boost unit, and the boost unit includes a boost capacitance element including a first capacitance electrode connected to the further drive signal line and a second capacitance electrode connected to the node.

5. The active matrix substrate according to claim 1, wherein the n switching TFTs included in each of the plurality of unit circuits are two switching TFTs, the two switching TFTs are a first switching TFT and a second switching TFT turned to an on state at timings different from each other within one horizontal scan period, and the plurality of boost circuits include a first boost circuit connected the first switching TFT and a second boost circuit connected to the second switching TFT.

6. The active matrix substrate according to claim 5, wherein the node boosted by the second boost circuit is connected to the gate electrode of the setting TFT in the first boost circuit, and the node boosted by the first boost circuit is connected to the gate electrode of the setting TFT in the second boost circuit.

7. The active matrix substrate according to claim 3, wherein the n switching TFTs included in each of the plurality of unit circuits are two switching TFTs, the two switching TFTs are a first switching TFT and a second switching TFT turned to an on state at timings different from each other within one horizontal scan period, the plurality of boost circuits include a first boost circuit connected the first switching TFT and a second boost circuit connected to the second switching TFT, the node boosted by the second boost circuit is connected to the gate electrode of the setting/resetting TFT in the first boost circuit, the node boosted by the first boost circuit is connected to the gate electrode of the setting/resetting TFT in the second boost circuit, each of the first boost circuit and the second boost circuit includes a further set/reset unit, the further set/reset unit includes a further setting/resetting TFT including a gate electrode, a source electrode, and a drain electrode, the drain electrode being connected to the drive signal line and the source electrode being connected to the node, the gate electrode of the further setting/resetting TFT in the first boost circuit is connected to the drive signal line for the second boost circuit, and the gate electrode of the further setting/resetting TFT in the second boost circuit is connected to the drive signal line for the first boost circuit.

8. The active matrix substrate according to claim 5, wherein the first boost circuit is connected to the first switching TFT in one unit circuit of the plurality of unit circuits, and the second boost circuit is connected to the second switching TFT in the one unit circuit.

9. The active matrix substrate according to claim 5, wherein the first boost circuit is connected in common to the first switching TFTs in two unit circuits of the plurality of unit circuits, and the second boost circuit is connected in common to the second switching TFTs in the two unit circuits.

10. The active matrix substrate according to claim 5, wherein the first boost circuit is connected in common to the first switching TFT in each of three or more unit circuits of the plurality of unit circuits, and the second boost circuit is connected in common to the second switching TFT in each of the three or more unit circuits.

11. The active matrix substrate according to claim 1, wherein the n switching TFTs included in each of the plurality of unit circuits are three switching TFTs, the three switching TFTs are a first switching TFT, a second switching TFT, and a third switching TFT turned to an on state at timings different from each other within one horizontal scan period, and the plurality of boost circuits include a first boost circuit connected the first switching TFT, a second boost circuit connected to the second switching TFT, and a third boost circuit connected to the third switching TFT.

12. The active matrix substrate according to claim 11, wherein the first boost circuit is connected the first switching TFT in one unit circuit of the plurality of unit circuits, the second boost circuit is connected to the second switching TFT in the one unit circuit, and the third boost circuit is connected to the third switching TFT in the one unit circuit.

13. The active matrix substrate according to claim 11, wherein the first boost circuit is connected in common to the first switching TFT in each of two unit circuits of the plurality of unit circuits, the second boost circuit is connected in common to the second switching TFT in each of the two unit circuits, and the third boost circuit is connected in common to the third switching TFT in each of the two unit circuits.

14. The active matrix substrate according to claim 11, wherein the first boost circuit is connected in common to the first switching TFT in each of three or more circuits of the plurality of unit circuits, the second boost circuit is connected in common to the second switching TFT in each of the three or more unit circuits, and the third boost circuit is connected in common to the third switching TFT in each of the three or more unit circuits.

15. The active matrix substrate according to claim 1, wherein the demultiplexer circuit further includes a plurality of clear circuits, each clear circuit being connected to each of the plurality of boost circuits and initializing a corresponding boost circuit at a prescribed timing.

16. The active matrix substrate according to claim 1, wherein each of the set unit and the reset unit includes a plurality of TFTs connected in series with each other.

17. The active matrix substrate according to claim 1, wherein the plurality of boost circuits include two or more boost circuits driven at the same timing, and the demultiplexer circuit includes a first drive signal line group and a second drive signal line group, the first drive signal line group supplying a drive signal group to drive some boost circuits of the two or more boost circuits, the second drive signal line group supplying a drive signal group to drive other some boost circuits, the second drive signal line group being different from the first drive signal line group.

18. The active matrix substrate according to claim 1, wherein each of the n switching TFTs includes an oxide semiconductor layer as an active layer.

19. The active matrix substrate according to claim 18, wherein the oxide semiconductor layer includes an In—Ga—Zn—O-based semiconductor.

20. The active matrix substrate according to claim 19, wherein the In—Ga—Zn—O-based semiconductor includes a crystalline portion.

21. The active matrix substrate according to claim 1, wherein each of the n switching TFTs is a PMOS transistor including a polycrystalline silicon semiconductor layer as an active layer.

22. A display device comprising the active matrix substrate according to claim 1.

* * * * *